US012660454B2

(12) United States Patent
Han et al.

(10) Patent No.: US 12,660,454 B2
(45) Date of Patent: Jun. 16, 2026

(54) DISPLAY SUBSTRATE AND DISPLAY DEVICE

(71) Applicant: BOE Technology Group Co., Ltd., Beijing (CN)

(72) Inventors: Ying Han, Beijing (CN); Pan Xu, Beijing (CN); Xing Zhang, Beijing (CN); Guoying Wang, Beijing (CN); Chengyuan Luo, Beijing (CN); Mingi Chu, Beijing (CN); Dacheng Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 457 days.

(21) Appl. No.: 18/259,460

(22) PCT Filed: Sep. 6, 2022

(86) PCT No.: PCT/CN2022/117337
§ 371 (c)(1),
(2) Date: Jun. 27, 2023

(87) PCT Pub. No.: WO2024/000808
PCT Pub. Date: Jan. 4, 2024

(65) Prior Publication Data
US 2024/0023399 A1    Jan. 18, 2024

Related U.S. Application Data

(63) Continuation-in-part of application No. PCT/CN2022/102202, filed on Jun. 29, 2022.

(51) Int. Cl.
H10K 59/131 (2023.01)
H10K 59/121 (2023.01)
(Continued)

(52) U.S. Cl.
CPC ..... H10K 59/1315 (2023.02); H10K 59/1213 (2023.02); H10K 59/122 (2023.02);
(Continued)

(58) Field of Classification Search
CPC ........... H10K 59/1315; H10K 59/1213; H10K 59/122; H10K 59/351; H10K 59/352; H10K 59/8792; H10K 59/1216; H10K 59/131
See application file for complete search history.

(56) References Cited

U.S. PATENT DOCUMENTS 8,941,573 B2    1/2015  Lo
9,252,193 B2    2/2016  Kim et al.
(Continued)

FOREIGN PATENT DOCUMENTS

CN         1604698 A      4/2005
CN       101216644 A      7/2008
(Continued)

OTHER PUBLICATIONS

U.S. Appl. No. 18/041,698, filed Feb. 15, 2023, entitled "Display Substrate and Display Device", 66 pages.
(Continued)

*Primary Examiner* — Kevin Quarterman
(74) *Attorney, Agent, or Firm* — Westman, Champlin & Koehler, P.A.

(57) ABSTRACT

A display substrate, including a base substrate, a plurality of pixel units, and a pixel definition layer. The pixel unit includes a first sub-pixel, a second sub-pixel, a third sub-pixel, and a fourth sub-pixel. The fourth sub-pixel is a white sub-pixel, and any two of the first sub-pixel, the second sub-pixel, the third sub-pixel and the fourth sub-pixel display different colors. In at least one pixel unit, at least one of the first sub-pixel, the second sub-pixel and the third
(Continued)

10

20 sub-pixel is located in a different row from the fourth sub-pixel. In at least one pixel unit, each of orthographic projections of a first opening of the first sub-pixel, a second opening of the second sub-pixel and a third opening of the third sub-pixel on the base substrate has an area less than that of a fourth opening of the fourth sub-pixel on the base substrate.

20 Claims, 24 Drawing Sheets

(51) Int. Cl.
    *H10K 59/122*     (2023.01)
    *H10K 59/35*     (2023.01)
    *H10K 59/80*     (2023.01)

(52) U.S. Cl.
    CPC ......... *H10K 59/351* (2023.02); *H10K 59/352* (2023.02); *H10K 59/8792* (2023.02)

(56) References Cited

U.S. PATENT DOCUMENTS

| | | | |
|---|---|---|---|
| 9,589,493 B2 | 3/2017 | Gai et al. | |
| 9,753,344 B2 | 9/2017 | Lo | |
| 9,940,870 B2 | 4/2018 | Yano et al. | |
| 10,102,788 B2 | 10/2018 | Yoon et al. | |
| 10,198,981 B2* | 2/2019 | Wang | G09G 3/2074 |
| 10,236,335 B2 | 3/2019 | Oh et al. | |
| 10,373,551 B2 | 8/2019 | Yano et al. | |
| 10,418,422 B2 | 9/2019 | Gu et al. | |
| 11,056,050 B2 | 7/2021 | Yano et al. | |
| 11,624,961 B2 | 4/2023 | He | |
| 2013/0335457 A1 | 12/2013 | Yano et al. | |
| 2014/0001447 A1 | 1/2014 | Kim et al. | |
| 2014/0028536 A1 | 1/2014 | Lo | |
| 2014/0313112 A1 | 10/2014 | Madhusudan | |
| 2015/0098040 A1 | 4/2015 | Lo | |
| 2015/0241748 A1 | 8/2015 | Lee et al. | |
| 2016/0012761 A1 | 1/2016 | Gai et al. | |
| 2016/0189591 A1 | 6/2016 | Yoon et al. | |
| 2017/0236882 A1 | 8/2017 | Matsunaga et al. | |
| 2018/0151661 A1 | 5/2018 | Oh et al. | |
| 2018/0182825 A1 | 6/2018 | Gu et al. | |
| 2018/0197459 A1 | 7/2018 | Yano et al. | |
| 2019/0035874 A1 | 1/2019 | Han | |
| 2019/0181207 A1 | 6/2019 | Kim | |
| 2019/0325817 A1 | 10/2019 | Yano et al. | |
| 2019/0355802 A1 | 11/2019 | Shim | |
| 2020/0111858 A1 | 4/2020 | Lee | |
| 2020/0310206 A1 | 10/2020 | He | |
| 2021/0167162 A1 | 6/2021 | Wu et al. | |
| 2021/0280657 A1 | 9/2021 | Huang | |
| 2022/0085133 A1 | 3/2022 | Yuan et al. | |
| 2022/0165837 A1 | 5/2022 | Park | |
| 2022/0285474 A1 | 9/2022 | Kim et al. | |
| 2023/0006023 A1 | 1/2023 | Yuan et al. | |
| 2023/0142473 A1 | 5/2023 | Zhu et al. | |
| 2023/0165053 A1 | 5/2023 | Park | |
| 2024/0008313 A1* | 1/2024 | Xu | H10K 59/351 |

FOREIGN PATENT DOCUMENTS

| | | |
|---|---|---|
| CN | 101241280 A | 8/2008 |
| CN | 202512325 U | 10/2012 |
| CN | 102809857 A | 12/2012 |
| CN | 103515540 A | 1/2014 |
| CN | 103779388 A | 5/2014 |
| CN | 106205448 A | 12/2016 |
| CN | 106206663 A | 12/2016 |
| CN | 107589604 A | 1/2018 |
| CN | 107656386 A | 2/2018 |
| CN | 108122952 A | 6/2018 |
| CN | 108322683 A | 7/2018 |
| CN | 109143708 A | 1/2019 |
| CN | 110047904 A | 7/2019 |
| CN | 110376812 A | 10/2019 |
| CN | 111524945 A | 8/2020 |
| CN | 111613654 A | 9/2020 |
| CN | 11233714 A | 2/2021 |
| CN | 112750860 A | 5/2021 |
| CN | 113053985 A | 6/2021 |
| CN | 113129799 A | 7/2021 |
| CN | 113196493 A | 7/2021 |
| CN | 113257883 A | 8/2021 |
| CN | 114335029 A | 4/2022 |
| CN | 114387905 A | 4/2022 |
| CN | 115020452 A | 9/2022 |
| JP | 5275825 B2 | 8/2013 |
| JP | 2017058671 A | 3/2017 |
| KR | 20190048356 A | 5/2019 |

OTHER PUBLICATIONS

Office Action for U.S. Appl. No. 18/041,698, sent Oct. 29, 2025, 31 pages.
Final Office Action for U.S. Appl. No. 18/041,698, sent Mar. 19, 2026, 25 pages.
Chinese Office Action for Chinese patent application No. CN 202280001985.2, dated Apr. 15, 2026, 29 pages.

* cited by examiner

10

20

10+20

30

10+20+30

32

40

10+20+30
+32+40

42

VH20

Y

X

ANL

701

SP4          SP3          SP4          SP3

SP1          SP2          SP1          SP2

Y

X

1

DISPLAY SUBSTRATE AND DISPLAY DEVICE

CROSS REFERENCE TO RELATED APPLICATIONS

This application is a Section 371 National Stage Application of International Application No. PCT/CN2022/117337, filed on Sep. 6, 2022, entitled "DISPLAY SUBSTRATE AND DISPLAY DEVICE", which claims priority to Patent Application No. PCT/CN2022/102202, filed on Jun. 29, 2022, the whole disclosures of which are incorporated herein by reference in their entireties.

TECHNICAL FIELD

The present disclosure relates to the field of display technology, and in particular to a display substrate and a display device.

BACKGROUND

OLED (Organic Light-Emitting Diode) is a kind of current-type organic light emitting device, which emits light through a carrier injection and a carrier recombination. A light emitting intensity of the OLED is proportional to an injected current. Under an action of an electric field, holes generated by an anode of the OLED and electrons generated by a cathode of the OLED may move to be respectively injected to a hole transport layer and an electron transport layer, and migrate to a light emitting layer. When the two meet in the light emitting layer, energy excitons may be generated, which excite light emitting molecules to finally produce visible light. An OLED display device is a type of display device that displays information such as an image by using luminous OLEDs. The OLED display device has characteristics such as low power consumption, high brightness and high response speed.

In the field of OLED display, with the rapid development of high resolution products, how to improve an anti-aliasing display effect of a product has become a technical problem that needs to be solved.

The above information disclosed in the section is merely for an understanding of the background of the technical concept of the present disclosure. Therefore, the above information may contain information that does not constitute the related art.

SUMMARY

In order to solve at least one aspect of the above problems, the embodiments of the present disclosure provide a display substrate and a display device.

According to a first aspect of the present disclosure, a display substrate is provided, including: a base substrate; a plurality of pixel units on the base substrate, the plurality of pixel units are arranged in an array in a first direction and a second direction to form a plurality of rows of pixel units and a plurality of columns of pixel units, the pixel unit includes a plurality of sub-pixels, the sub-pixel includes a light emitting element and a pixel driving circuit configured to drive the light emitting element, and the plurality of sub-pixels include a first sub-pixel, a second sub-pixel, a third sub-pixel and a fourth sub-pixel; and a pixel definition layer on the base substrate, the pixel definition layer includes a plurality of first openings, a plurality of second openings, a plurality of third openings, and a plurality of fourth openings, the fourth sub-pixel is a white sub-pixel, and any two of the first sub-pixel, the second sub-pixel, the third sub-pixel and the fourth sub-pixel display different colors; in at least one pixel unit, at least one of the first sub-pixel, the second sub-pixel and the third sub-pixel is located in a different row from the fourth sub-pixel; and the first sub-pixel includes the first opening, the second sub-pixel includes the second opening, the third sub-pixel includes the third opening, the fourth sub-pixel includes the fourth opening, and in at least one pixel unit, an area of each of an orthographic projection of the first opening of the first sub-pixel on the base substrate, an orthographic projection of the second opening of the second sub-pixel on the base substrate and an orthographic projection of the third opening of the third sub-pixel on the base substrate is less than an area of an orthographic projection of the fourth opening of the fourth sub-pixel on the base substrate.

According to the embodiments of the present disclosure, for at least two pixel units in a same row, a first line connecting centers of the first openings of the first sub-pixels of the at least two pixel units is parallel to the first direction, and/or a second line connecting centers of the second openings of the second sub-pixels of the at least two pixel units is parallel to the first direction; and/or a third line connecting centers of the third openings of the third sub-pixels of the at least two pixel units is parallel to the first direction; for at least two pixel units in a same row, a fourth line connecting centers of the fourth openings of the fourth sub-pixels of the at least two pixel units is parallel to the first direction; and at least one of the first line, the second line and the third line is spaced apart from the fourth line in the second direction.

According to the embodiments of the present disclosure, each of the first line, the second line and the third line is spaced apart from the fourth line in the second direction.

According to the embodiments of the present disclosure, the first line is spaced apart from the fourth line by a first distance in the second direction, the second line is spaced apart from the fourth line by a second distance in the second direction, and the third line is spaced apart from the fourth line by a third distance in the second direction; and a ratio of any two of the first distance, the second distance and the third distance ranges from 0.8 to 1.2.

According to the embodiments of the present disclosure, for at least one row of pixel units, the first sub-pixels, the second sub-pixels and the third sub-pixels are located in a same row to form a first row of sub-pixels; a plurality of fourth sub-pixels are located in a same row to form a second row of sub-pixels; and the first row of sub-pixels and the second row of sub-pixels are adjacent in the second direction.

According to the embodiments of the present disclosure, the orthographic projection of the first opening on the base substrate has a first width in the first direction and a first height in the second direction, and a ratio of a larger one of the first height and the first width to a smaller one of the first height and the first width is greater than 1.5; and/or the orthographic projection of the second opening on the base substrate has a second width in the first direction and a second height in the second direction, and a ratio of a larger one of the second height and the second width to a smaller one of the second height and the second width is greater than 1.5; and/or the orthographic projection of the third opening on the base substrate has a third width in the first direction and a third height in the second direction, and a ratio of a larger one of the third height and the third width to a smaller one of the third height and the third width is greater than 1.5;

and/or the orthographic projection of the fourth opening on the base substrate has a fourth width in the first direction and a fourth height in the second direction, and a ratio of a larger one of the fourth height and the fourth width to a smaller one of the fourth height and the fourth width is greater than 1.5.

According to the embodiments of the present disclosure, the fourth width of the fourth opening is greater than the fourth height of the fourth opening; and the first width of the first opening is less than the first height of the first opening, the second width of the second opening is less than the second height of the second opening, and the third width of the third opening is less than the third height of the third opening.

According to the embodiments of the present disclosure, for one and same pixel unit, each of the orthographic projection of the first opening on the base substrate, the orthographic projection of the second opening on the base substrate and the orthographic projection of the third opening on the base substrate overlaps at least partially with the orthographic projection of the fourth opening on the base substrate in the second direction.

According to the embodiments of the present disclosure, the first line and the fourth line are spaced by a first distance in the second direction, the second line and the fourth line are spaced by a second distance in the second direction, and the third line and the fourth line are spaced by a third distance in the second direction; and a ratio of one of the second distance and the third distance to the first distance ranges from 0.8 to 1.2, and a ratio of the other of the second distance and the third distance to the first distance is greater than 2.

According to the embodiments of the present disclosure, for at least one row of pixel units, the fourth sub-pixel and one of the first sub-pixel, the second sub-pixel and the third sub-pixel are located in a same row to form a first row of sub-pixels; the other two of the first sub-pixel, the second sub-pixel and the third sub-pixel are located in a same row to form a second row of sub-pixels; and the first row of sub-pixels and the second row of sub-pixels are adjacent in the second direction.

According to the embodiments of the present disclosure, the orthographic projection of the first opening on the base substrate has a first width in the first direction and a first height in the second direction, and a ratio of a larger one of the first height and the first width to a smaller one of the first height and the first width is greater than 1 and less than 1.5; and/or the orthographic projection of the second opening on the base substrate has a second width in the first direction and a second height in the second direction, and a ratio of a larger one of the second height and the second width to a smaller one of the second height and the second width is greater than 1 and less than 1.5; and/or the orthographic projection of the third opening on the base substrate has a third width in the first direction and a third height in the second direction, and a ratio of a larger one of the third height and the third width to a smaller one of the third height and the third width is greater than 1 and less than 1.5; and/or the orthographic projection of the fourth opening on the base substrate has a fourth width in the first direction and a fourth height in the second direction, and a ratio of a larger one of the fourth height and the fourth width to a smaller one of the fourth height and the fourth width is greater than 1 and less than 1.5.

According to the embodiments of the present disclosure, for at least one row of pixel units, the fourth sub-pixel and one of the first sub-pixel, the second sub-pixel and the third sub-pixel are located in a same column to form a first column of sub-pixels; the other two of the first sub-pixel, the second sub-pixel and the third sub-pixel are located in a same column to form a second column of sub-pixels; and the first column of sub-pixels and the second column of sub-pixels are arranged alternately in the first direction.

According to the embodiments of the present disclosure, the display substrate includes: a first conductive film layer on the base substrate; a semiconductor film layer on a side of the first conductive film layer away from the base substrate; a second conductive film layer on a side of the semiconductor film layer away from the base substrate; a third conductive film layer on a side of the second conductive film layer away from the base substrate; and a first electrode layer on a side of the third conductive film layer away from the base substrate, the display substrate includes a plurality of anodes in the first electrode layer; and a row of pixel units include a plurality of pixel unit groups, each pixel unit group includes a first pixel unit and a second pixel unit adjacent in the first direction, and for at least one pixel unit group, the pixel driving circuits of the plurality of sub-pixels are arranged side by side in the first direction, and the anodes of the light emitting elements of the plurality of sub-pixels are arranged in two rows in the second direction.

According to the embodiments of the present disclosure, for one and same sub-pixel, a relationship between an orthographic projection of the pixel driving circuit of the sub-pixel on the base substrate and an orthographic projection of the anode of the light emitting element of the sub-pixel on the base substrate includes: the orthographic projection of the pixel driving circuit of the sub-pixel on the base substrate exceeds the orthographic projection of the anode of the light emitting element of the sub-pixel on the base substrate in the second direction; and/or the orthographic projection of the anode of the light emitting element of the sub-pixel on the base substrate exceeds the orthographic projection of the pixel driving circuit of the sub-pixel on the base substrate in the first direction.

According to the embodiments of the present disclosure, the pixel driving circuit includes a first transistor, a second transistor and a third transistor, the first transistor includes a first channel region in the semiconductor film layer, the second transistor includes a second channel region in the semiconductor film layer, and the third transistor includes a third channel region in the semiconductor film layer; and each of an orthographic projection of the first channel region on the base substrate, an orthographic projection of the second channel region on the base substrate and an orthographic projection of the third channel region on the base substrate falls within an orthographic projection of the plurality of anodes on the base substrate.

According to the embodiments of the present disclosure, for one and same pixel unit, each of an orthographic projection of the first channel region of the first transistor of the pixel driving circuit of the first sub-pixel on the base substrate, an orthographic projection of the first channel region of the first transistor of the pixel driving circuit of the second sub-pixel on the base substrate, an orthographic projection of the first channel region of the first transistor of the pixel driving circuit of the third sub-pixel on the base substrate, and an orthographic projection of the first channel region of the first transistor of the pixel driving circuit of the fourth sub-pixel on the base substrate falls within an orthographic projection of the anode of the fourth sub-pixel on the base substrate.

According to the embodiments of the present disclosure, for one and same pixel unit, each of an orthographic projection of the third channel region of the third transistor of the pixel driving circuit of the first sub-pixel on the base substrate, an orthographic projection of the third channel region of the third transistor of the pixel driving circuit of the second sub-pixel on the base substrate, an orthographic projection of the third channel region of the third transistor of the pixel driving circuit of the third sub-pixel on the base substrate, and an orthographic projection of the third channel region of the third transistor of the pixel driving circuit of the fourth sub-pixel on the base substrate falls within an orthographic projection of the anode of the fourth sub-pixel on the base substrate.

According to the embodiments of the present disclosure, for one and same pixel unit, an orthographic projection of the first channel region of the first transistor of the pixel driving circuit of the first sub-pixel on the base substrate falls within an orthographic projection of the anode of the fourth sub-pixel on the base substrate; an orthographic projection of the second channel region of the second transistor of the pixel driving circuit of the first sub-pixel on the base substrate falls within an orthographic projection of the anode of the first sub-pixel on the base substrate; and an orthographic projection of the third channel region of the third transistor of the pixel driving circuit of the first sub-pixel on the base substrate falls within the orthographic projection of the anode of the fourth sub-pixel on the base substrate; and/or for one and same pixel unit, an orthographic projection of the first channel region of the first transistor of the pixel driving circuit of the second sub-pixel on the base substrate falls within the orthographic projection of the anode of the fourth sub-pixel on the base substrate; an orthographic projection of the second channel region of the second transistor of the pixel driving circuit of the second sub-pixel on the base substrate falls within an orthographic projection of the anode of the second sub-pixel on the base substrate; and an orthographic projection of the third channel region of the third transistor of the pixel driving circuit of the second sub-pixel on the base substrate falls within the orthographic projection of the anode of the fourth sub-pixel on the base substrate; and/or for one and same pixel unit, an orthographic projection of the first channel region of the first transistor of the pixel driving circuit of the third sub-pixel on the base substrate falls within the orthographic projection of the anode of the fourth sub-pixel on the base substrate; an orthographic projection of the second channel region of the second transistor of the pixel driving circuit of the third sub-pixel on the base substrate falls within an orthographic projection of the anode of the third sub-pixel on the base substrate; and an orthographic projection of the third channel region of the third transistor of the pixel driving circuit of the third sub-pixel on the base substrate falls within the orthographic projection of the anode of the fourth sub-pixel on the base substrate; and/or for one and same pixel unit, an orthographic projection of the first channel region of the first transistor of the pixel driving circuit of the fourth sub-pixel on the base substrate falls within the orthographic projection of the anode of the fourth sub-pixel on the base substrate; an orthographic projection of the second channel region of the second transistor of the pixel driving circuit of the fourth sub-pixel on the base substrate falls within the orthographic projection of the anode of the second sub-pixel on the base substrate; and an orthographic projection of the third channel region of the third transistor of the pixel driving circuit of the fourth sub-pixel on the base substrate falls within the orthographic projection of the anode of the fourth sub-pixel on the base substrate.

According to the embodiments of the present disclosure, for one and same pixel unit, an orthographic projection of the first channel region of the first transistor of the pixel driving circuit of the first sub-pixel on the base substrate falls within an orthographic projection of the anode of the first sub-pixel on the base substrate; an orthographic projection of the second channel region of the second transistor of the pixel driving circuit of the first sub-pixel on the base substrate falls within an orthographic projection of the anode of the fourth sub-pixel on the base substrate; and an orthographic projection of the third channel region of the third transistor of the pixel driving circuit of the first sub-pixel on the base substrate falls within the orthographic projection of the anode of the first sub-pixel on the base substrate; and/or for one and same pixel unit, an orthographic projection of the first channel region of the first transistor of the pixel driving circuit of the second sub-pixel on the base substrate falls within an orthographic projection of the anode of the second sub-pixel on the base substrate; an orthographic projection of the second channel region of the second transistor of the pixel driving circuit of the second sub-pixel on the base substrate falls within an orthographic projection of the anode of the third sub-pixel on the base substrate; and an orthographic projection of the third channel region of the third transistor of the pixel driving circuit of the second sub-pixel on the base substrate falls within the orthographic projection of the anode of the second sub-pixel on the base substrate; and/or for one and same pixel unit, an orthographic projection of the first channel region of the first transistor of the pixel driving circuit of the third sub-pixel on the base substrate falls within the orthographic projection of the anode of the second sub-pixel on the base substrate; an orthographic projection of the second channel region of the second transistor of the pixel driving circuit of the third sub-pixel on the base substrate falls within the orthographic projection of the anode of the third sub-pixel on the base substrate; and an orthographic projection of the third channel region of the third transistor of the pixel driving circuit of the third sub-pixel on the base substrate falls within the orthographic projection of the anode of the second sub-pixel on the base substrate; and/or for one and same pixel unit, an orthographic projection of the first channel region of the first transistor of the pixel driving circuit of the fourth sub-pixel on the base substrate falls within the orthographic projection of the anode of the first sub-pixel on the base substrate; an orthographic projection of the second channel region of the second transistor of the pixel driving circuit of the fourth sub-pixel on the base substrate falls within the orthographic projection of the anode of the fourth sub-pixel on the base substrate; and an orthographic projection of the third channel region of the third transistor of the pixel driving circuit of the fourth sub-pixel on the base substrate falls within the orthographic projection of the anode of the first sub-pixel on the base substrate.

According to the embodiments of the present disclosure, the display substrate further includes a black matrix on a side of the pixel definition layer away from the base substrate; and in a region between at least two adjacent openings, a width of the pixel definition layer in the first direction is greater than a width of the black matrix in the first direction, and/or a height of the pixel definition layer in the second direction is greater than a height of the black matrix in the second direction.

According to the embodiments of the present disclosure, an anode of at least one sub-pixel is electrically connected to the pixel driving circuit of the sub-pixel through a respective anode connection hole; for at least one pixel unit group, a first connecting line of centers of the anode connection holes of the first sub-pixels is parallel to the first direction, and/or a second connecting line of centers of the anode connection holes of the second sub-pixels is parallel to the first direction, and/or a third connecting line of centers of the anode connection holes of the third sub-pixels is parallel to the first direction; for at least one pixel unit group, a fourth connecting line of centers of the anode connection holes of the fourth sub-pixels is parallel to the first direction; and each of the first connecting line, the second connecting line and the third connecting line is spaced apart from the fourth connecting line in the second direction.

According to the embodiments of the present disclosure, any two of the first connecting line, the second connecting line and the third connecting line substantially coincide with each other.

According to the embodiments of the present disclosure, the first connecting line and the third connecting line substantially coincide with each other; and the fourth connecting line and the second connecting line are located on two sides of the first connecting line in the second direction.

In a second aspect of the present disclosure, a display device is provided, including the display substrate as described above.

BRIEF DESCRIPTION OF THE DRAWINGS

With the following description of the present disclosure with reference to the accompanying drawings, other objectives and advantages of the present disclosure may be obvious and the present disclosure may be understood comprehensively.

Figure 1A:
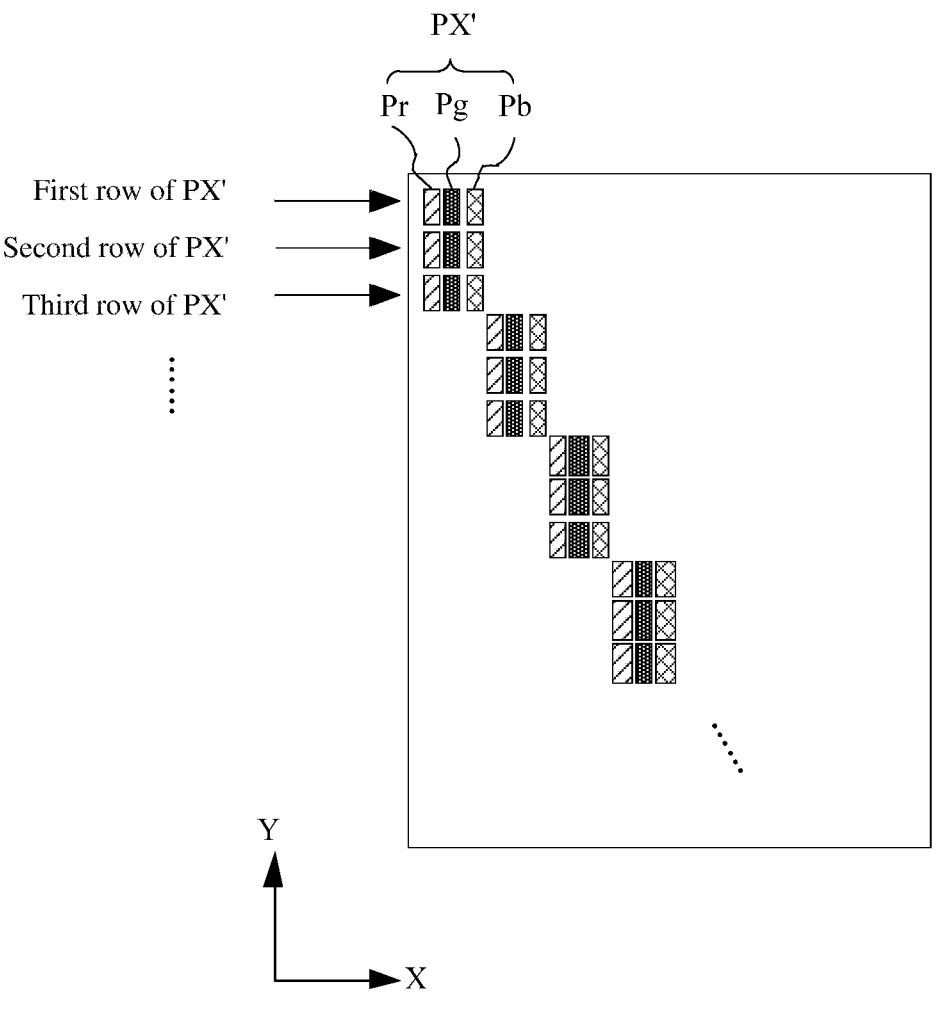
FIG. 1A is a schematic diagram of displaying an oblique line according to an example.

It should be noted that for sake of clarity, in the accompanying drawings used to describe the embodiments of the present disclosure, sizes of layers, structures or regions may be enlarged or reduced, that is, these accompanying drawings are not drawn according to actual scale.

DETAILED DESCRIPTION OF EMBODIMENTS

Technical solutions of the present disclosure will be further described in detail below through the embodiments with reference to the accompanying drawings. In the specification, the same or similar reference numerals represent the same or similar components. The following descriptions of the embodiments of the present disclosure with reference to the accompanying drawings are intended to explain a general inventive concept of the present disclosure, and should not be understood as a limitation to the present disclosure.

In addition, in the following detailed descriptions, for ease of explanation, many specific details are set forth to provide a comprehensive understanding of the embodiments of the present disclosure. Obviously, however, one or more embodiments may also be implemented without these specific details.

It should be understood that, although the terms "first," "second" and so on may be used here to describe different elements, these elements should not be limited by these terms. These terms are merely used to distinguish one element from another element. For example, without departing from the scope of the exemplary embodiments, a first element may be named as a second element, and similarly, the second element may be named as the first element. The term "and/or" as used here includes any and all combinations of one or more related listed items.

It should be understood that when an element or layer is referred to as being "formed on" another element or layer, the element or layer may be formed directly or indirectly on the another element or layer. That is, for example, an intermediate element or an intermediate layer may be provided. In contrast, when an element or layer is referred to as being "directly formed on" another element or layer, no intermediate element or intermediate layer is provided. Other terms used to describe a relationship between elements or layers (for example, "between" and "directly between", "adjacent to" and "directly adjacent to", etc.) should be interpreted in a similar manner.

Herein, the directional expressions "first direction" and "second direction" are used to describe different directions along a pixel region, e.g., a longitudinal direction and a transverse direction of the pixel region. It should be understood that such expressions are merely exemplary descriptions and do not limit the present disclosure.

Herein, unless otherwise specified, the expression "located in the same layer" generally means that a first component and a second component may be made of the same material and may be formed by the same patterning process. The expression "A and B are connected as a whole" means that component A and component B are integrally formed, that is, they generally contain the same material and are formed as a structurally continuous integral component.

Transistors used in the embodiments of the present disclosure may be thin film transistors or field effect transistors, or other devices with the same characteristics. Since a source electrode and a drain electrode of the thin film transistor used here are symmetrical, the source electrode and the drain electrode may be interchanged. In the following examples, a P-type thin film transistor used as a driving transistor is mainly described, and the types of other transistors may be the same as or different from the driving transistor according to a circuit design. Similarly, in other embodiments, the driving transistor may also be shown as an N-type thin film transistor.

At present, display products are often used in conjunction with the Windows operating system. In an example, for a liquid crystal display (LCD), a problem of display aliasing may be alleviated using an anti-aliasing rendering smoothing algorithm (Clear Type) through the Windows operating system.

For example, FIG. 1A is a schematic diagram of displaying an oblique line according to an example, in which pixel units PX' that emit light when displaying the oblique line using a traditional display manner are schematically shown, that is, pixel units PX' in a dark state are not shown in FIG. 1A. Referring to FIG. 1A, a liquid crystal display includes a plurality of pixel units PX' arranged in an array in a first direction X' and a second direction Y'. Each pixel unit PX' includes a plurality of sub-pixels that display different colors. For example, the plurality of sub-pixels in each pixel unit PX' may include a red sub-pixel Pr, a green sub-pixel Pg, and a blue sub-pixel Pb.

In such example, the pixel unit PX' is taken as a control unit for display. Specifically, for each pixel unit PX', the plurality of sub-pixels therein may be located in a same row. Optionally, a plurality of sub-pixels in at least one pixel unit PX' are arranged in the first direction X in an order of red sub-pixel Pr, green sub-pixel Pg and blue sub-pixel Pb.

When displaying the oblique line, first ones of pixel units PX' from a first row to a third row emit light, second ones of pixel units PX' from a fourth row to a sixth row emit light, third ones of pixel units PX' from a seventh row to a ninth row emit light, and so on, so as to display the oblique line. However, as shown in FIG. 1A, such manner may cause an obvious aliasing.

Figure 1B:
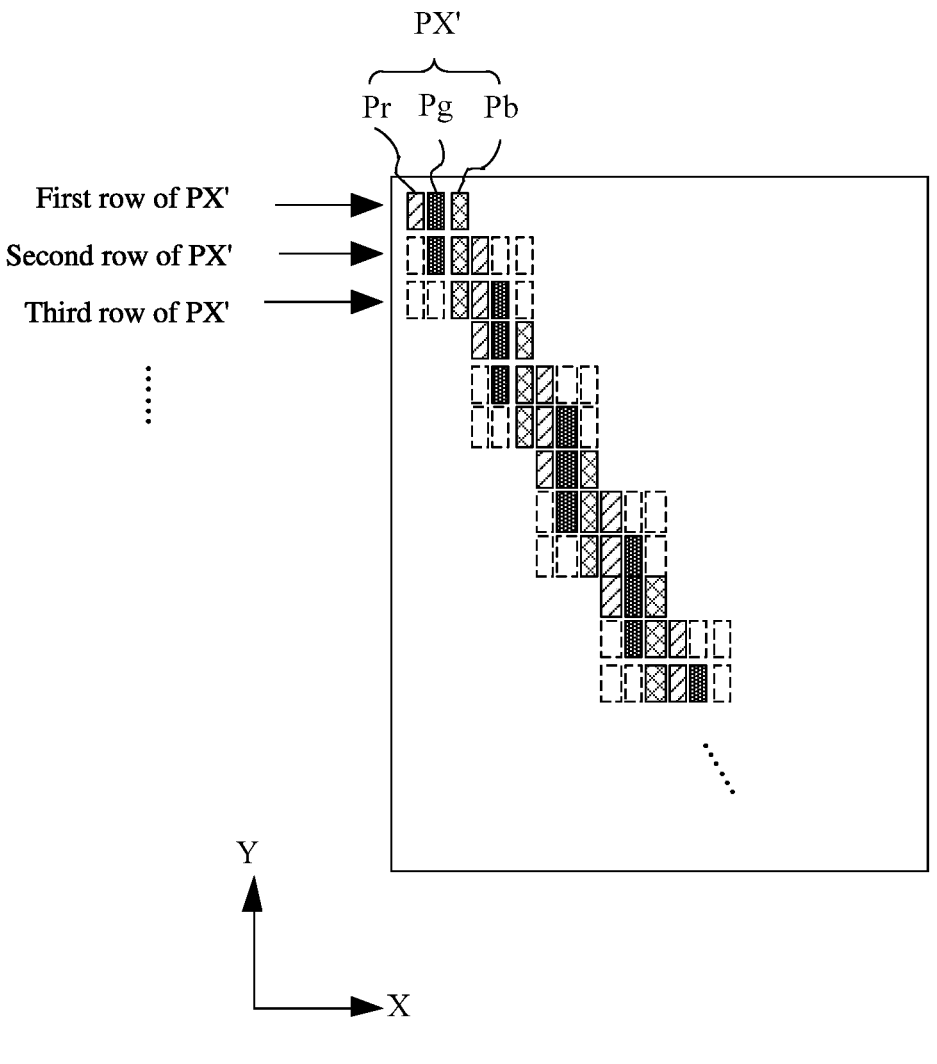
FIG. 1B is a schematic diagram of displaying an oblique line according to another example.

The anti-aliasing rendering smoothing algorithm no longer takes the pixel unit as the control unit, instead, it takes each sub-pixel as the control unit. FIG. 1B is a schematic diagram of displaying an oblique line according to another example, in which sub-pixels that emit light when displaying the oblique line using the anti-aliasing rendering smoothing algorithm are schematically shown, and other sub-pixels belonging to the same pixel unit PX' as the sub-pixels emitting light are shown in dashed lines. Referring to FIG. 1B, a sub-pixel is used independently as the control unit when using the anti-aliasing rendering smoothing algorithm. When displaying an oblique line (such as a white oblique line), for the pixel units PX' in the first row, all sub-pixels (i.e., the red sub-pixel Pr, the green sub-pixel Pg, and the blue sub-pixel Pb) in the first one of the pixel units PX' emit light. For each row of pixel units PX' in the second row and the third row, sub-pixels in two adjacent pixel units PX' need to emit light cooperatively to simulate a display effect of one pixel unit. For example, for pixel units PX' in the second row, the green sub-pixel Pg and the blue sub-pixel Pb in the first one of the pixel units PX' emit light, and the red sub-pixel Pr in the second one of the pixel units PX' emit light; for pixel units PX' in the third row, the blue sub-pixel Pb in the first one of the pixel units PX' emit light, and the red sub-pixel Pr and the green sub-pixel Pg in the second one of the pixel units PX' emit light, and so on, so as to display the oblique line.

Compared to FIG. 1A, a horizontal resolution of the oblique line shown in FIG. 1B is significantly increased (for example, by 200%), the image aliasing is effectively improved, and a finer display effect is achieved.

In another example, for an organic light emitting diode (OLED) display, the display aliasing may also be alleviated using the anti-aliasing rendering smoothing algorithm.

Figure 1C:
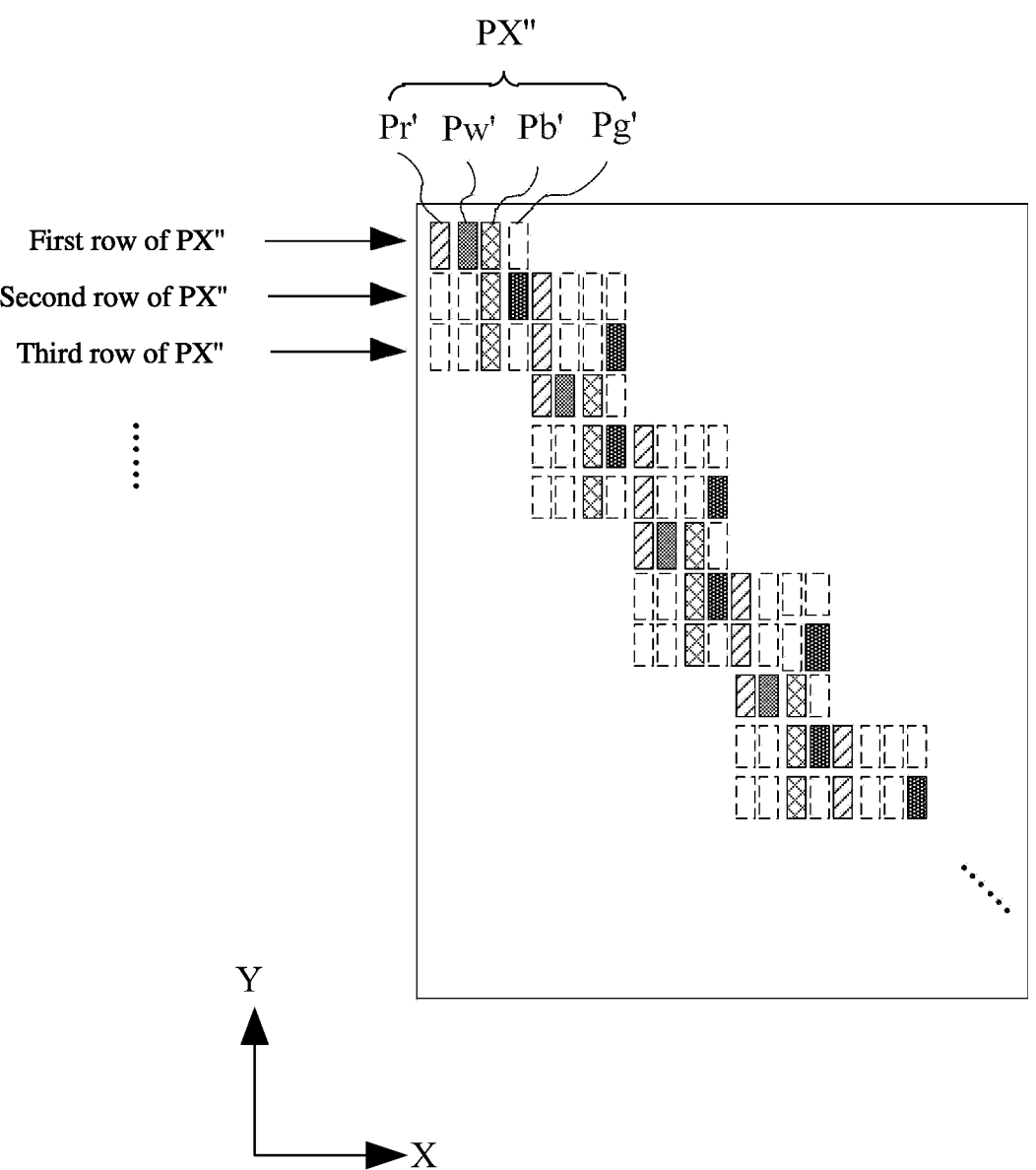
FIG. 1C is a schematic diagram of displaying an oblique line according to another example.

Different from the liquid crystal display, a pixel unit in the organic light emitting diode display may include sub-pixels of four colors in order to reduce power consumption. For example, FIG. 1C is a schematic diagram of displaying an oblique line according to another example, FIG. 1c schematically shows sub-pixels of the organic light emitting diode display that emit light when displaying an oblique line in a case of using the anti-aliasing rendering smoothing algorithm, and other sub-pixels belonging to the same pixel unit PX" as the sub-pixels emitting light are shown in dashed lines. Referring to FIG. 1C, the pixel unit PX" may include a red sub-pixel Pr', a green sub-pixel Pg', a blue sub-pixel Pb', and a white sub-pixel Pw'. A white picture may be achieved by combining the white sub-pixel Pw' with two other sub-pixels to emit light, which may significantly reduce the power consumption compared to the manner of mixing white through the red sub-pixel Pr', the green sub-pixel Pg' and the blue sub-pixel Pb'.

Referring to FIG. 1C, for each pixel unit PX", a plurality of sub-pixels therein may be located in a same row. A plurality of sub-pixels of at least one pixel unit PX" are arranged in the first direction X in an order of red sub-pixel Pr', white sub-pixel Pw', blue sub-pixel Pb' and green sub-pixel Pg'.

When displaying an oblique line (such as a white oblique line), the anti-aliasing rendering smoothing algorithm controls the sub-pixels to emit light in the following manners.

For pixel units PX" in the first row, the red sub-pixel Pr', the white sub-pixel Pw' and the blue sub-pixel Pb' in the first one of the pixel units PX" emit light. For each row of pixel units PX" in the second row and the third row, the sub-pixels in two adjacent pixel units PX" emit light cooperatively to simulate a display effect of one pixel unit PX". For example, for pixel units PX" in the second row, the blue sub-pixel Pb' and the green sub-pixel Pg' in the first one of the pixel units PX" emit light, and the red sub-pixel Pr' in the second one of the pixel units PX" emit light; for pixel units PX" in the third row, the blue sub-pixel Pb' in the first one of the pixel units PX" emit light, and the red sub-pixel Pi and the green sub-pixel Pg' in the second one of the pixel units PX" emit light, and so on, so as to display the oblique line.

However, the anti-aliasing rendering smoothing algorithm was originally designed based on sub-pixels of three colors, which has a poor adaptability to sub-pixels of four colors. As shown in FIG. 1C, in order to achieve an oblique gradient, for the pixel units PX" in the second row, the green sub-pixel Pg' in the first one of the pixel units PX" emit light, and for the pixel units PX' in the third row, the green sub-pixel Pg' in the second one of the pixel units PX" is required to emit light. Since the plurality of sub-pixels in the pixel units PX" are located in a same row, the green sub-pixel Pg' that emits light in the third row of pixel units PX" is far away from other sub-pixels emitting light in the first direction X, which may cause a significant aliasing effect and affect the display effect.

In view of this, the embodiments of the present disclosure provide a display substrate. The display substrate includes a base substrate, a plurality of pixel units arranged on the base substrate, and a pixel definition layer arranged on the base substrate. The plurality of pixel units are arranged in an array in the first direction and the second direction to form a plurality of rows of pixel units and a plurality of columns of pixel units. The pixel unit includes a plurality of sub-pixels, and the sub-pixel includes a light emitting element and a pixel driving circuit for driving the light emitting element. The plurality of sub-pixels include a first sub-pixel, a second sub-pixel, a third sub-pixel, and a fourth sub-pixel. The pixel definition layer includes a plurality of first openings, a plurality of second openings, a plurality of third openings, and a plurality of fourth openings. The fourth sub-pixel is the white sub-pixel, and any two of the first sub-pixel, the second sub-pixel, the third sub-pixel and the fourth sub-pixel display different colors. In at least one pixel unit, at least one of the first sub-pixel, the second sub-pixel and the third sub-pixel is located in a different row from the fourth sub-pixel. The first sub-pixel includes the first opening, the second sub-pixel includes the second opening, the third sub-pixel includes the third opening, and the fourth sub-pixel includes the fourth opening. In at least one pixel unit, an area of each of an orthographic projection of the first opening of the first sub-pixel on the base substrate, an orthographic projection of the second opening of the second sub-pixel on the base substrate and an orthographic projection of the third opening of the third sub-pixel on the base substrate is less than an area of an orthographic projection of the fourth opening of the fourth sub-pixel on the base substrate.

In the embodiments of the present disclosure, for at least one pixel unit, at least one of the first sub-pixel, the second sub-pixel and the third sub-pixel is located in a different row from the fourth sub-pixel. For example, at least one pixel unit includes two rows of sub-pixels, the fourth sub-pixel and the third sub-pixel are located in the first row, and the first sub-pixel and the second sub-pixel are located in the second row. Alternatively, the first sub-pixel to the third sub-pixel are located in the first row, and the fourth sub-pixel is located in the second row. Compared to the solution in which the four sub-pixels in one pixel unit are located in a same row, in the embodiments of the present disclosure, the four sub-pixels in one pixel unit may be more compact in the first direction. When displaying an oblique line using the anti-aliasing rendering smoothing algorithm, the problem that a certain sub-pixel emitting light being too far away from other sub-pixels emitting light in the first direction may be avoided, so that the aliasing may be improved.

Moreover, the area of each of the orthographic projection of the first opening of the first sub-pixel on the base substrate, the orthographic projection of the second opening of the second sub-pixel on the base substrate and the orthographic projection of the third opening of the third sub-pixel on the base substrate is less than the area of the orthographic projection of the fourth opening of the fourth sub-pixel on the base substrate, so that the white sub-pixel may have the largest opening area in the four sub-pixels, thereby a display brightness may be improved, and a display power consumption may be reduced.

Figure 2:
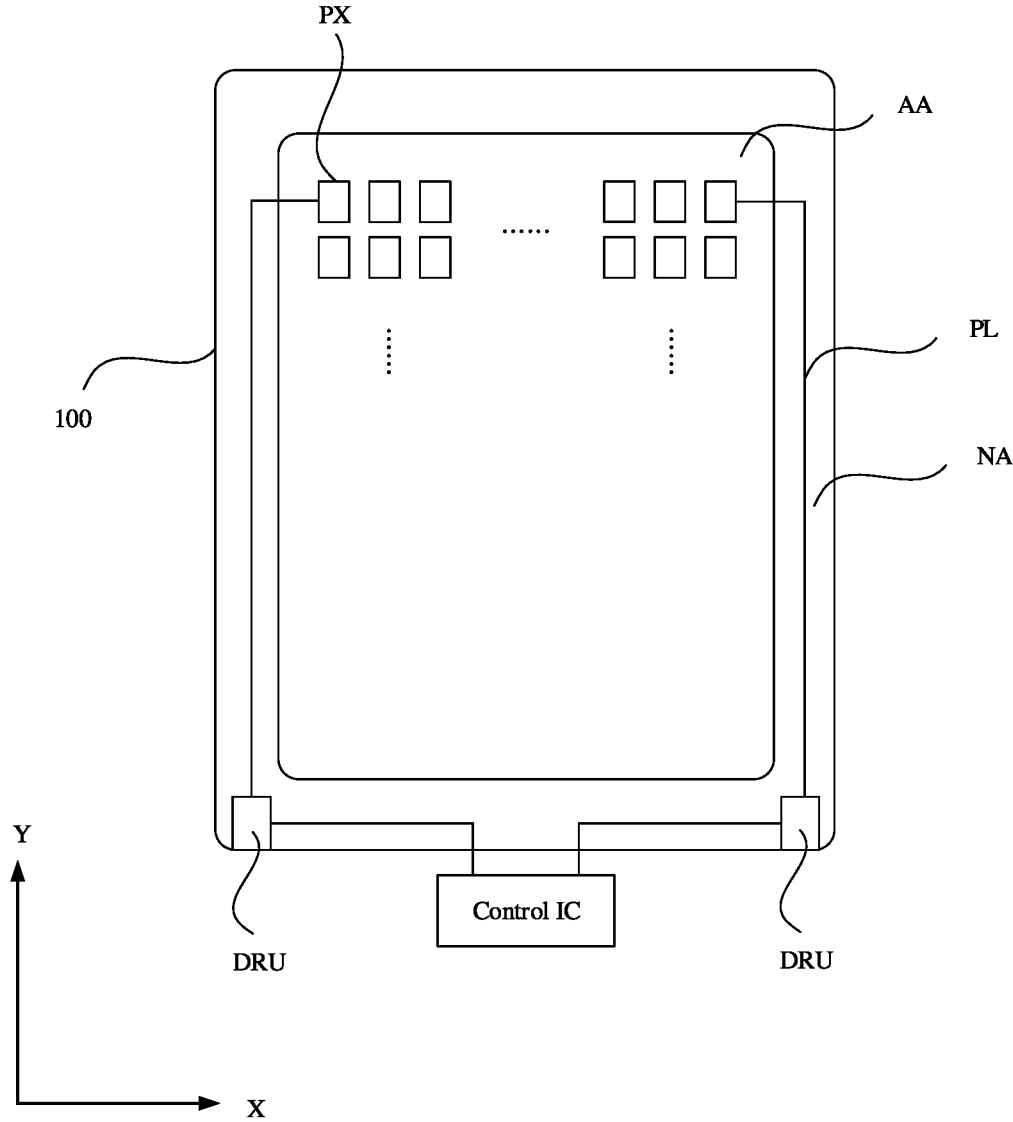
FIG. 2 is a schematic plan view of a display substrate according to some embodiments of the present disclosure.
Figure 3A:
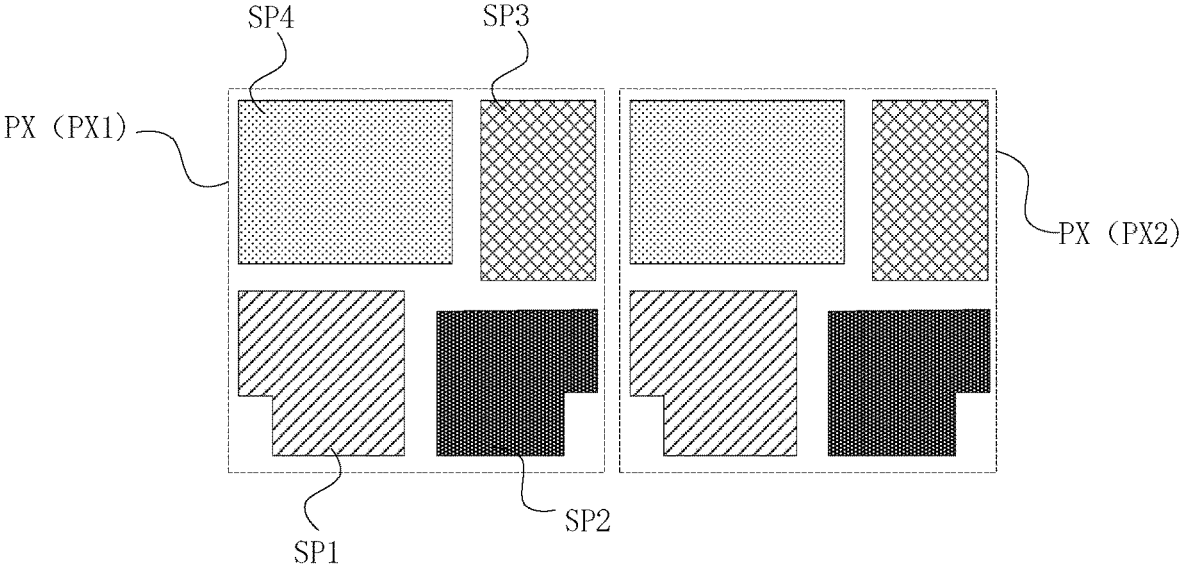
FIG. 3A is a schematic plan view of pixel units according to some embodiments of the present disclosure.

FIG. 2 is a schematic plan view of a display substrate according to some embodiments of the present disclosure, and FIG. 3A is a schematic plan view of pixel units according to some embodiments of the present disclosure, in which structures of two pixel units adjacent in the first direction are schematically shown. Referring to FIG. 2 and FIG. 3A, the display substrate according to the embodiments of the present disclosure may include a base substrate 100, a pixel unit PX arranged on the base substrate 100, a driving unit DRU arranged on the base substrate 100, and a wire PL for electrically connecting the pixel unit PX and the driving unit DRU. The driving unit DRU is used to drive the pixel unit PX.

The display substrate may include a display region AA and a non-display region NA. The display region AA may be a region in which the pixel unit PX for displaying an image is arranged. Each pixel unit PX will be described later. The non-display region NA may be a region in which no image is displayed. The driving unit DRU used to drive the pixel unit PX and some wires PL used to connect the pixel unit PX and the driving unit DRU may be arranged in the non-display region NA. The non-display region NA corresponds to a bezel in a final display device, and a width of the bezel may be determined according to a width of the non-display region NA.

The display region AA may have various shapes. For example, the display region AA may be provided in various shapes such as a closed polygon (e.g., rectangle) including straight sides, a circle, an ellipse and so on that includes a curved side, and a semicircle, a semi-ellipse and so on that includes a straight side and a curved side. In the embodiments of the present disclosure, the display region AA is provided as a region having a quadrangular shape including straight sides. It should be understood that this is merely an exemplary embodiment of the present disclosure, rather than a limitation to the present disclosure.

The non-display region NA may be arranged on at least one side of the display region AA. In the embodiments of the present disclosure, the non-display region NA may surround a periphery of the display region AA. In the embodiments of the present disclosure, the non-display region NA may include a lateral part extending in the first direction X and a longitudinal part extending in the second direction Y.

The pixel unit PX is arranged in the display region AA, and a plurality of pixel units may be provided. For example, the pixel unit PX may include light emitting device(s) emitting white light and/or color light.

A plurality of pixel units PX may be provided, and the plurality of pixel units PX may be arranged in a matrix form along rows extending in the first direction X and columns extending in the second direction Y. However, the embodiments of the present disclosure do not specifically limit an arrangement form of the pixel units PX, and the pixel units PX may be arranged in various forms. For example, the pixel units PX may be arranged such that a direction inclined with respect to the first direction X and the first direction Y is a column direction, and a direction intersecting the column direction is a row direction.

One pixel unit PX may include four sub-pixels, including a first sub-pixel SP1, a second sub-pixel SP2, a third sub-pixel SP3 and a fourth sub-pixel SP4. For example, the first sub-pixel SP1 may be the red sub-pixel, the second sub-pixel SP2 may be the green sub-pixel, the third sub-pixel SP3 may be the blue sub-pixel, and the fourth sub-pixel SP4 may be the white sub-pixel.

In at least one pixel unit PX, the fourth sub-pixel SP4 may be located in a same row as at least one of the first sub-pixel SP1, the second sub-pixel SP2 and the third sub-pixel SP3. For example, the fourth sub-pixel SP4 and the third sub-pixel SP3 are located in the same row, and the first sub-pixel SP1 and the second sub-pixel SP2 are located in the same row. For another example, the fourth sub-pixel SP4 and the second sub-pixel SP2 are located in the same row, and the first sub-pixel SP1 and the third sub-pixel SP3 are located in the same row. Alternatively, in at least one pixel unit PX, the fourth sub-pixel SP4 may be located in a different row from each of the first sub-pixel SP1, the second sub-pixel SP2 and the third sub-pixel SP3.

In at least one pixel unit PX, the plurality of sub-pixels may be divided into two rows of sub-pixels. The fourth sub-pixel SP4 may be located in the first row, or the fourth sub-pixel SP4 may be located in the second row. For example, referring to FIG. 3A, the third sub-pixel SP3 and the fourth sub-pixel SP4 are located in the first row, and the first sub-pixel SP1 and the second sub-pixel SP2 are located in the second row.

It should be noted that a sub-pixel being located in a certain row as described above may mean that the light emitting element of the sub-pixel is located in the certain row, which also applies to the following descriptions and will not be repeated later.

Figure 3B:
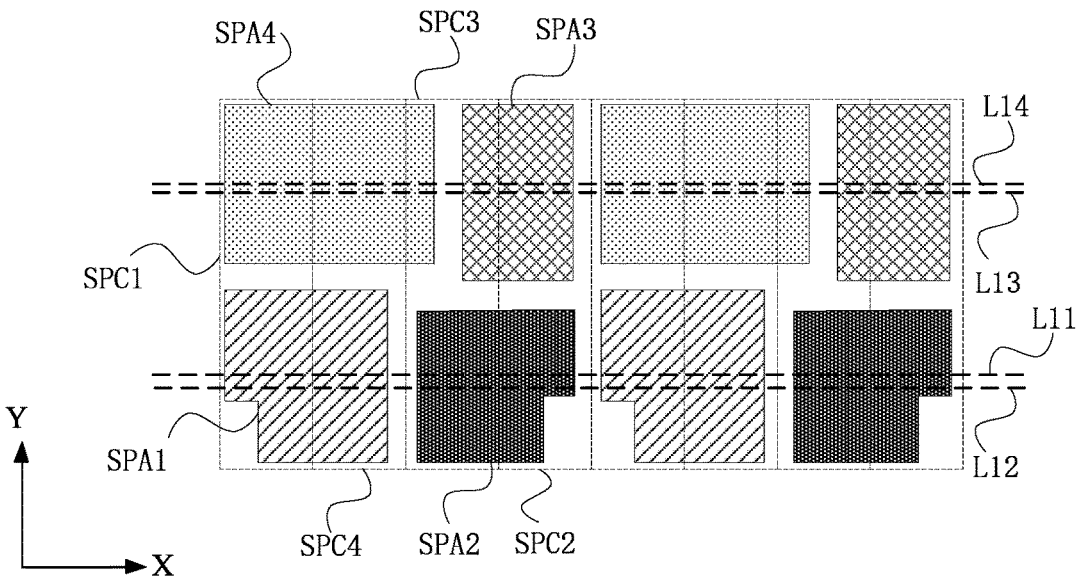
FIG. 3B is a schematic plan view of openings of sub-pixels according to some embodiments of the present disclosure.

FIG. 3B is a schematic plan view of openings of sub-pixels according to some embodiments of the present disclosure, in which structures of openings (i.e., the first opening to the fourth opening) of sub-pixels in the pixel unit are schematically shown. Referring to FIG. 3B, each sub-pixel may include a light emitting element and a pixel driving circuit used to drive the light emitting element. For example, the first sub-pixel SP1 may include a first light emitting element located in a first opening SPA1 and a first pixel driving circuit SPC1 used to drive the first light emitting element, and the first light emitting element may emit red light; the second sub-pixel SP2 may include a second light emitting element located in a second opening SPA2 and a second pixel driving circuit SPC2 used to drive the second light emitting element, and the second light emitting element may emit green light; the third sub-pixel SP3 may include a third light emitting element located in a third opening SPA3 and a third pixel driving circuit SPC3 used to drive the third light emitting element, and the third light emitting element may emit blue light; the fourth sub-pixel SP4 may include a fourth light emitting element located in a fourth opening SPA4 and a fourth pixel driving circuit SPC4 used to drive the fourth light emitting element, and the fourth light emitting element may emit white light.

Figure 4A:
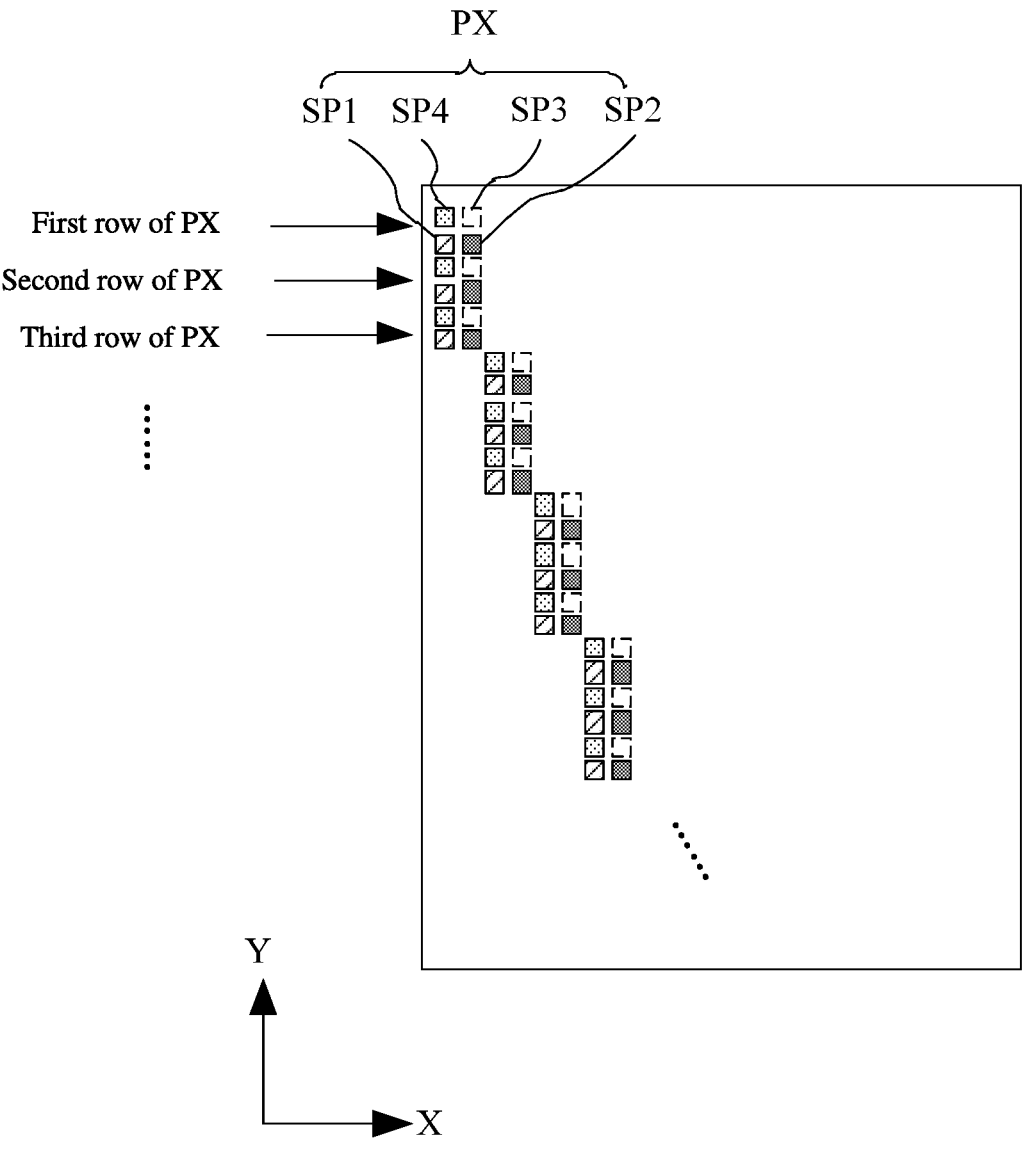
FIG. 4A and FIG. 4B are schematic diagrams of displaying an oblique line according to some embodiments of the present disclosure.
Figure 4B:
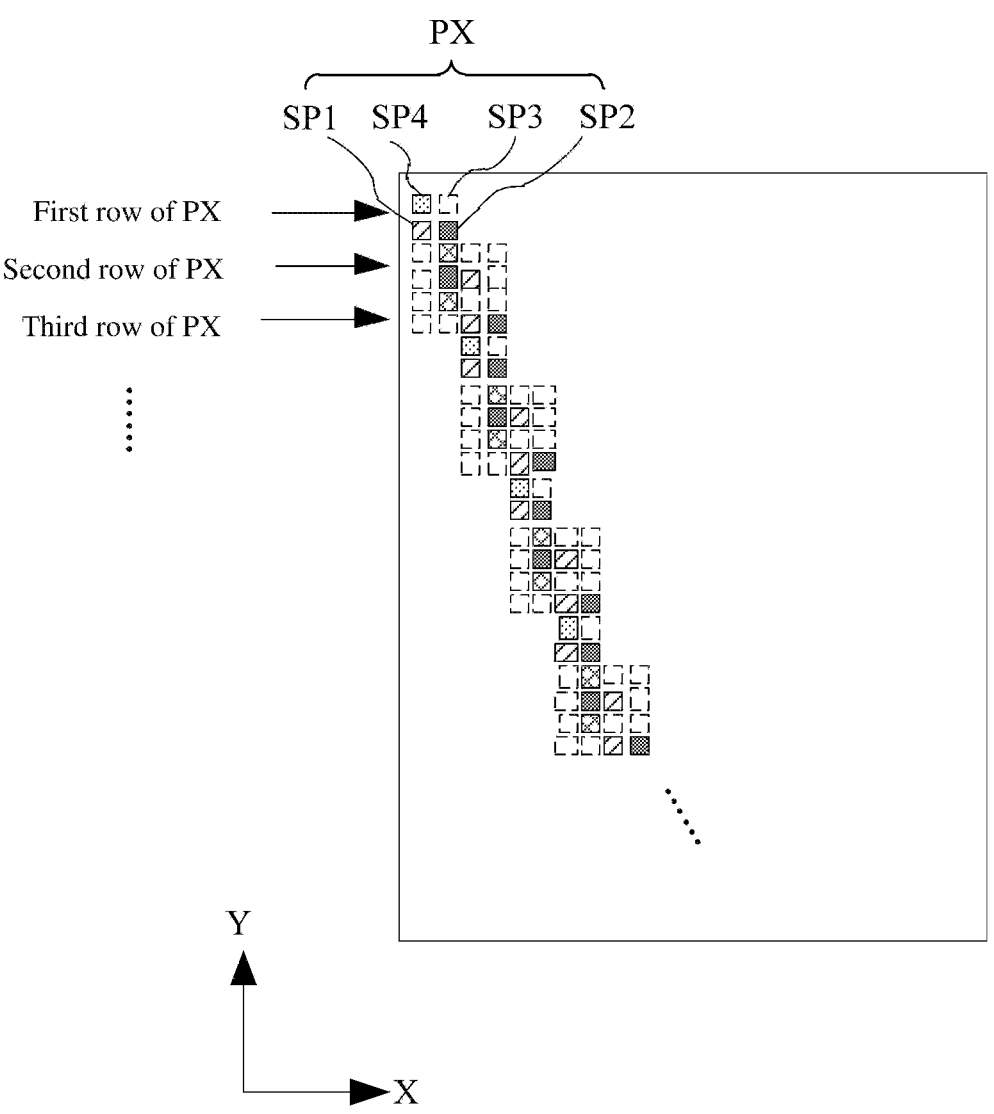

FIG. 4A and FIG. 4B are schematic diagrams of displaying an oblique line according to some embodiments of the present disclosure, FIG. 4A shows the display effect without using the anti-aliasing rendering smoothing algorithm, and FIG. 4B shows the display effect when using the anti-aliasing rendering smoothing algorithm. In FIG. 4A and FIG. 4B, other sub-pixels belonging to the same pixel unit PX as the sub-pixels emitting light are shown in dashed lines. Referring to FIG. 3A, FIG. 4A and FIG. 4B in combination, when displaying an oblique line, the sub-pixels that emit light may be kept compact no matter whether the anti-aliasing rendering smoothing algorithm is used or not, so that the oblique line is smoother, and thereby the aliasing may be improved.

Continuing to refer to FIG. 4B, when displaying the oblique line using the anti-aliasing rendering smoothing algorithm, for the pixel units PX in the first row, the sub-pixels in the first one of the pixel units PX emit light; and for the pixel units PX in the second row and the pixel units PX in the third row, the sub-pixels in two adjacent pixel units PX emit light cooperatively to simulate the display effect of one pixel unit. For example, for the pixel units PX in the first row, the first sub-pixel SP1, the second sub-pixel SP2 and the fourth sub-pixel SP4 of the first one of the pixel units PX emit light; for the pixel units PX in the second row, the third sub-pixel SP3 and the second sub-pixel SP2 of the first one of the pixel units PX emit light, and the first sub-pixel SP1 of the second one of the pixel units PX emit light; for the pixel units PX in the third row, the third sub-pixel SP3 of the first one of the pixel units PX emit light, and the first sub-pixel SP1 and the second sub-pixel SP2 of the second one of the pixel units PX emit light, and so on, so as to display the oblique line. In this way, any sub-pixel emitting light may be adjacent to other sub-pixels emitting light, so that the problem that a certain sub-pixel emitting light is too far away from other sub-pixels emitting light may be avoided, and the aliasing may be improved.

It should be noted that the above-mentioned "adjacent" may mean that no additional sub-pixel is located between two sub-pixels.

The opening of the sub-pixel may be a region where the light emitting element of the sub-pixel is located. For example, in an OLED display panel, the light emitting element of the sub-pixel may include an anode, a light emitting material layer and a cathode arranged in a stack. In this way, the opening of the sub-pixel may be a region corresponding to a part of the light emitting material layer sandwiched between the anode and the cathode. It should be noted that the opening of the sub-pixel mentioned above may refer to any one of the first opening SPA1, the second opening SPA2, the third opening SPA3 and the fourth opening SPA4, which also applies to the following descriptions and will not be repeated later.

It should be understood that the sub-pixel may further include a non-light emitting region. For example, the pixel driving circuit of the sub-pixel is located in the non-light emitting region of the sub-pixel. A ratio of an area of the opening of each sub-pixel to an overall area (a sum of an area of the opening and an area of the non-light emitting region) of the sub-pixel determines an opening rate of the sub-pixel.

First, an arrangement of the first opening SPA1 to the fourth opening SPA4 in the embodiments of the present disclosure will be described below.

Referring to FIG. 3B, in some specific embodiments, for at least two pixel units PX located in the same row, a first line L11 connecting centers of the first openings SPA1 of the first sub-pixels SP1 of the at least two pixel units PX is parallel to the first direction X; and/or a second line L12 connecting centers of the second openings SPA2 of the second sub-pixels SP2 of the at least two pixel units PX is parallel to the first direction X; and/or a third line L13 connecting centers of the third openings SPA3 of the third sub-pixels SP3 of the at least two pixel units PX is parallel to the first direction X.

For at least two pixel units PX located in the same row, a fourth line L14 connecting centers of the fourth openings SPA4 of the fourth sub-pixels SP4 of the at least two pixel units PX is parallel to the first direction X. At least one of the first line L11, the second line L12 or the third line L13 is spaced apart from the fourth line L14 in the second direction.

A shape of the opening of the sub-pixel may include a symmetric shape or an asymmetric shape, which may be specifically determined according to actual needs. When the shape of the opening is a symmetric shape, the center of the opening may refer to a geometric center of the opening, and the symmetric shape may be a rectangle, for example. When the shape of the opening is an asymmetric shape, it is possible to define a symmetric shape according to a boundary of the opening, and a geometric center of the defined symmetric shape may be used as the center of the opening.

In some specific embodiments, each of the first line L11, the second line L12 and the third line L13 is spaced apart from the fourth line L14 in the second direction.

The first opening SPA1 to the fourth opening SPA4 are mainly arranged in two manners. In one arrangement, hereinafter also known as a first arrangement, at least one of the first opening SPA1, the second opening SPA2, the third opening SPA3 and the fourth opening SPA4 is approximately a "block". In the other arrangement, hereinafter also known as a second arrangement, at least one of the first opening SPA1, the second opening SPA2, the third opening SPA3 or the fourth opening SPA4 is approximately a "strip". In different arrangements, the first line L11, the second line L12, the third line L13 and the fourth line L14 have different positional relationships. First, the first arrangement will be described below.

In some specific embodiments, for at least one row of pixel units PX, the fourth sub-pixel SP4 and one of the first sub-pixel SP1, the second sub-pixel SP2 and the third sub-pixel SP3 are located in the same row to form a first row of sub-pixels. The other two of the first sub-pixel SP1, the second sub-pixel SP2 and the third sub-pixel SP3 are located in the same row to form a second row of sub-pixels. The first row of sub-pixels and the second row of sub-pixels are adjacent in the second direction Y.

The first row of sub-pixels and the second row of sub-pixels being adjacent in the second direction Y may refer to that no additional sub-pixel is located between the first row of sub-pixels and the second row of sub-pixels in the second direction Y.

For at least one pixel unit PX, the first sub-pixel SP1 and the fourth sub-pixel SP4 may be located in different rows, the fourth sub-pixel SP4 and one of the second sub-pixel SP2 and the third sub-pixel SP3 form the first row of sub-pixels, and the first sub-pixel SP1 and the other of the second sub-pixel SP2 and the third sub-pixel SP3 form the second row of sub-pixels.

In some specific embodiments, the first line L11 and the fourth line L14 are spaced by a first distance in the second direction Y, the second line L12 and the fourth line L14 are spaced by a second distance in the second direction Y, and the third line L13 and the fourth line L14 are spaced by a third distance in the second direction Y. A ratio of one of the second distance and the third distance to the first distance ranges from 0.8 to 1.2, and a ratio of the other of the second distance and the third distance to the first distance is greater than 2.

For example, with reference to FIG. 3A and FIG. 3B, for at least one pixel unit PX, the pixel unit PX may include two rows of sub-pixels. The fourth sub-pixel SP4 and the third sub-pixel SP3 form the first row of sub-pixels, and the first sub-pixel SP1 and the second sub-pixel SP2 form the second row of sub-pixels. The first sub-pixel SP1 is located at a lower left corner, the second sub-pixel SP2 is located at a lower right corner, the third sub-pixel SP3 is located at an upper right corner, and the fourth sub-pixel SP4 is located at an upper left corner. In this case, the ratio of the second distance to the first distance may range from 0.8 to 1.2, and the ratio of the third distance to the first distance may be greater than 2.

Figures 3C, 3D:
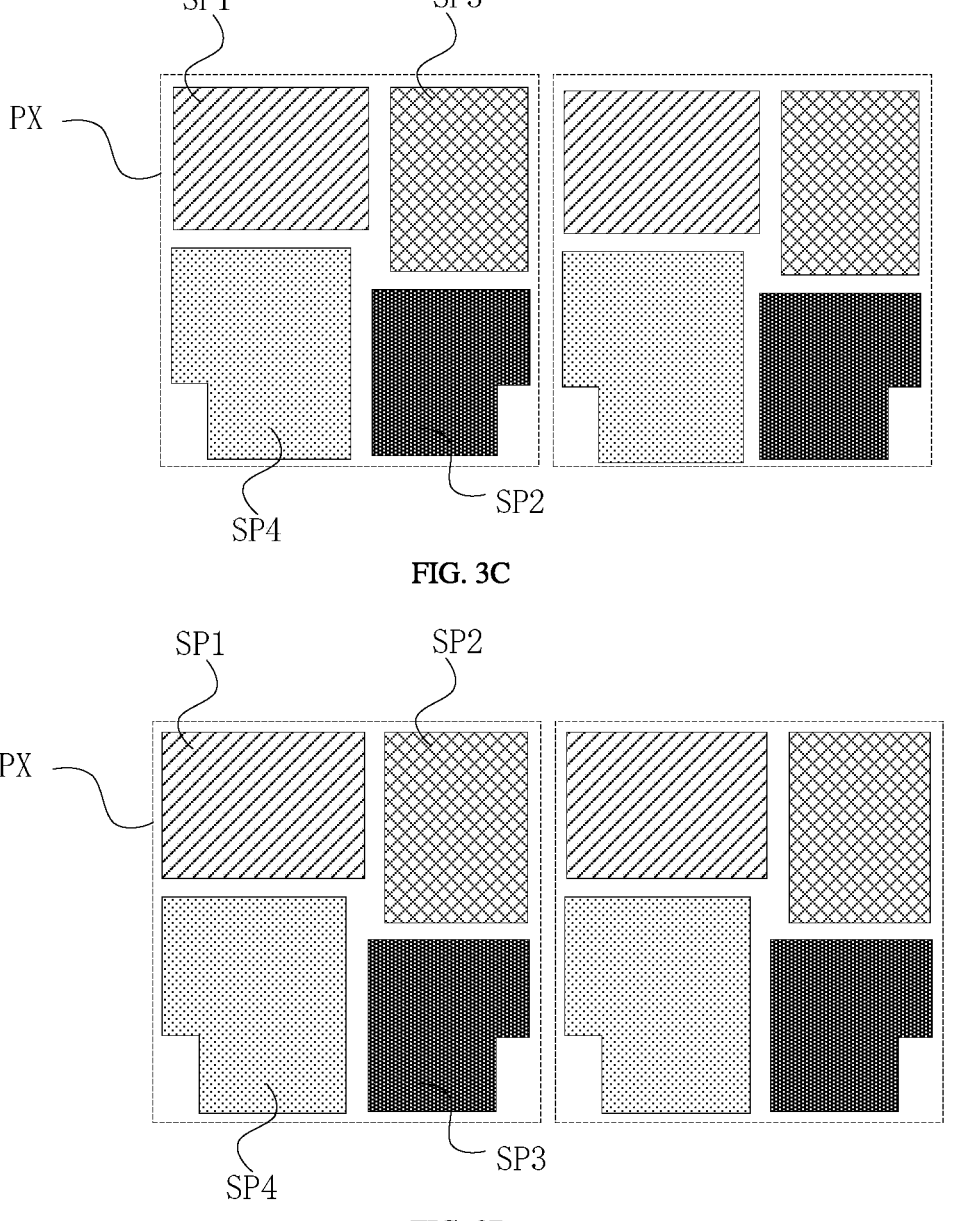
FIG. 3C is a schematic plan view of pixel units according to some other embodiments of the present disclosure.
FIG. 3D is a schematic plan view of pixel unit according to some other embodiments of the present disclosure.

For another example, FIG. 3C is a schematic plan view of pixel units according to some other embodiments of the present disclosure. Referring to FIG. 3C, for at least one pixel unit PX, the pixel unit PX may include two rows of sub-pixels. The second sub-pixel SP2 and the fourth sub-pixel SP4 form the second row of sub-pixels, and the first sub-pixel SP1 and the third sub-pixel SP3 form the first row of sub-pixels. The first sub-pixel SP1 is located at the upper left corner, the second sub-pixel SP2 is located at the lower right corner, the third sub-pixel SP3 is located at the upper right corner, and the fourth sub-pixel SP4 is located at the lower left corner. In this case, the ratio of the third distance to the first distance may be range from 0.8 to 1.2, and the ratio of the second distance to the first distance may be greater than 2.

For yet another example, FIG. 3D is a schematic plan view of pixel units according to some other embodiments of the present disclosure. Referring to FIG. 3D, for at least one pixel unit PX, the pixel unit PX may include two rows of sub-pixels. The first sub-pixel SP1 and the second sub-pixel SP2 form the first row of sub-pixels, and the third sub-pixel SP3 and the fourth sub-pixel SP4 form the second row of sub-pixels. The first sub-pixel SP1 is located at the upper left corner, the second sub-pixel SP2 is located at the upper right corner, the third sub-pixel SP3 is located at the lower right corner, and the fourth sub-pixel SP4 is located at the lower left corner. In this case, the ratio of the second distance to the first distance may be range from 0.8 to 1.2, and the ratio of the third distance to the first distance may be greater than 2.

Figure 3E:
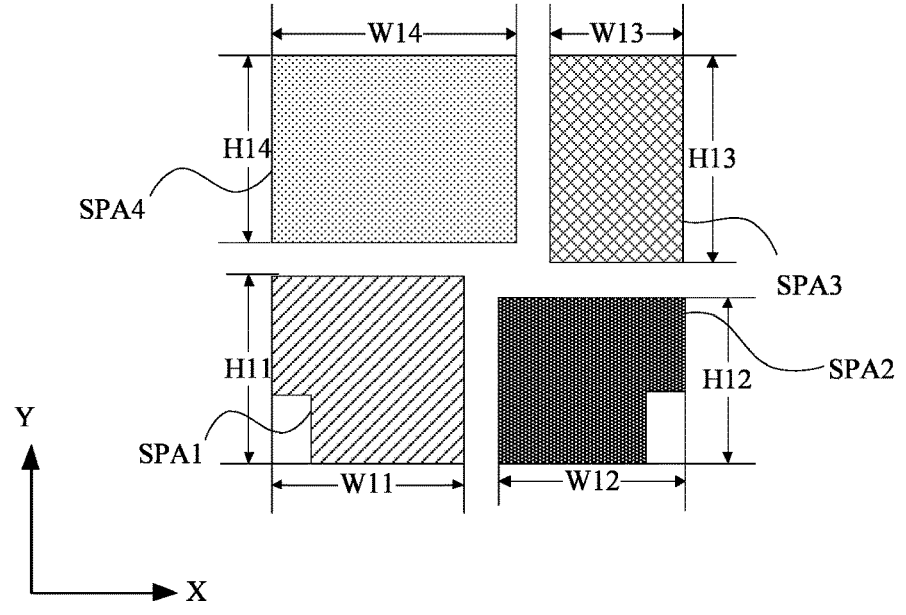
FIG. 3E is a schematic diagram of sizes of various openings in pixel units according to some embodiments of the present disclosure.

FIG. 3E is a schematic diagram of sizes of various openings in pixel units according to some embodiments of the present disclosure. Referring to FIG. 3E, in some specific embodiments, an orthographic projection of the first opening SPA1 on the base substrate 100 has a first width W11 in the first direction X and a first height H11 in the second direction Y, and a ratio of a larger one of the first height H11 and the first width W11 to a smaller one of the first height H11 and the first width W11 is greater than 1 and less than 1.5; and/or an orthographic projection of the second opening SPA2 on the base substrate 100 has a second width W12 in the first direction X and a second height H12 in the second direction Y, and a ratio of a larger one of the second height H12 and the second width W12 to a smaller one of the second height H12 and the second width W12 is greater than 1 and less than 1.5; and/or an orthographic projection of the third opening SPA3 on the base substrate 100 has a third width W13 in the first direction X and a third height H13 in the second direction Y, and a ratio of a larger one of the third height H13 and the third width W13 to a smaller one of the third height H13 and the third width W13 is greater than 1 and less than 1.5; and/or an orthographic projection of the fourth opening SPA4 on the base substrate 100 has a fourth width W14 in the first direction X and a fourth height H14 in the second direction Y, and a ratio of a larger one of the fourth height H14 and the fourth width W14 to a smaller one of the fourth height H14 and the fourth width W14 is greater than 1 and less than 1.5. Accordingly, each of the first opening SPA1, the second opening SPA2, the third opening SPA3 and the fourth opening SPA4 may be approximately a "block".

In the embodiments of the present disclosure, the orthographic projection of the opening (the first opening SPA1, the second opening SPA2, the third opening SPA3, or the fourth opening SPA4) on the base substrate 100 has a first boundary and a second boundary that are arranged opposite to each other in the first direction X. The width of the opening (the first opening SPA1, the second opening SPA2, the third opening SPA3, or the fourth opening SPA4) may refer to a distance between the first boundary and the second boundary, which may include an average distance or a maximum distance.

For example, referring to FIG. 3E, the first width W11 may refer to a distance between a left boundary and a right boundary of the first opening SPA1. The second width W12 to the fourth width W14 are similar to the first width W11, and details will not be repeated here.

In the embodiments of the present disclosure, the orthographic projection of the opening (the first opening SPA1, the second opening SPA2, the third opening SPA3, or the fourth opening SPA4) on the base substrate 100 further has a third boundary and a fourth boundary arranged opposite to each other in the second direction Y. The height of the opening (the first opening SPA1, the second opening SPA2, the third opening SPA3, or the fourth opening SPA4) may refer to a distance between the third boundary and the fourth boundary, which may include an average distance or a maximum distance.

For example, referring to FIG. 3E, the first height H11 may refer to a distance between an upper boundary and a lower boundary of the first opening SPA1. The second height H12 to the fourth height H14 are similar to the first height H11, and details will not be repeated here.

In some specific embodiments, for at least one row of pixel units PX, the fourth sub-pixel SP4 and one of the first sub-pixel SP1, the second sub-pixel SP2 and the third sub-pixel SP3 are located in a same column to form a first column of sub-pixels. The other two of the first sub-pixel SP1, the second sub-pixel SP2 and the third sub-pixel SP3 are located in a same column to form a second column of sub-pixels. The first column of sub-pixels and the second column of sub-pixels are arranged alternately in the first direction X.

For example, with reference to FIG. 3A, FIG. 3C and FIG. 3D, for at least one pixel unit PX, the first sub-pixel SP1 and the fourth sub-pixel SP4 may be located in the same column, and the second sub-pixel SP2 and the third sub-pixel SP3 are located in the same column.

The second arrangement of the openings of the sub-pixels in the pixel unit will be described below.

Figure 3F:
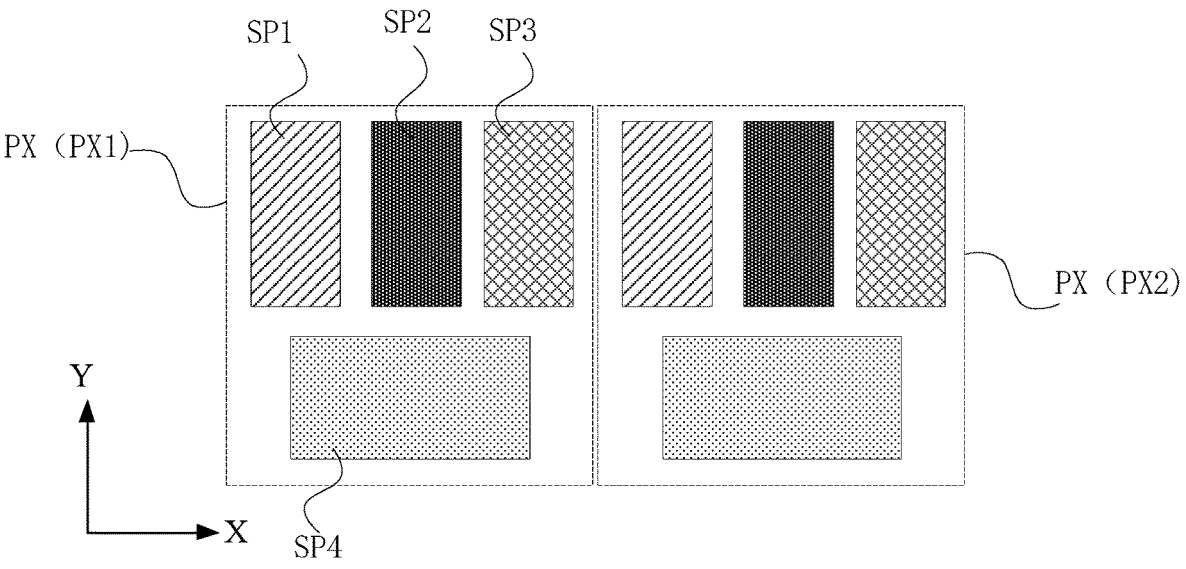
FIG. 3F is a schematic plan view of a pixel unit according to some other embodiments of the present disclosure.

FIG. 3F is a schematic plan view of a pixel unit according to some other embodiments of the present disclosure. Referring to FIG. 3F, in some specific embodiments, for at least one row of pixel units PX, the first sub-pixel SP1, the second sub-pixel SP2 and the third sub-pixel SP3 are located in the same row to form the first row of sub-pixels, and a plurality of fourth sub-pixels SP4 are located in the same row to form the second row of sub-pixels. The first row of sub-pixels and the second row of sub-pixels are adjacent in the second direction Y.

In the embodiments of the present disclosure, the first row of sub-pixels and the second row of sub-pixels being adjacent in the second direction Y may refer to that no additional sub-pixel is located between the first row of sub-pixels and the second row of sub-pixels in the second direction Y.

Figure 4C:
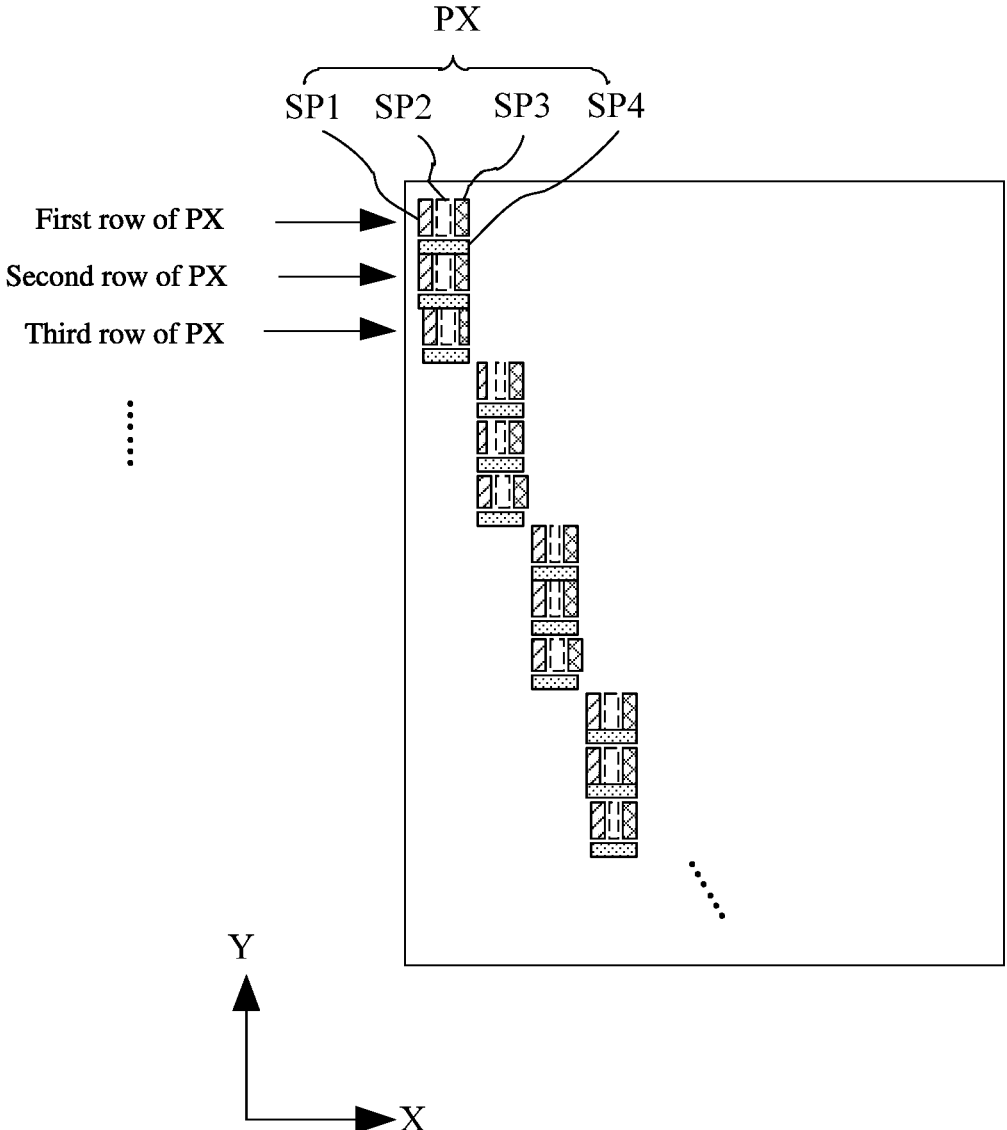
FIG. 4C and FIG. 4D are schematic diagrams of displaying an oblique line according to some other embodiments of the present disclosure.
Figure 4D:
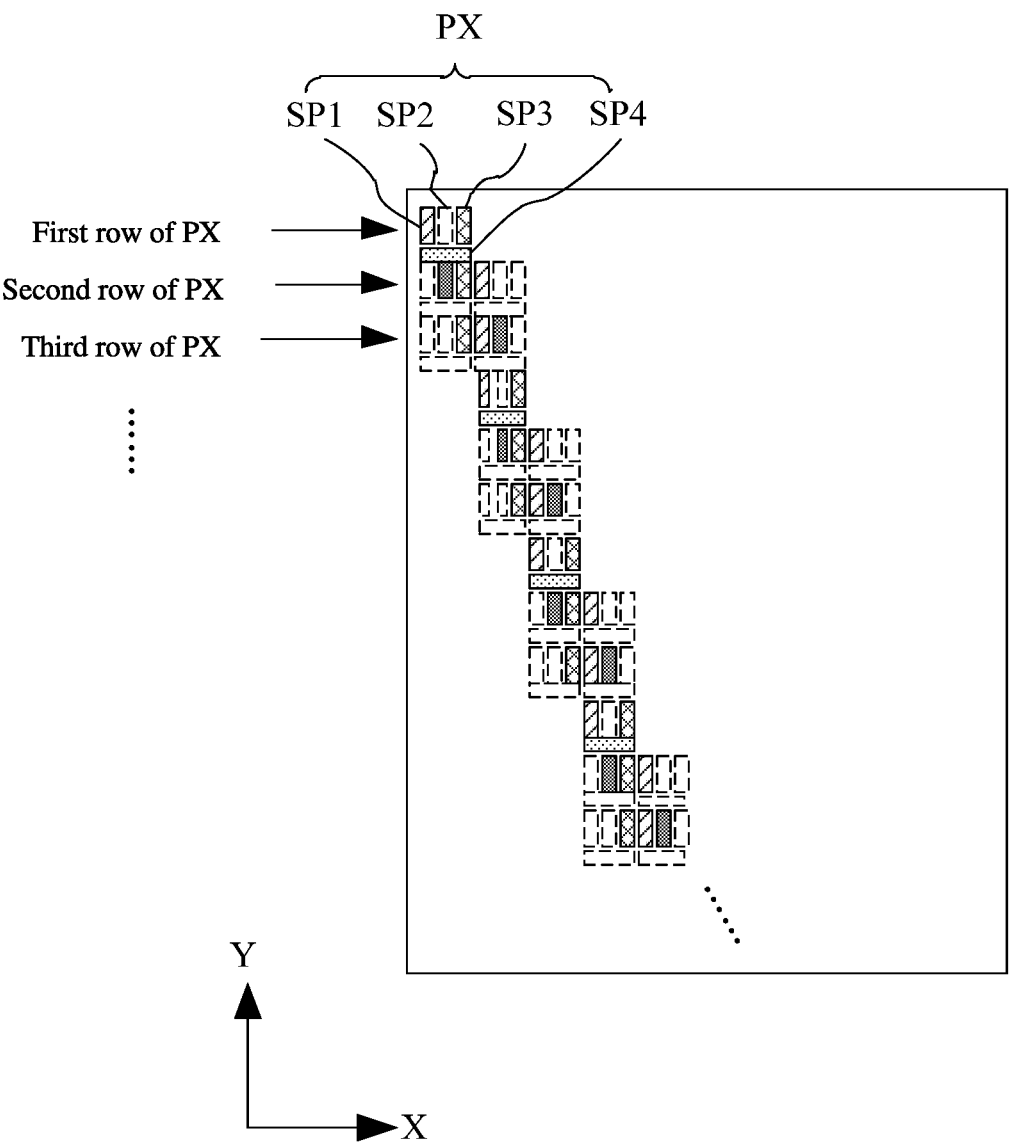

FIG. 4C and FIG. 4D are schematic diagrams of displaying an oblique line according to some other embodiments of the present disclosure. FIG. 4C shows the display effect without using the anti-aliasing rendering smoothing algorithm, and FIG. 4D shows the display effect when using the anti-aliasing rendering smoothing algorithm. In FIG. 4C and FIG. 4D, other sub-pixels belonging to the same pixel unit PX as the sub-pixel emitting light are shown in dashed lines. Referring to FIG. 3F, FIG. 4C and FIG. 4D, when displaying an oblique line, the sub-pixels that emit light may be kept compact no matter whether the anti-aliasing rendering smoothing algorithm is used or not, so that the oblique line is smoother, and the aliasing may be improved.

Continuing to refer to FIG. 4D, when displaying the oblique line using the anti-aliasing rendering smoothing algorithm, for the pixel units PX in the first row, the sub-pixels in the first one of the pixel units PX emit light; and for the pixel units PX in the second row and the pixel units PX in the third row, the sub-pixels in two adjacent pixel units PX emit light cooperatively to simulate the display effect of one pixel unit. For example, for the pixel units PX in the first row, the first sub-pixel SP1, the third sub-pixel SP3 and the fourth sub-pixel SP4 of the first one of the pixel units PX emit light; for the pixel units PX in the second row, the third sub-pixel SP3 and the second sub-pixel SP2 of the first one of the pixel units PX emit light, and the first sub-pixel SP1 of the second one of the pixel units PX emit light; for the pixel units PX in the third row, the third sub-pixel SP3 of the first one of the pixel units PX emit light, and the first sub-pixel SP1 and the second sub-pixel SP2 of the second one of the pixel units PX emit light, and so on, so as to display the oblique line. In this way, any sub-pixel emitting light may be adjacent to other sub-pixels emitting light, so that the problem that a certain sub-pixel emitting light being too far away from other sub-pixels emitting light may be avoided, and the aliasing may be improved.

Figures 3G, 3H:
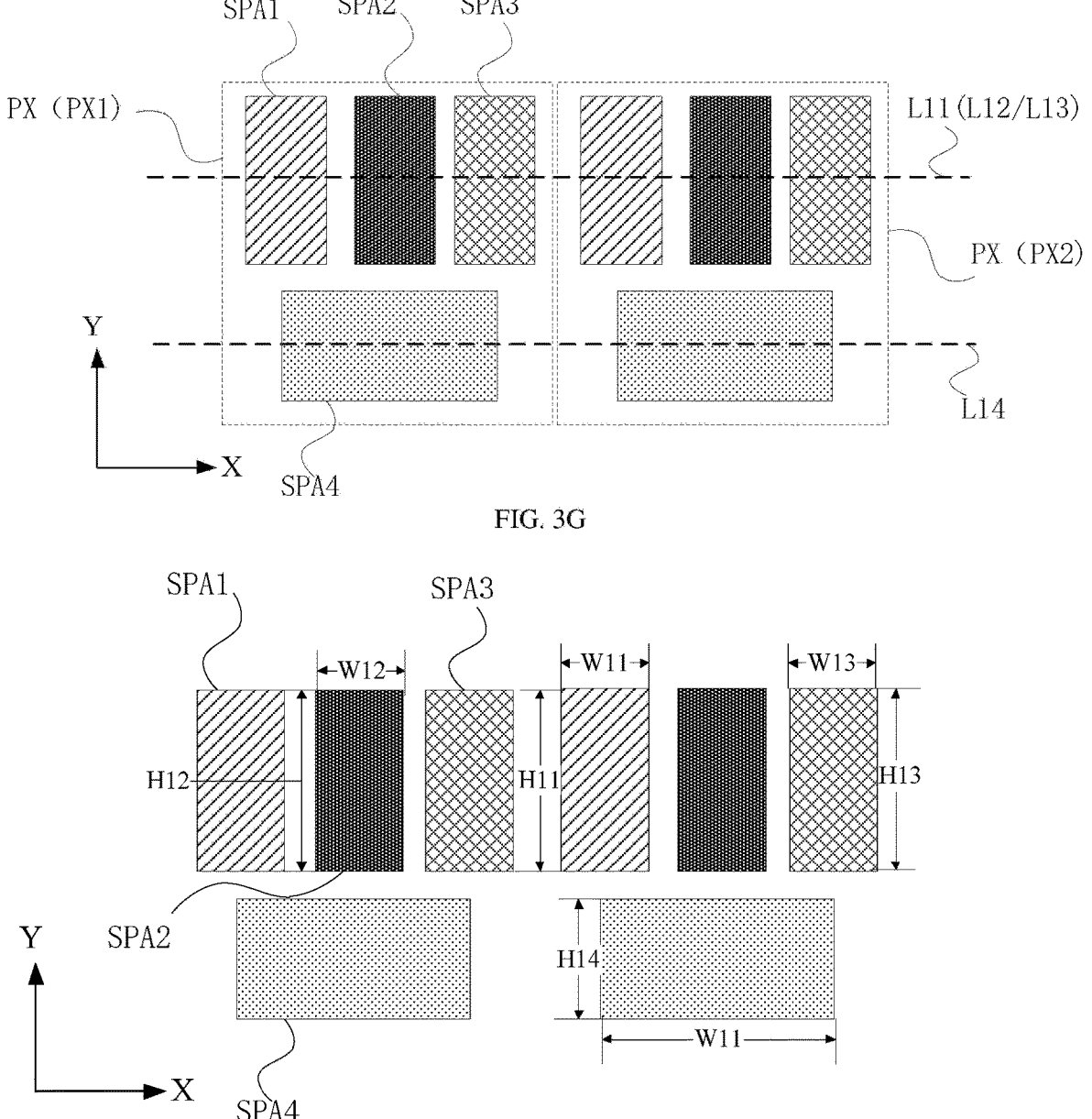
FIG. 3G is a schematic plan view of various openings in pixel units according to some other embodiments of the present disclosure.
FIG. 3H is a schematic diagram of sizes of various openings in pixel units according to some other embodiments of the present disclosure.

FIG. 3G is a schematic diagram of various openings in pixel units according to some other embodiments of the present disclosure. Referring to FIG. 3G, in some specific embodiments, the first line L11 and the fourth line L14 are spaced by a first distance in the second direction, the second line L12 and the fourth line L14 are spaced by a second distance in the second direction Y, and the third line L13 and the fourth line L14 are spaced by a third distance in the second direction Y. A ratio of any two of the first distance, the second distance and the third distance ranges from 0.8 to 1.2.

For example, referring to FIG. 3G, for at least one pixel unit PX, the first sub-pixel SP1, the second sub-pixel SP2 and the third sub-pixel SP3 may be located in the first row, and the fourth sub-pixel SP4 may be located in the second row. In this case, by controlling the ratio of any two of the first distance, the second distance and the third distance to range from 0.8 to 1.2, a distance between the first sub-pixel SP1 and the fourth sub-pixel SP4 in the second direction Y, a distance between the second sub-pixel SP2 and the fourth sub-pixel SP4 in the second direction Y, and a distance between the third sub-pixel SP3 and the fourth sub-pixel SP4 in the second direction Y may be similar to each other.

FIG. 3H is a schematic diagram of sizes of various openings in pixel units according to some other embodiments of the present disclosure. Referring to FIG. 3H, in some specific embodiments, an orthographic projection of the first opening SPA1 on the base substrate 100 has a first width W11 in the first direction X and a first height H11 in the second direction Y, and a ratio of a larger one of the first height H11 and the first width W11 to a smaller one of the first height H11 and the first width W11 is greater than 1.5; and/or an orthographic projection of the second opening SPA2 on the base substrate 100 has a second width W12 in the first direction X and a second height H12 in the second direction Y, and a ratio of a larger one of the second height H12 and the second width W12 to a smaller one of the second height H12 and the second width W12 is greater than 1.5; and/or an orthographic projection of the third opening SPA3 on the base substrate 100 has a third width W13 in the first direction X and a third height H13 in the second direction Y, and a ratio of a larger one of the third height H13 and the third width W13 to a smaller one of the third height H13 and the third width W13 is greater than 1.5; and/or an orthographic projection of the fourth opening SPA4 on the base substrate 100 has a fourth width W14 in the first direction X and a fourth height H14 in the second direction Y, and a ratio of a larger one of the fourth height H14 and the fourth width W14 to a smaller one of the fourth height H14 and the fourth width W14 is greater than 1.5. Accordingly, each of the first opening SPA1, the second opening SPA2, the third opening SPA3 and the fourth opening SPA4 may be approximately a "strip".

The orthographic projection of the opening (the first opening SPA1, the second opening SPA2, the third opening SPA3, or the fourth opening SPA4) on the base substrate 100 has a first boundary and a second boundary that are arranged opposite to each other in the first direction X. The width of the opening (the first opening SPA1, the second opening SPA2, the third opening SPA3, or the fourth opening SPA4) may refer to a distance between the first boundary and the second boundary, which may include an average distance or a maximum distance.

For example, referring to FIG. 3H, the first width W11 may refer to a distance between a left boundary and a right boundary of the first opening SPA1.

In the embodiments of the present disclosure, the orthographic projection of the opening (the first opening SPA1, the second opening SPA2, the third opening SPA3, or the fourth opening SPA4) on the base substrate 100 further has a third boundary and a fourth boundary arranged opposite to each other in the second direction Y. The height of the opening (the first opening SPA1, the second opening SPA2, the third opening SPA3, or the fourth opening SPA4) may refer to a distance between the third boundary and the fourth boundary, which may include an average distance or a maximum distance.

For example, referring to FIG. 3H, the first height H11 may refer to a distance between an upper boundary and a lower boundary of the first opening SPA1.

In some specific embodiments, the fourth width W14 of the fourth opening SPA4 is greater than the fourth height H14 of the fourth opening SPA4. The first width W11 of the first opening SPA1 is less than the first height H11 of the first opening SPA1, the second width W12 of the second opening SPA2 is less than the second height H12 of the second opening SPA2, and the third width W13 of the third opening SPA3 is less than the third height H13 of the third opening SPA3.

For example, the fourth opening SPA4 is a strip-shaped opening extending in the first direction X. Each of the first opening SPA1, the second opening SPA2 and the third opening SPA3 is a strip-shaped opening extending in the second direction Y, and the first opening SPA1, the second opening SPA2 and the third opening SPA3 are arranged in the first direction X.

In some specific embodiments, for one and same pixel unit PX, each of the orthographic projection of the first opening SPA1 on the base substrate 100, the orthographic projection of the second opening SPA2 on the base substrate 100 and the orthographic projection of the third opening SPA3 on the base substrate 100 overlaps at least partially with the orthographic projection of the fourth opening SPA4 on the base substrate 100 in the second direction Y, so that the various openings may be kept compact.

A pixel circuit of the sub-pixel in the embodiments of the present disclosure will be described below.

Figure 5:
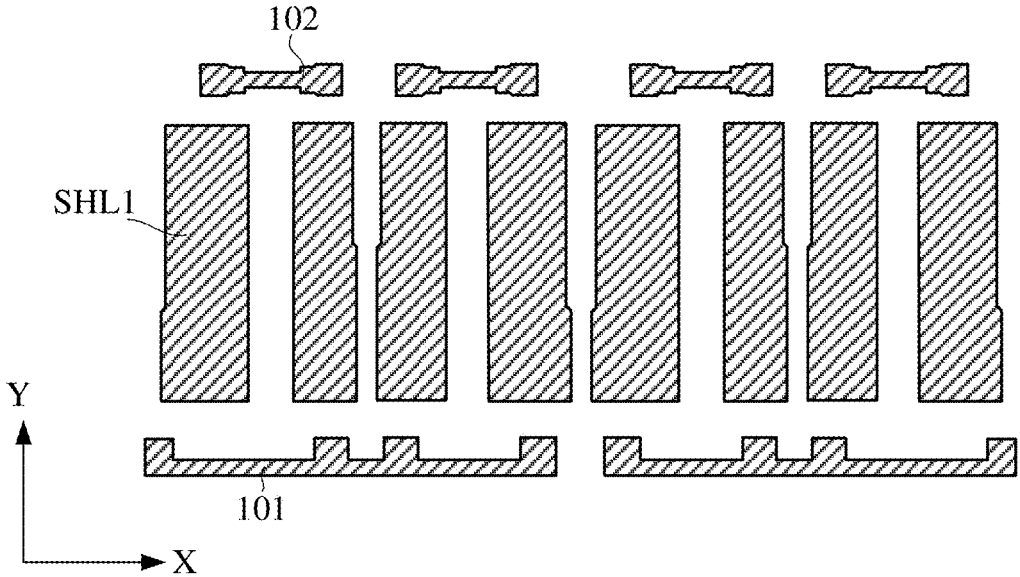
FIG. 5 to FIG. 13 are partial plan views of a display substrate according to some embodiments of the present disclosure, respectively.
Figure 6:
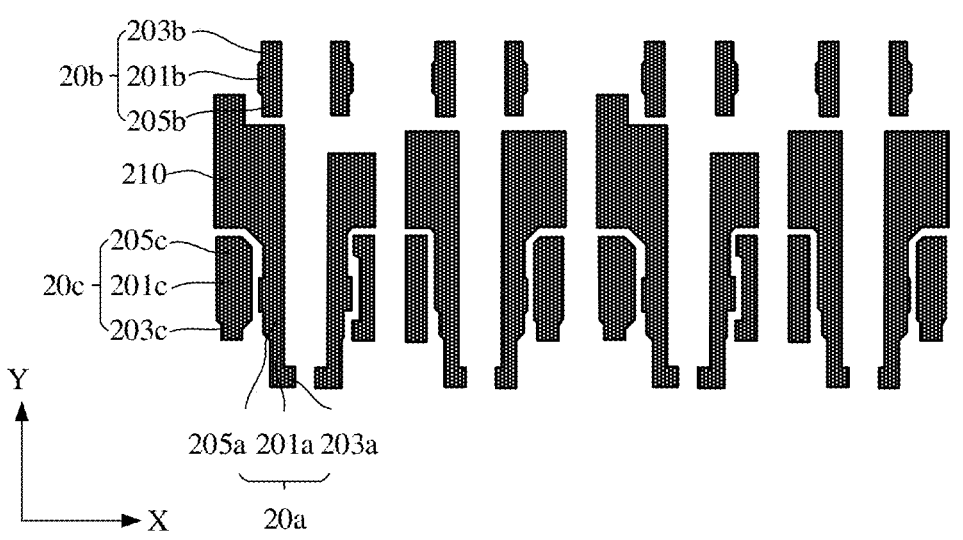
Figure 7:
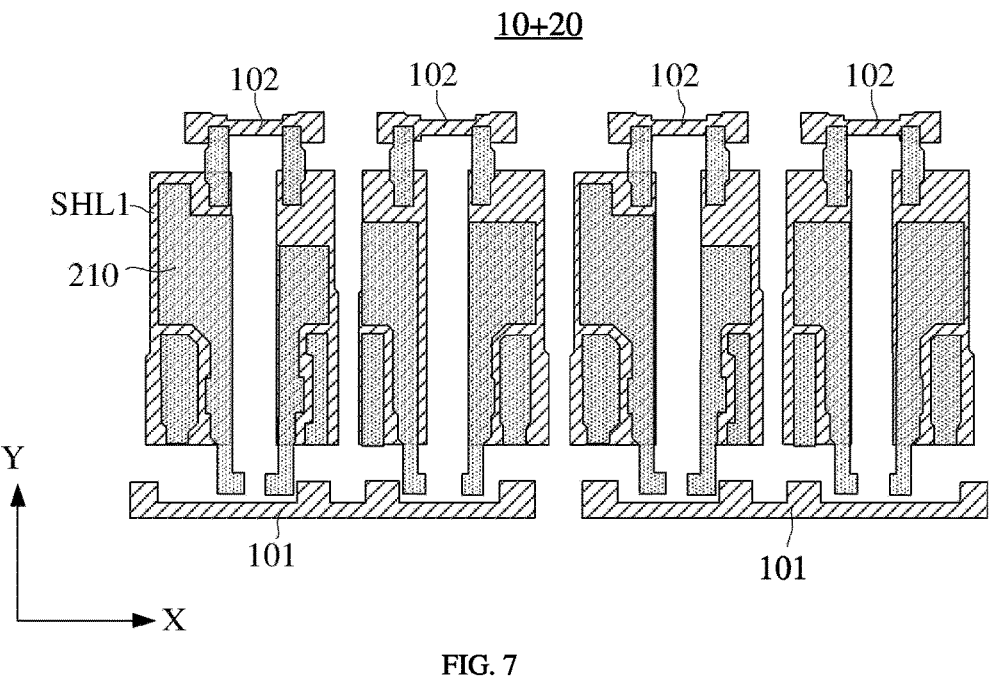
Figure 8:
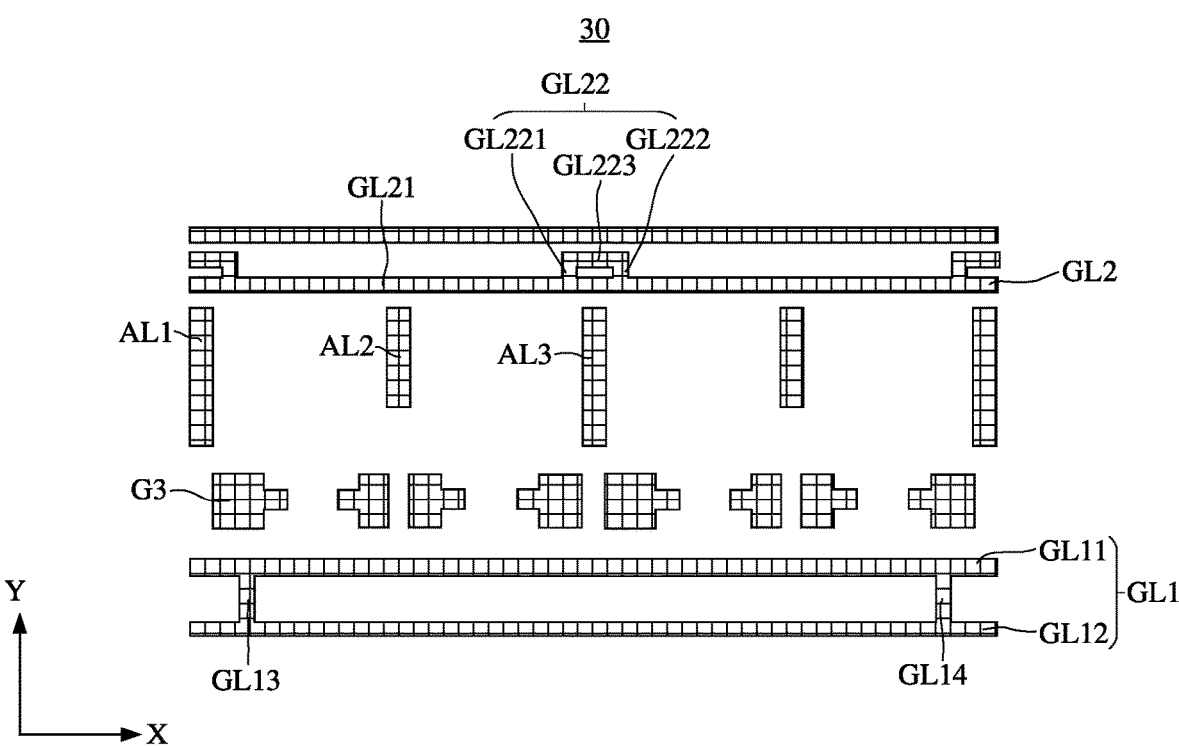
Figure 9:
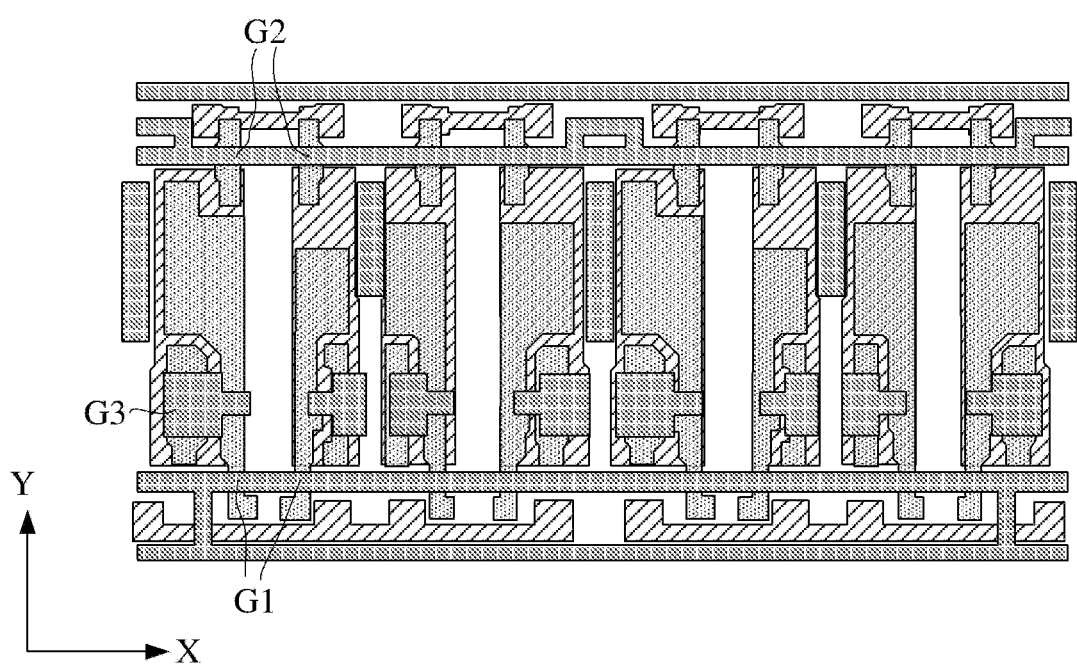
Figure 10:
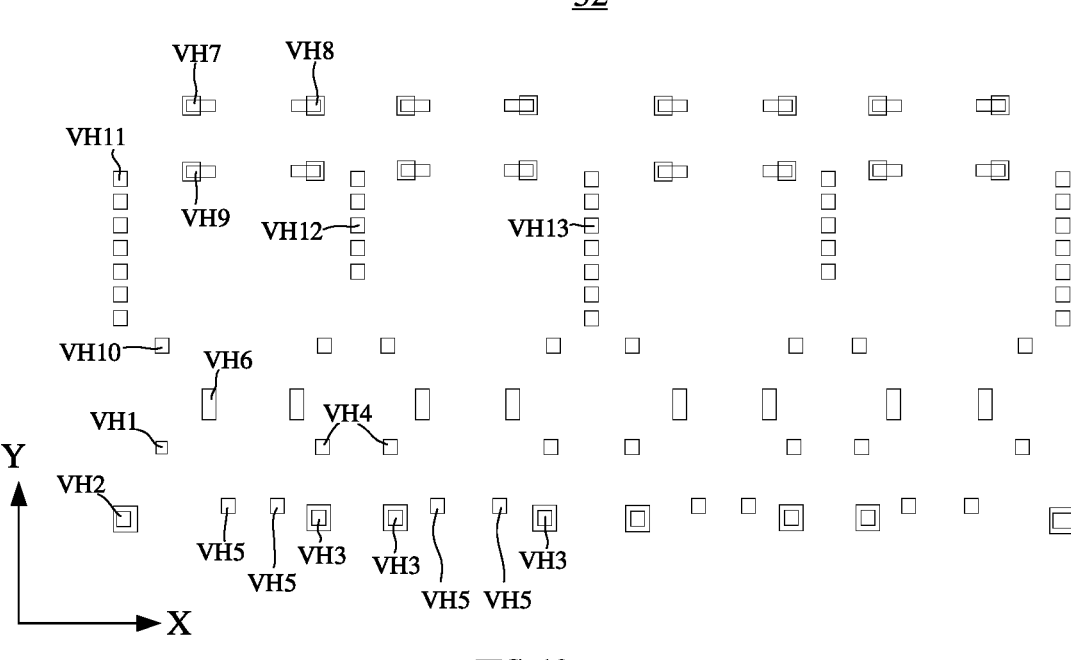
Figure 11A:
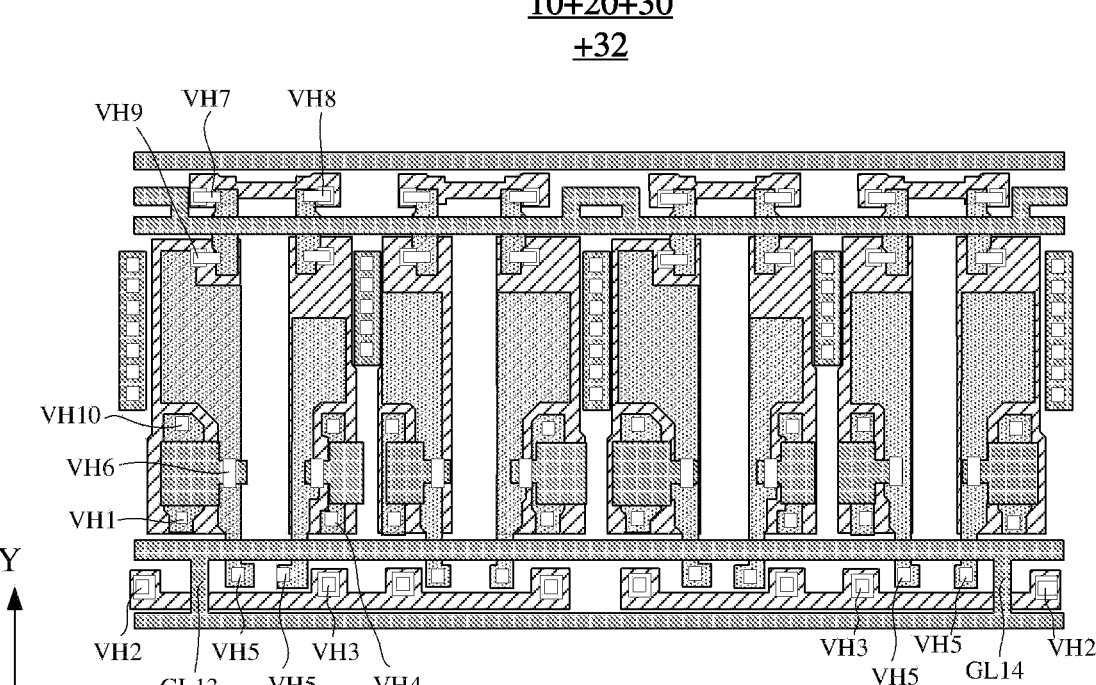
Figure 11B:
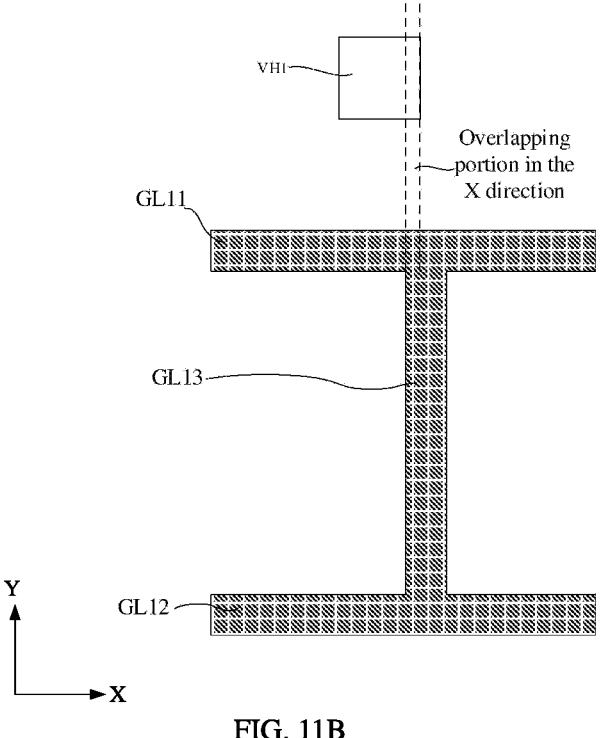
Figure 12:
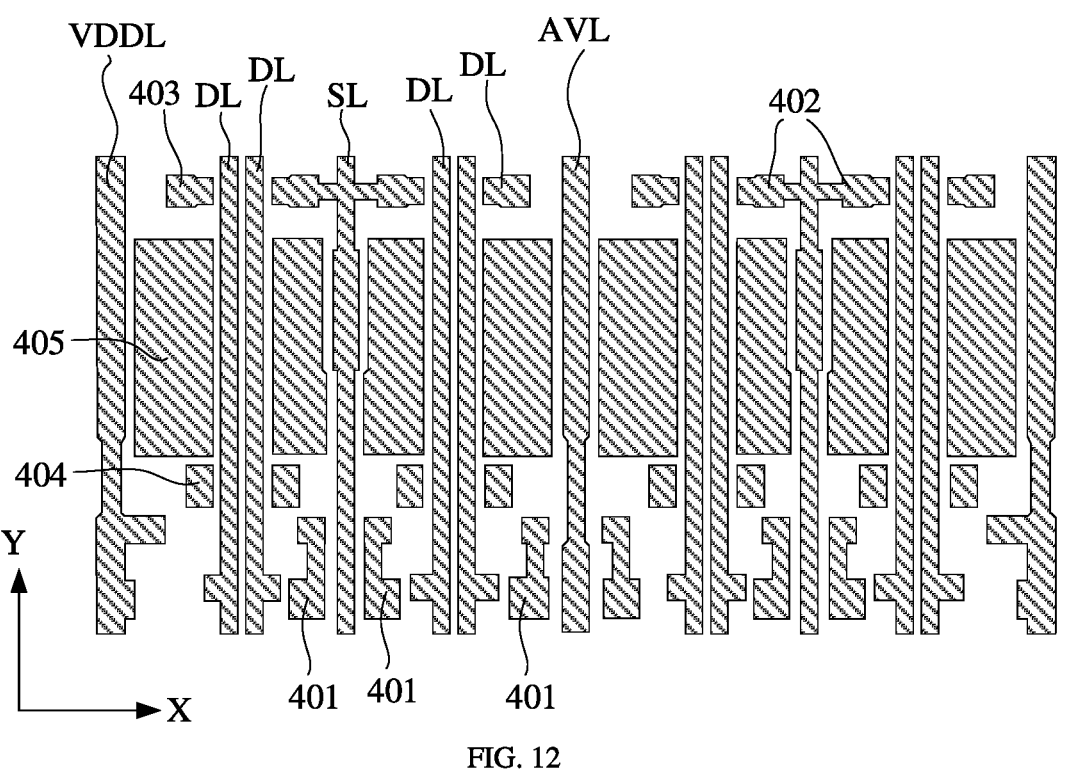
Figure 13:
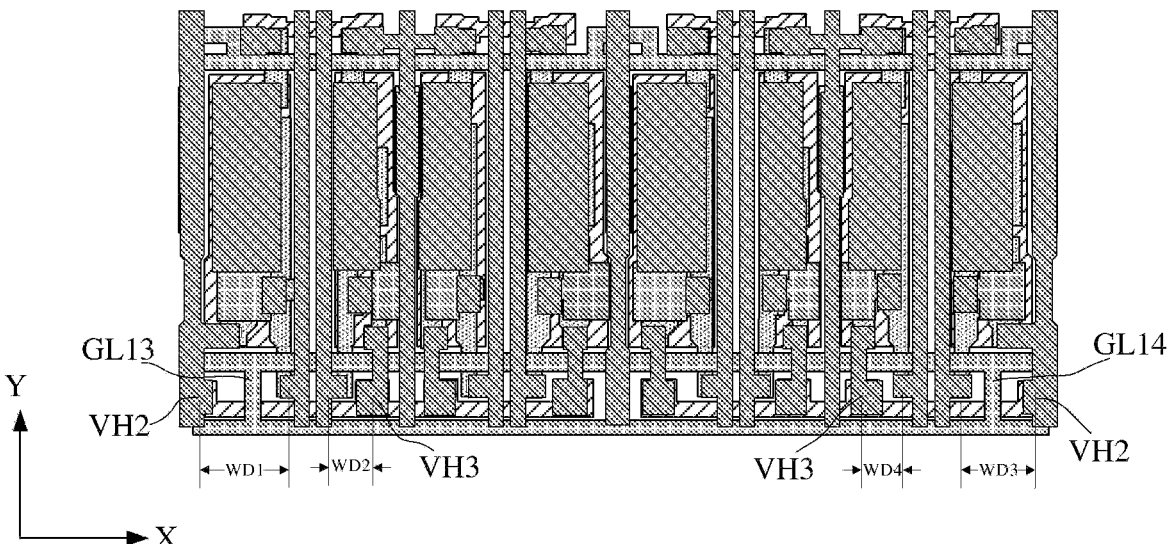
Figures 14, 15A:
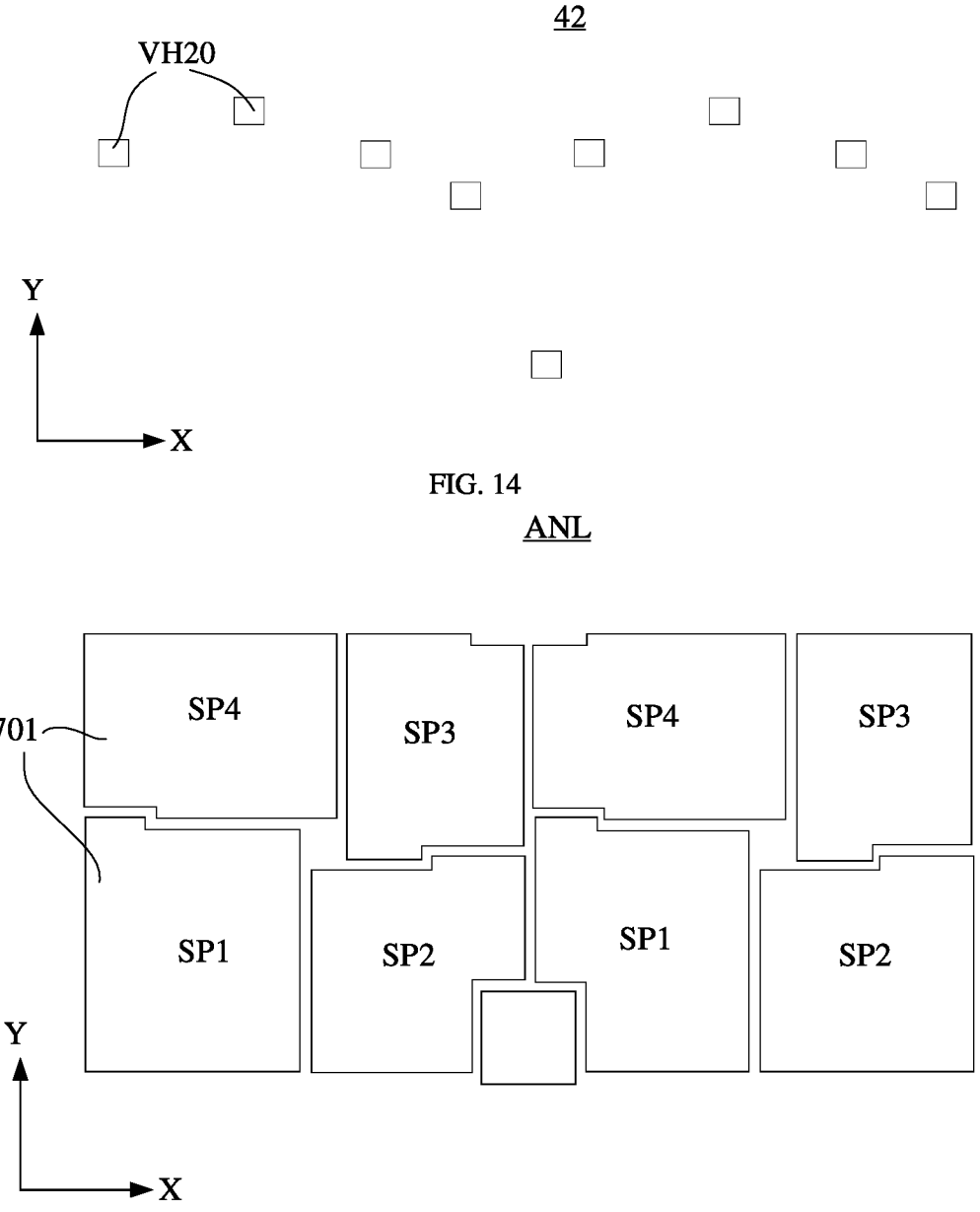
FIG. 14 is a partial plan view of a display substrate according to some embodiments of the present disclosure, in which a plan view of a second insulation film layer of a pixel unit group included in the display substrate is schematically shown.
FIG. 15A is a partial plan view of a display substrate according to some embodiments of the present disclosure, in which a plan view of a first electrode layer of a pixel unit group included in the display substrate is schematically shown.
Figure 15B:
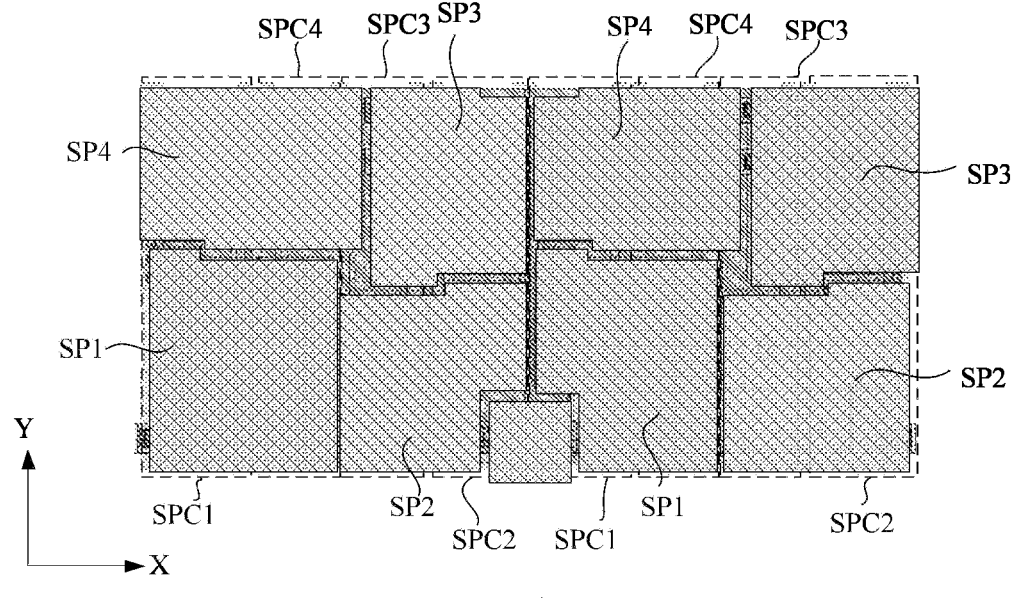
FIG. 15B is a partial plan view of a display substrate according to some embodiments of the present disclosure, in which a plan view of a first electrode layer and a pixel driving circuit below the first electrode layer of a pixel unit group included in the display substrate is schematically shown.
Figure 16:
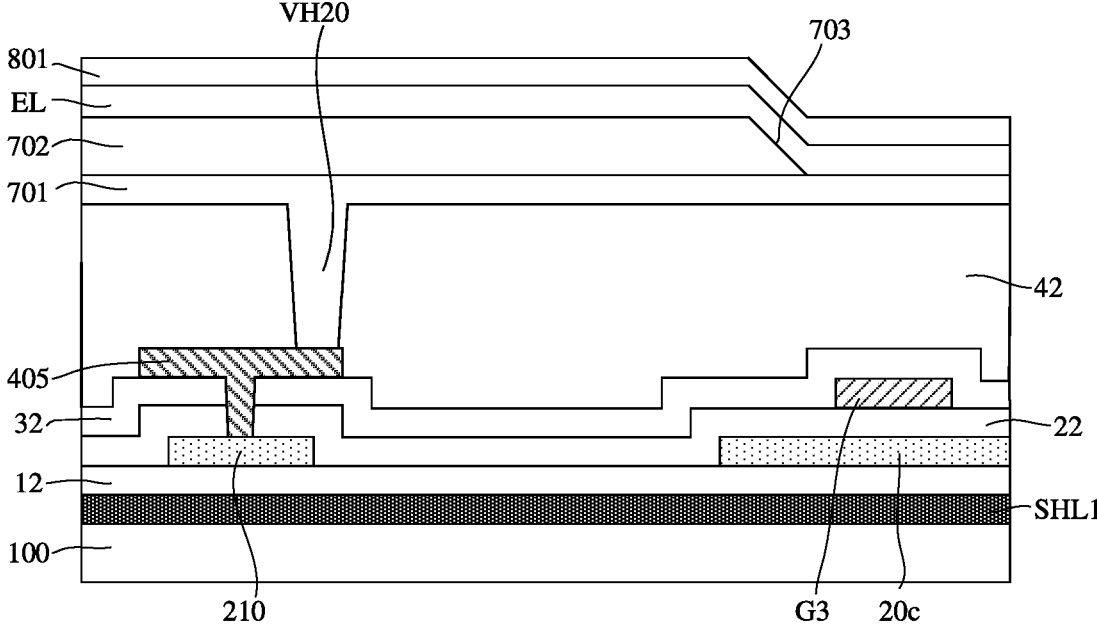
FIG. 16 is a cross-sectional view of a display substrate according to some embodiments of the present disclosure.

FIG. 5 to FIG. 13 are partial plan views of a display substrate according to some embodiments of the present disclosure, respectively, in which a plan view of a pixel driving circuit of a pixel unit group included in the display substrate is schematically shown. FIG. 5 schematically shows a partial plan view of a first conductive film layer, FIG. 6 schematically shows a partial plan view of a semiconductor film layer, FIG. 7 schematically shows a partial plan view of a combination of the first conductive film layer and the semiconductor film layer, FIG. 8 schematically shows a partial plan view of a second conductive film layer, FIG. 9 schematically shows a partial plan view of a combination of the first conductive film layer, the semiconductor film layer and the second conductive film layer, FIG. 10 schematically shows a partial plan view of a first insulation film layer, FIG. 11A schematically shows a partial plan view of a combination of the first conductive film layer, the semiconductor film layer, the second conductive film layer and the first insulation film layer, FIG. 11B schematically shows a partial enlarged view of a relative positional relationship between a first via hole and a connecting line in FIG. 11A, FIG. 12 schematically shows a partial plan view of a third conductive film layer, and FIG. 13 schematically shows a partial plan view of a combination of the first conductive film layer, the semiconductor film layer, the second conductive film layer, the first insulation film layer and the third conductive film layer. FIG. 14 is a partial plan view of a display substrate according to some embodiments of the present disclosure, in which a plan view of a second insulation film layer of a pixel unit group included in the display substrate is schematically shown. FIG. 15A is a partial plan view of a display substrate according to some embodiments of the present disclosure, in which a plan view of a first electrode layer of a pixel unit group included in the display substrate is schematically shown. FIG. 15B is a partial plan view of a display substrate according to some embodiments of the present disclosure, in which a plan view of a first electrode layer and a pixel driving circuit below the first electrode layer of a pixel unit group included in the display substrate is schematically shown. FIG. 16 is a cross-sectional view of a display substrate according to some embodiments of the present disclosure.

It should be noted that in FIG. 10 and FIG. 14, via holes in the insulation film layer are mainly schematically shown, while an insulation material of the insulation film layer is not shown. In this way, positions of via holes in the insulation film layer may be highlighted.

Referring to FIG. 5 to FIG. 16, in some specific embodiments, the display substrate includes: a first conductive film layer 10 arranged on the base substrate 100, a semiconductor film layer 20 arranged on a side of the first conductive film layer 10 away from the base substrate 100, a second conductive film layer 30 arranged on a side of the semiconductor film layer 20 away from the base substrate 100, a third conductive film layer 40 arranged on a side of the second conductive film layer 30 away from the base substrate 100, and a first electrode layer ANL arranged on a side of the third conductive film layer 40 away from the base substrate 100. The display substrate includes a plurality of anodes 701 located in the first electrode layer ANL. A driving signal may be loaded on the anode 701 and a cathode 801, so as to drive a light emitting material layer between the anode 701 and the cathode 801 to emit light.

FIG. 5 shows a part of the first conductive film layer 10. The first conductive film layer 10 may be a film layer where a first shielding portion SHL1 is located. FIG. 6 shows a part of the semiconductor film layer 20. FIG. 8 shows a part of the second conductive film layer 30, the second conductive film layer 30 may be a film layer where a gate line and a gate electrode of a transistor are located, that is, the second conductive film layer 30 may be a conductive film layer formed of a gate material. FIG. 12 shows a part of the third conductive film layer 40, the third conductive film layer 40 may be a film layer where a data signal line DL and the like are located, that is, the third conductive film layer may be a conductive film layer formed of a source/drain material.

The display substrate may include a plurality of signal lines. The plurality of signal lines may include a first gate line GL1, a second gate line GL2, a data signal line DL, a first voltage line VDDL, a sensing signal line SL, and an auxiliary cathode line AVL. The first gate line GL1 and the second gate line GL2 may be located in the second conductive film layer 30. The data signal line DL, the first voltage line VDDL, the sensing signal line SL and the auxiliary cathode line AVL may be located in the third conductive film layer 40.

The first gate line GL1 and the second gate line GL2 may extend substantially in the first direction X, and the first gate line GL1 and the second gate line GL2 are spaced apart in the second direction Y. The data signal line DL, the first voltage line VDDL, the sensing signal line SL and the auxiliary cathode line AVL may extend substantially in the second direction Y, and any two of the data signal line DL, the first voltage line VDDL, the sensing signal line SL and the auxiliary cathode line AVL are spaced apart in the first direction X.

A row of pixel units PX include a plurality of pixel unit groups, each pixel unit group includes a first pixel unit and a second pixel unit adjacent in the first direction X. For at least one pixel unit group, pixel driving circuits of a plurality of sub-pixels are arranged side by side in the first direction X, and anodes of light emitting elements of the plurality of sub-pixels are arranged in two rows in the second direction Y.

In the embodiments shown in FIG. 3A and FIG. 3F, a pixel unit group is schematically shown. For example, a pixel unit group includes a first pixel unit PX1 and a second pixel unit PX2 that are arranged adjacent in the first direction X. Each of the first pixel unit PX1 and the second pixel unit PX2 includes a plurality of sub-pixels, for example, four sub-pixels, including the first sub-pixel SP1, the second sub-pixel SP2, the third sub-pixel SP3 and the fourth sub-pixel SP4. The pixel driving circuits of the eight sub-pixels are arranged side by side in the first direction X, that is, the pixel driving circuits of the eight sub-pixels are arranged in a row. In a pixel unit group, the pixel driving circuits of the four sub-pixels of the first pixel unit PX1 are arranged in the first direction X in an order of the first sub-pixel SP1, the fourth sub-pixel SP4, the third sub-pixel SP3 and the second sub-pixel SP2, and the pixel driving circuits of the four sub-pixels of the second pixel unit PX2 are arranged in the first direction X in an order of the first sub-pixel SP1, the fourth sub-pixel SP4, the third sub-pixel SP3 and the second sub-pixel SP2.

In a pixel unit group, each pixel unit shares a first voltage line VDDL and a sensing signal line SL, that is, the four sub-pixels of the first pixel unit PX1 share a first voltage line VDDL and a sensing signal line SL, and the four sub-pixels of the second pixel unit PX2 share a first voltage line VDDL and a sensing signal line SL. The eight sub-pixels of the pixel unit group share an auxiliary cathode line AVL.

For example, the sub-pixels in each row of pixel units share a first gate line GL1 and a second gate line GL2, and each column of sub-pixels share a data signal line DL. That is, in a pixel unit group, the eight sub-pixels share a first gate line GL1 and a second gate line GL2, and the eight sub-pixels have respective data signal lines DL.

In a pixel unit group, the signal lines extending in the second direction Y are arranged in an order of one first voltage line VDDL, two data signal lines DL, one sensing signal line SL, two data signal lines DL, one auxiliary cathode line AVL, two data signal lines DL, one sensing signal line SL, two data signal lines DL and one first voltage line VDDL. The first voltage line, the data signal lines and the sensing signal line of the first pixel unit PX1 and the first voltage line, the data signal lines and the sensing signal line of the second pixel unit PX2 are symmetrically arranged in the first direction X with respect to the auxiliary cathode line AVL shared by the two pixel units. A layout design may be simplified with such arrangement.

For the first pixel unit PX1 in a pixel unit group, the first voltage line VDDL used to provide a first voltage signal to each sub-pixel of the first pixel unit is arranged on a side of each sub-pixel of the first pixel unit, for example, on a left side of the first sub-pixel SP1, the two data signal lines DL used to provide data signals respectively to the first sub-pixel SP1 and the fourth sub-pixel SP4 are arranged between the first sub-pixel SP1 and the fourth sub-pixel SP4, the sensing signal line SL used to provide a sensing signal is arranged between the fourth sub-pixel SP4 and the third sub-pixel SP3, and the two data signal lines DL used to provide data signals respectively to the third sub-pixel SP3 and the second sub-pixel SP2 are arranged between the third sub-pixel SP3 and the second sub-pixel SP2.

For the second pixel unit PX2 in a pixel unit group, the first voltage line VDDL used to provide a first voltage signal to each sub-pixel of the first pixel unit is arranged on a side of each sub-pixel of the first pixel unit, for example, on a right side of the second sub-pixel SP2, the two data signal lines DL used to provide data signals respectively to the first sub-pixel SP1 and the fourth sub-pixel SP4 are arranged between the first sub-pixel SP1 and the fourth sub-pixel SP4, the sensing signal line SL used to provide a sensing signal is arranged between the fourth sub-pixel SP4 and the third sub-pixel SP3, and the two data signal lines DL used to provide data signals respectively to the third sub-pixel SP3 and the second sub-pixel SP2 are arranged between the third sub-pixel SP3 and the second sub-pixel SP2.

For a pixel unit group, the shared auxiliary cathode line AVL is arranged between the first pixel unit PX1 and the second pixel unit PX2, for example, between the second sub-pixel SP2 of the first pixel unit PX1 and the first sub-pixel SP1 of the second pixel unit PX2.

In the embodiments of the present disclosure, for a sub-pixel, a region surrounded by the signal lines extending in the first direction X which are used to provide signals to the sub-pixel and the signal lines extending in the second direction Y which are used to provide signals to the sub-pixel forms a pixel driving circuit region (also referred to as a region where the pixel driving circuit is located) of the sub-pixel.

For example, for the first sub-pixel SP1 of the first pixel unit PX1 in a pixel unit group, a region surrounded by the first gate line GL1 used to provide a first scan signal to the first sub-pixel SP1, the second gate line GL2 used to provide a second scan signal to the first sub-pixel SP1, the first voltage line VDDL used to provide a first voltage signal to the first sub-pixel SP1 and the data signal line DL used to provide a data signal to the first sub-pixel SP1 forms a pixel driving circuit region of the first sub-pixel SP1, which may be, for example, a rectangular region. For the fourth sub-pixel SP4 of the first pixel unit PX1 in the pixel unit group, a region surrounded by the first gate line GL1 used to provide a first scan signal to the fourth sub-pixel SP4, the second gate line GL2 used to provide a second scan signal to the fourth sub-pixel SP4, the data signal line DL used to provide a data signal to the fourth sub-pixel SP4 and the sensing signal line SL forms a pixel driving circuit region of the fourth sub-pixel SP4, which may be, for example, a rectangular region. For the third sub-pixel SP3 of the first pixel unit PX1 in the pixel unit group, a region surrounded by the first gate line GL1 used to provide a first scan signal to the third sub-pixel SP3, the second gate line GL2 used to provide a second scan signal to the third sub-pixel SP3, the data signal line DL used to provide a data signal to the third sub-pixel SP3 and the sensing signal line SL forms a pixel driving circuit region of the third sub-pixel SP3, which may be, for example, a rectangular region. For the second sub-pixel SP2 of the first pixel unit PX1 in the pixel unit group, a region surrounded by the first gate line GL1 used to provide a first scan signal to the second sub-pixel SP2, the second gate line GL2 used to provide a second scan signal to the second sub-pixel SP2, the data signal line DL used to provide a data signal to the second sub-pixel SP2 and the auxiliary cathode line AVL forms a pixel driving circuit region of the second sub-pixel SP2, which may be, for example, a rectangular region.

For example, for the second sub-pixel SP2 of the second pixel unit PX2 in the pixel unit group, a region surrounded by the first gate line GL1 used to provide a first scan signal to the second sub-pixel SP2, the second gate line GL2 used to provide a second scan signal to the second sub-pixel SP2, the first voltage line VDDL used to provide a first voltage signal to the second sub-pixel SP2 and the data signal line DL used to provide a data signal to the second sub-pixel SP2 forms a pixel driving circuit region of the second sub-pixel SP2, which may be, for example, a rectangular region. For the third sub-pixel SP3 of the second pixel unit PX2 in the pixel unit group, a region surrounded by the first gate line GL1 used to provide a first scan signal to the third sub-pixel SP3, the second gate line GL2 used to provide a second scan signal to the third sub-pixel SP3, the data signal line DL used to provide a data signal to the third sub-pixel SP3 and the sensing signal line SL forms a pixel driving circuit region of the third sub-pixel SP3, which may be, for example, a rectangular region. For the fourth sub-pixel SP4 of the second pixel unit PX2 in the pixel unit group, a region surrounded by the first gate line GL1 used to provide a first scan signal to the fourth sub-pixel SP4, the second gate line GL2 used to provide a second scan signal to the fourth sub-pixel SP4, the data signal line DL used to provide a data signal to the fourth sub-pixel SP4 and the sensing signal line SL forms a pixel driving circuit region of the fourth sub-pixel SP4, which may be, for example, a rectangular region. For the first sub-pixel SP1 of the second pixel unit PX2 in the pixel unit group, a region surrounded by the first gate line GL1 used to provide a first scan signal to the first sub-pixel SP1, the second gate line GL2 used to provide a second scan signal to the first sub-pixel SP1, the data signal line DL used to provide a data signal to the first sub-pixel SP1 and the auxiliary cathode line AVL forms a pixel driving circuit region of the first sub-pixel SP1, which may be, for example, a rectangular region.

Referring to FIG. 15A and FIG. 15B, anodes 701 of light emitting elements of a plurality of sub-pixels are arranged in two rows in the second direction Y. In other words, in the embodiments of the present disclosure, the pixel driving circuits (SPC1 to SPC4) of a plurality of sub-pixels (such as eight sub-pixels) of a pixel unit group are arranged in a row, that is, arranged in a 1*8 array; the anodes 701 of the plurality of sub-pixels (such as eight sub-pixels) of said pixel unit group are arranged in two rows, that is, arranged in a 2*4 array.

In some specific embodiments, a top-emitting structure may be adopted in the pixel unit PX, and the anode 701 of the light emitting element may contain a conductive material that may block light, such as a metal conductive material. Light emitted by the light emitting material layer may be reflected by the anode 701 of the light emitting element, so as to act as display light.

In some specific embodiments, for one and same sub-pixel, an orthographic projection of the pixel driving circuit of the sub-pixel on the base substrate 100 and an orthographic projection of the anode 701 of the light emitting element of the sub-pixel on the base substrate 100 may have the following relationships.

The orthographic projection of the pixel driving circuit of the sub-pixel on the base substrate 100 exceeds the orthographic projection of the anode 701 of the light emitting element of the sub-pixel on the base substrate 100 in the second direction Y; and/or the orthographic projection of the anode 701 of the light emitting element of the sub-pixel on the base substrate 100 exceeds the orthographic projection of the pixel driving circuit of the sub-pixel on the base substrate 100 in the first direction X. in this way, the anode 701 may shield the pixel driving circuit, so as to prevent the light emitted by the light emitting material layer from irradiating to a device sensitive to light in the pixel driving circuit, such as a transistor.

Figure 17A:
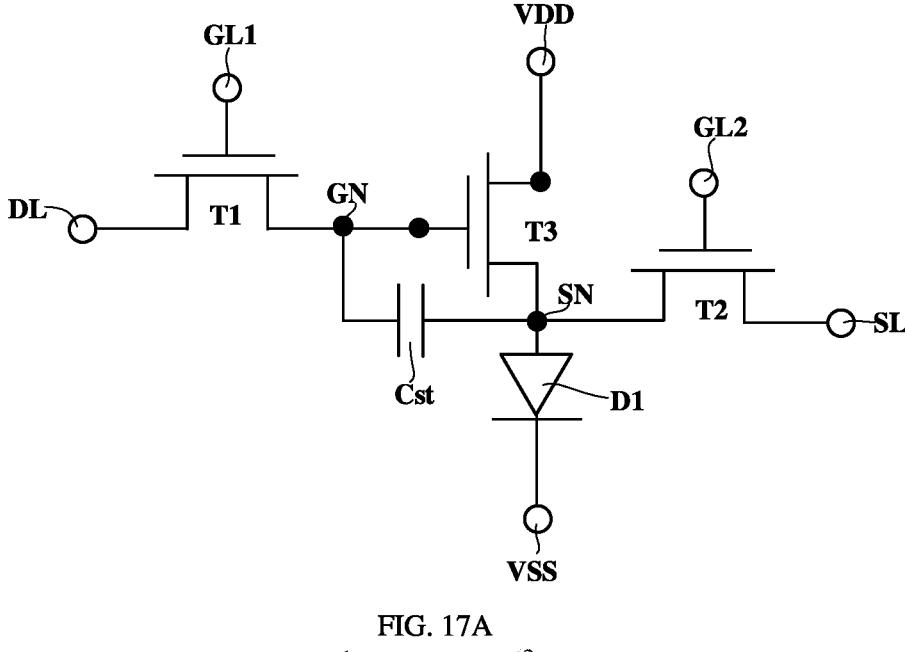
FIG. 17A is an equivalent circuit diagram of a pixel driving circuit according to some embodiments of the present disclosure.

FIG. 17A is an equivalent circuit diagram of a pixel driving circuit according to some embodiments of the present disclosure. Referring to FIG. 17A, in some specific embodiments, the pixel driving circuit includes a first transistor T1, a second transistor T2, a third transistor T3, a storage capacitor Cst, and other elements.

For example, the first transistor T1 may also be referred to as a first switching transistor, the second transistor T2 may also be referred to as a second switching transistor, and the third transistor T3 may also be referred to as a driving transistor. The pixel driving circuit may be referred to as a 3T1C structure.

A gate electrode G1 of the first transistor T1 is electrically connected to the first gate line GL1, a first electrode of the first transistor T1 is electrically connected to the data signal line DL, and a second electrode of the first transistor T1 is electrically connected to a gate electrode of the third transistor T3. For example, the second electrode of the first transistor T1 and the gate electrode G3 of the third transistor T3 may be electrically connected to a node GN. The first transistor T1 is used to control writing of a voltage signal from the data signal line DL to the pixel driving circuit.

A first electrode of the third transistor T3 is electrically connected to a first voltage line (e.g., a voltage line for providing a high voltage level signal VDD), and a second electrode of the third transistor T3 may be connected to the anode 701 of the light emitting element D1, so that a driving current may be generated according to a voltage signal to drive the light emitting element D1 to emit light. For example, the light emitting element D1 may be an organic light emitting diode (OLED).

Two ends of the storage capacitor Cst are connected between the gate electrode G3 and a source electrode of the third transistor T3, so as to store a voltage signal input from the data signal line DL. For example, one end of the storage capacitor Cst is electrically connected to the node GN, and the other end of the storage capacitor Cst is electrically connected to a node SN. That is, one end of the storage capacitor Cst, the second electrode of the first transistor T1 and the gate electrode G3 of the third transistor T3 are all electrically connected to the node GN, and the other end of the storage capacitor Cst, the second electrode of the third transistor T3 and the anode 701 of the light emitting element D1 are all electrically connected to the node SN.

A gate electrode G2 of the second transistor T2 is electrically connected to the second gate line GL2, a first electrode of the second transistor T2 is electrically connected to the sensing signal line SL, and a second electrode of the second transistor T2 is electrically connected to the node SN.

The anode 701 of the light emitting element D1 is electrically connected to the node SN and the cathode 801 of the light emitting element D1 is electrically connected to a second voltage line (e.g., a voltage line for providing a second voltage signal VSS). The first voltage signal VDD and the second voltage signal VSS are both DC voltage signals, which are used to provide required voltages for driving the light emitting element D1 to emit light. For example, the first voltage signal VDD may be a high voltage level signal, and the second voltage signal VSS may be a low voltage level signal.

It should be noted that herein, the first electrode of the transistor may refer to one of a source electrode and a drain electrode of the transistor, and the second electrode of the transistor may refer to the other one of the source electrode and the drain electrode of the transistor.

Figure 17B:
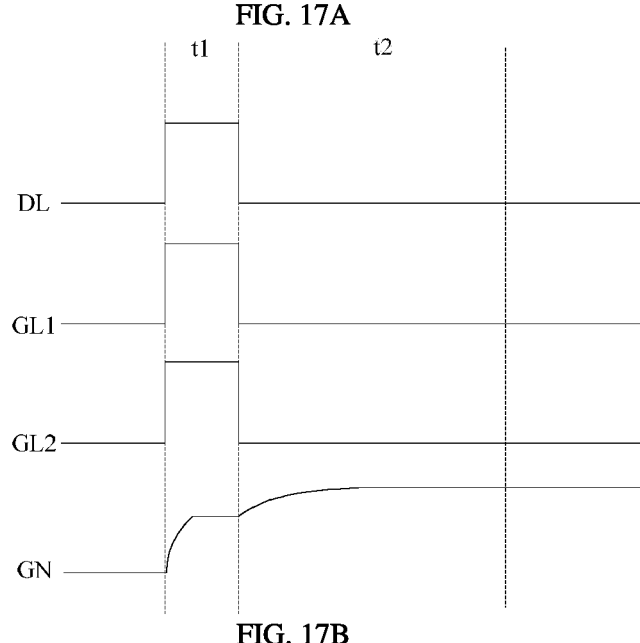
FIG. 17B is a timing diagram of a pixel driving circuit according to some embodiments of the present disclosure.

FIG. 17B is a timing diagram of the pixel driving circuit according to some embodiments of the present disclosure. Referring to FIG. 17B, a working process of the pixel driving circuit includes at least a data writing stage t1 and a light emitting stage t2.

In the data writing stage t1, an active level signal is provided to the first gate line GL1 and the second gate line GL2, and the first transistor T1 and the second transistor T2 are turned on. A data signal on the data signal line DL is transmitted to the gate electrode G3 of the third transistor T3 through the first transistor T1 and is stored in the storage capacitor Cst. An electrical signal on the sensing signal line SL is transmitted to the second electrode of the third transistor T3 through the second transistor T2. The electrical signal may be used to initialize the node SN, or may also be used to detect an electrical signal on the node SN. The detected electrical signal may be used to adjust a size of the electrical signal provided to the third transistor T3, so as to perform a compensation operation such as an external compensation.

In the light emitting stage t2, the third transistor T3 is turned on when a gate-source voltage reaches a turn-on condition. The third transistor T3 generates a driving current I according to the gate-source voltage, and the driving current I flows to the light emitting element D1 to drive the light emitting element D1 to emit light. In this stage, due to a bootstrap effect of the storage capacitor Cst, a gate voltage Vg of the third transistor T3 increases, so that the third transistor T3 is fully turned on, thereby continuously and stably generating the driving current I to drive the light emitting element D1 to emit light.

It should be noted that the 3T1C structure is illustrated here by way of example to describe the pixel driving circuit included in the display substrate according to the embodiments of the present disclosure. However, the pixel driving circuit included in the display substrate in the embodiments of the present disclosure is not limited to the 3T1C structure.

Figure 18:
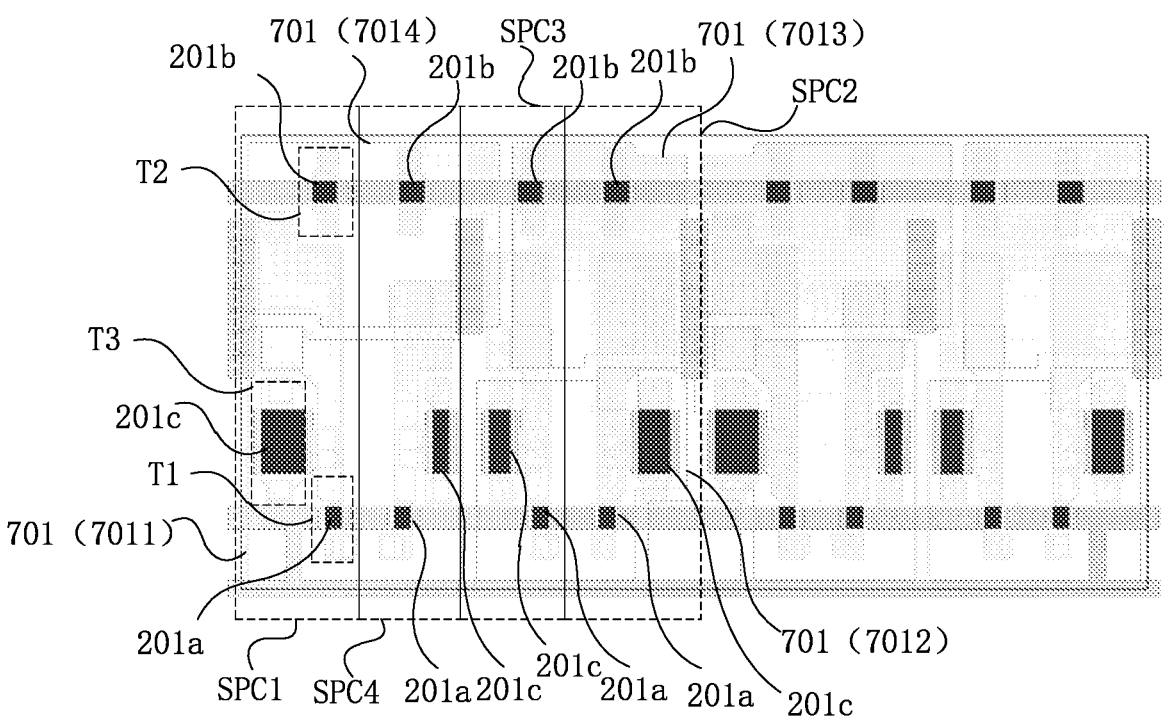
FIG. 18 and FIG. 19 are schematic diagrams of shielding a channel region by an anode according to some embodiments of the present disclosure.
Figure 19:
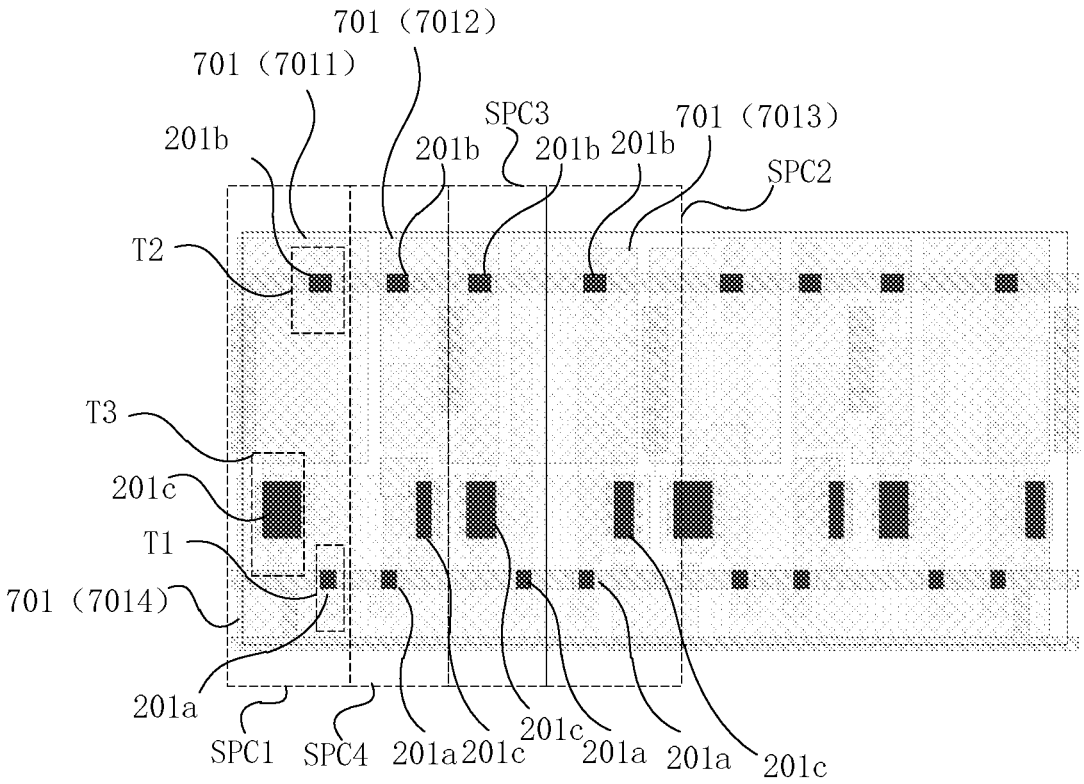

FIG. 18 and FIG. 19 are schematic diagrams of shielding a channel region by an anode according to some embodiments of the present disclosure. Referring to FIG. 17A, FIG. 18 and FIG. 19, the first transistor T1 includes a first channel region 201a located in the semiconductor film layer 20, the second transistor T2 includes a second channel region 201b located in the semiconductor film layer 20, and the third transistor T3 includes a third channel region 201c located in the semiconductor film layer 20. Each of an orthographic projection of the first channel region 201a on the base substrate 100, an orthographic projection of the second channel region 201b on the base substrate 100 and an orthographic projection of the third channel region 201c on the base substrate 100 falls within orthographic projections of the plurality of anodes 701 on the base substrate 100.

Referring to FIG. 6 to FIG. 9, FIG. 17A, FIG. 18 and FIG. 19, each transistor may include an active layer, a gate electrode, a first electrode, and a second electrode. For example, the first transistor T1 includes a first gate electrode G1 and a first active layer 20a; the second transistor T2 includes a second gate electrode G2 and a second active layer 20b; the third transistor T3 includes a third gate electrode G3 and a third active layer 20c. The first active layer 20a, the second active layer 20b and the third active layer 20c are all located in the semiconductor film layer 20. A part of the first active layer 20a directly facing the first gate electrode G1 is the first channel region 201a, a part of the second active layer 20b directly facing the second gate electrode G2 is the second channel region 201b, and a part of the third active layer 20c directly facing the third gate electrode G3 is the third channel region 201c.

In the embodiments of the present disclosure, the first channel region 201a, the second channel region 201b and the third channel region 201c are sensitive to light. In a case of a light irradiation, an electrical property of the transistor may be affected. For example, a current leakage and other issues may occur. As each of the orthographic projection of the first channel region 201a on the base substrate 100, the orthographic projection of the second channel region 201b on the base substrate 100 and the orthographic projection of the third channel region 201c on the base substrate 100 falls within the orthographic projections of the plurality of anodes 701 on the base substrate 100, the plurality of anodes 701 may shield each of the first channel region 201a, the second channel region 201b and the third channel region 201c, so as to prevent problems caused by light irradiation.

Various film layers of the pixel circuit in the embodiments of the present disclosure will be described below. Unless otherwise specified, structures of the various film layers may be applied to each sub-pixel, and is not particularly limited as a structure of a certain sub-pixel.

Referring to FIG. 5 to FIG. 7, the display substrate may include a first shielding portion SHL1, a first conductive portion 101 and a second conductive portion 102 that are located in the first conductive film layer 10. For example, the first conductive film layer 10 may be made of a metal material, such as silver, copper, aluminum, molybdenum, etc., or an alloy material of the above-mentioned metals, such as aluminum-niobium alloy, molybdenum-niobium alloy, etc., or may be a multi-layer metal, such as Mo/Cu/ Mo, etc., or may be a stack structure formed by metal and a transparent conductive material, such as ITO/Ag/ITO, etc. The first shielding portion SHL1, the first conductive portion 101 and the second conductive portion 102 are spaced apart from each other. An area of an orthographic projection of the first shielding portion SHL1 on the base substrate 100 is larger than each of an area of an orthographic projection of the first conductive portion 101 on the base substrate 100 and an area of an orthographic projection of the second conductive portion 102 on the base substrate 100. The first shielding portion SHL1 may also form an electrode of the storage capacitor Cst. Therefore, the first shielding portion SHL1 may be referred to as a first capacitor portion herein.

The first transistor T1, the second transistor T2 and the third transistor T3 may be formed along the semiconductor film layer 20 as shown in FIG. 6. The semiconductor film layer 20 may have a curved or bending shape, and may include the first active layer 20a corresponding to the first transistor T1, the second active layer 20b corresponding to the second transistor T2, and the third active layer 20c corresponding to the third transistor T3.

The semiconductor film layer 20 may contain a material such as amorphous silicon, polycrystalline silicon or oxide semiconductor, and may include, for example, a channel region, a source region and a drain region. The channel region may not be doped, or may have a doping type different from that of the source region and the drain region, and may therefore have a semiconductor property. The source region and the drain region are located on two opposite sides of the channel region respectively, and are doped with impurities, and therefore have conductivity. The impurities may vary depending on whether the TFT is an N-type transistor or a P-type transistor. For example, in the embodiments of the present disclosure, each transistor may be an N-type thin film transistor.

The first transistor T1 includes the first active layer 20a. The first active layer 20a includes a first source region 203a, a first drain region 205a, and a first channel region 201a connecting the first source region 203a and the first drain region 205a. The first source region 203a and the first drain region 205a extend in two opposite directions with respect to the first channel region 201a.

The second transistor T2 includes the second active layer 20b. The second active layer 20b includes a second source region 203b, a second drain region 205b, and a second channel region 201b connecting the second source region 203b and the second drain region 205b. The second source region 203b and the second drain region 205b extend in two opposite directions with respect to the second channel region 201b.

The third transistor T3 includes the third active layer 20c. The third active layer 20c includes a third source region 203c, a third drain region 205c, and a third channel region 201c connecting the third source region 203c and the third drain region 205c. The third source region 203c and the third drain region 205c extend in two opposite directions with respect to the third channel region 201c.

The display substrate may further include a second capacitor portion 210 located in the semiconductor film layer 20. For example, the second capacitor portion 210 and the first active layer 20a may be a continuously extending part, that is, a combination of the two forms a whole structure. The second active layer 20b, the third active layer 20c and a combination of the second capacitor portion 210 and the first active layer 20a, are spaced apart from each other.

Referring to FIG. 7, an orthographic projection of the second capacitor portion 210 on the base substrate 100 overlaps at least partially with an orthographic projection of the first shielding portion SHL1 on the base substrate 100. The first shielding portion SHL1 may serve as a electrode of the storage capacitor Cst, and the second capacitor portion 210 may serve as the other electrode of the storage capacitor Cst.

An orthographic projection of the third active layer 20c on the base substrate 100 overlaps at least partially with the orthographic projection of the first shielding portion SHL1 on the base substrate 100. The first shielding portion SHL1 may shield an influence of external factors on the third active layer 20c. In the embodiments of the present disclosure, the third transistor T3 serves as a driving transistor, and a performance of the third transistor T3 may be kept stable through a shielding effect of the first shielding portion SHL1.

Referring to FIG. 8 and FIG. 9 in combination, the display substrate may include the first gate line GL1, the second gate line GL2, the third gate electrode G3, a first auxiliary wire ALL a second auxiliary wire AL2 and a third auxiliary wire AL3 that are located in the second conductive film layer 30. The second conductive film layer 30 may be formed of a gate material. For example, the gate material may contain a metal material, such as Mo, Al, Cu and other metals and their alloys. The first gate line GL1, the second gate line GL2, the third gate G3, the first auxiliary wire ALL the second auxiliary wire AL2 and the third auxiliary wire AL3 are spaced apart from each other.

A part of the first gate line GL1 overlapping with the first active layer 20a of the first transistor T2 forms the first gate electrode G1 of the first transistor T1. A part of the second gate line GL2 overlapping with the second active layer 20b of the second transistor T2 forms the second gate electrode G2 of the second transistor T2. A part of the third gate electrode G3 overlapping with the third active layer 20c of the third transistor T3 forms the third gate electrode of the third transistor T3.

Referring to FIG. 8 and FIG. 9 in combination, at least one first gate line GL1 includes a first gate sub-line GL11, a second gate sub-line GL12, and a plurality of connecting wires GL13 and GL14. The first gate sub-line GL11 and the second gate sub-line GL12 extend in the first direction X, and the plurality of connecting wires GL13 and GL14 extend in the second direction Y. The first gate sub-line GL11 and the second gate sub-line GL12 are spaced apart in the second direction Y, and the plurality of connecting wires GL13 and GL14 are spaced apart in the first direction X. The plurality of connecting wires GL13 and GL14 connect the first gate sub-line GL11 and the second gate sub-line GL12.

Referring to FIG. 10 to FIG. 13, the display substrate may include the data signal line DL, the first voltage line VDDL, the sensing signal line SL, the auxiliary cathode line AVL, a first conductive connecting portion 401, a second conductive connecting portion 402, a third conductive connecting portion 403, a fourth conductive connecting portion 404 and a third capacitor portion 405 that are located in the third conductive film layer 40.

Referring to FIG. 19, in some specific embodiments, for at least one pixel unit PX, when the first sub-pixel SP1, the second sub-pixel SP2 and the third sub-pixel SP3 are located in a former row and the fourth sub-pixel SP4 is located in a latter row, the anode 701 may shield the first channel region 201*a* in the following manners.

For one and same pixel unit PX, each of an orthographic projection of the first channel region 201*a* of the first transistor T1 of the pixel driving circuit of the first sub-pixel SP1 on the base substrate, an orthographic projection of the first channel region 201*a* of the first transistor T1 of the pixel driving circuit of the second sub-pixel SP2 on the base substrate 100, an orthographic projection of the first channel region 201*a* of the first transistor T1 of the pixel driving circuit of the third sub-pixel SP3 on the base substrate 100, and an orthographic projection of the first channel region 201*a* of the first transistor T1 of the pixel driving circuit of the fourth sub-pixel SP4 on the base substrate 100 falls within the orthographic projection of the anode 701 (7014) of the fourth sub-pixel SP4 on the base substrate 100. In this way, the first channel regions 201*a* of all the first transistors T1 in the pixel unit PX may be shielded by the anode 701 (7014) of the fourth sub-pixel.

In some specific embodiments, the anode 701 may shield the third channel region 201*c* in the following manners.

For one and same pixel unit PX, each of an orthographic projection of the third channel region 201*c* of the third transistor of the pixel driving circuit of the first sub-pixel on the base substrate 100, an orthographic projection of the third channel region 201*c* of the third transistor of the pixel driving circuit of the second sub-pixel on the base substrate 100, an orthographic projection of the third channel region 201*c* of the third transistor of the pixel driving circuit of the third sub-pixel on the base substrate 100, and an orthographic projection of the third channel region 201*c* of the third transistor of the pixel driving circuit of the fourth sub-pixel on the base substrate 100 falls within the orthographic projection of the anode 701 (7014) of the fourth sub-pixel on the base substrate 100. In this way, the first channel regions 201*a* of all the first transistors T1 in the pixel unit PX may be shielded by the anode 701 (7014) of the fourth sub-pixel, and the third channel regions 201*c* of all the third transistors T3 in the pixel unit PX may be shielded by the anode 701 (7014) of the fourth sub-pixel.

In some specific embodiments, the anode 701 may shield the channel region of each transistor in the first sub-pixel SP1 in the following manners.

For one and same pixel unit PX, the orthographic projection of the first channel region 201*a* of the first transistor T1 of the pixel driving circuit of the first sub-pixel SP1 on the base substrate 100 falls within the orthographic projection of the anode 701 (7014) of the fourth sub-pixel SP4 on the base substrate 100. The orthographic projection of the second channel region 201*b* of the second transistor T2 in the pixel driving circuit of the first sub-pixel SP1 on the base substrate 100 falls within the orthographic projection of the anode 701 (7011) of the first sub-pixel SP1 on the base substrate 100. The orthographic projection of the third channel region 201*c* of the third transistor T3 in the pixel driving circuit of the first sub-pixel SP1 on the base substrate 100 falls within the orthographic projection of the anode 701 (7014) of the fourth sub-pixel SP4 on the base substrate 100.

In this way, the first channel region 201*a* of the first transistor T1 of the first sub-pixel SP1 and the third channel region 201*c* of the third transistor T3 of the first sub-pixel SP1 may be shielded by the anode 701 (7014) of the fourth sub-pixel SP4, and the second channel region 201*b* of the second transistor T2 of the first sub-pixel SP1 may be shielded by the anode 701 (7011) of the first sub-pixel SP1 itself.

In some specific embodiments, the anode 701 may shield the channel region of each transistor in the second sub-pixel SP2 in the following manners.

For one and same pixel unit PX, the orthographic projection of the first channel region 201*a* of the first transistor T1 of the pixel driving circuit of the second sub-pixel SP2 on the base substrate 100 falls within the orthographic projection of the anode 701 (7014) of the fourth sub-pixel SP4 on the base substrate 100. The orthographic projection of the second channel region 201*b* of the second transistor T2 of the pixel driving circuit of the second sub-pixel SP2 on the base substrate 100 falls within the orthographic projection of the anode 701 (7012) of the second sub-pixel SP2 on the base substrate 100. The orthographic projection of the third channel region 201*c* of the third transistor T3 of the pixel driving circuit of the second sub-pixel SP2 on the base substrate 100 falls within the orthographic projection of the anode 701 (7014) of the fourth sub-pixel SP4 on the base substrate 100.

In this way, the first channel region 201*a* of the first transistor T1 of the second sub-pixel SP2 and the third channel region 201*c* of the third transistor T3 of the second sub-pixel SP2 may be shielded by the anode 701 (7014) of the fourth sub-pixel SP4, and the second channel region 201*b* of the second transistor T2 of the second sub-pixel SP2 may be shielded by the anode 701 (7012) of the second sub-pixel SP2 itself.

In some specific embodiments, the anode 701 may shield the channel region of each transistor in the third sub-pixel SP3 in the following manners.

For one and same pixel unit PX, the orthographic projection of the first channel region 201*a* of the first transistor T1 of the pixel driving circuit of the third sub-pixel SP3 on the base substrate 100 falls within the orthographic projection of the anode 701 (7014) of the fourth sub-pixel SP4 on the base substrate 100. The orthographic projection of the second channel region 201*b* of the second transistor T2 of the pixel driving circuit of the third sub-pixel SP3 on the base substrate 100 falls within the orthographic projection of the anode 701 (7013) of the third sub-pixel SP3 on the base substrate 100. The orthographic projection of the third channel region 201*c* of the third transistor T3 of the pixel driving circuit of the third sub-pixel SP3 on the base substrate 100 falls within the orthographic projection of the anode 701 (7014) of the fourth sub-pixel SP4 on the base substrate 100.

In this way, the first channel region 201*a* of the first transistor T1 of the third sub-pixel SP3 and the third channel region 201*c* of the third transistor of the third sub-pixel SP3 may be shielded by the anode 701 (7014) of the fourth sub-pixel SP4, and the second channel region 201*b* of the second transistor T2 of the third sub-pixel SP3 may be shielded by the anode 701 (7013) of the third sub-pixel SP3 itself.

In some specific embodiments, the anode 701 may shield the channel region of each transistor in the fourth sub-pixel SP4 in the following manners.

For one and same pixel unit PX, the orthographic projection of the first channel region 201*a* of the first transistor T1 of the pixel driving circuit of the fourth sub-pixel SP4 on the base substrate 100 falls within the orthographic projection of the anode 701 (7014) of the fourth sub-pixel SP4 on the base substrate 100. The orthographic projection of the second channel region 201b of the second transistor T2 of the pixel driving circuit of the fourth sub-pixel SP4 on the base substrate 100 falls within the orthographic projection of the anode 701 (7012) of the second sub-pixel SP2 on the base substrate 100. The orthographic projection of the third channel region 201c of the third transistor T3 of the pixel driving circuit of the fourth sub-pixel SP4 on the base substrate 100 falls within the orthographic projection of the anode 701 (7014) of the fourth sub-pixel SP4 on the base substrate 100.

In this way, the first channel region 201a of the first transistor T1 and the third channel region 201c of the third transistor T3 of the fourth sub-pixel SP4 may be shielded by the anode 701 (7014) of the fourth sub-pixel SP4 itself, and the second channel region 201b of the second transistor T2 of the fourth sub-pixel SP4 may be shielded by the anode 701 (7012) of the second sub-pixel SP2.

Referring to FIG. 18, in some specific embodiments, for at least one pixel unit PX, the pixel unit PX includes two rows of sub-pixels. The first sub-pixel SP1 is located at the lower left corner, the second sub-pixel SP2 is located at the lower right corner, the third sub-pixel SP3 is located at the upper right corner, and the fourth sub-pixel SP4 is located at the upper left corner. The anode 701 may shield each channel region in the following manners.

In some specific embodiments, for one and same pixel unit PX, the orthographic projection of the first channel region 201a of the first transistor T1 of the pixel driving circuit of the first sub-pixel SP1 on the base substrate 100 falls within the orthographic projection of the anode 701 (7011) of the first sub-pixel SP1 on the base substrate 100. The orthographic projection of the second channel region 201b of the second transistor T2 of the pixel driving circuit of the first sub-pixel SP1 on the base substrate 100 falls within the orthographic projection of the anode 701 (7014) of the fourth sub-pixel SP4 on the base substrate 100. The orthographic projection of the third channel region 201c of the third transistor T3 of the pixel driving circuit of the first sub-pixel SP1 on the base substrate 100 falls within the orthographic projection of the anode 701 (7011) of the first sub-pixel SP1 on the base substrate 100.

In this way, the first channel region 201a of the first transistor T1 and the third channel region 201c of the third transistor T3 of the first sub-pixel SP1 may be shielded by the anode 701 (7011) of the first sub-pixel SP1 itself, and the second channel region 201b of the second transistor T2 of the first sub-pixel SP1 may be shielded by the anode 701 (7014) of the fourth sub-pixel SP4.

For one and same pixel unit PX, the orthographic projection of the first channel region 201a of the first transistor T1 of the pixel driving circuit of the second sub-pixel SP2 on the base substrate 100 falls within the orthographic projection of the anode 701 (7012) of the second sub-pixel SP2 on the base substrate 100. The orthographic projection of the second channel region 201b of the second transistor T2 of the pixel driving circuit of the second sub-pixel SP2 on the base substrate 100 falls within the orthographic projection of the anode 701 (7013) of the third sub-pixel SP3 on the base substrate 100. The orthographic projection of the third channel region 201c of the third transistor T3 of the pixel driving circuit of the second sub-pixel SP2 on the base substrate 100 falls within the orthographic projection of the anode 701 (7012) of the second sub-pixel SP2 on the base substrate 100.

In this way, the first channel region 201a of the first transistor T1 and the third channel region 201c of the third transistor T3 of the second sub-pixel may be shielded by the anode 701 (7012) of the second sub-pixel SP2 itself, and the second channel region 201b of the second transistor T2 of the second sub-pixel SP2 may be shielded by the anode 701 (7013) of the third sub-pixel SP3.

For one and same pixel unit PX, the orthographic projection of the first channel region 201a of the first transistor T1 of the pixel driving circuit of the third sub-pixel SP3 on the base substrate 100 falls within the orthographic projection of the anode 701 (7012) of the second sub-pixel SP2 on the base substrate 100. The orthographic projection of the second channel region 201b of the second transistor T2 of the pixel driving circuit of the third sub-pixel SP3 on the base substrate 100 falls within the orthographic projection of the anode 701 (7013) of the third sub-pixel SP3 on the base substrate 100. The orthographic projection of the third channel region 201c of the third transistor T3 of the pixel driving circuit of the third sub-pixel SP3 on the base substrate 100 falls within the orthographic projection of the anode 701 (7012) of the second sub-pixel SP2 on the base substrate 100.

In this way, the first channel region 201a of the third sub-pixel SP3 and the third channel region 201c of the third transistor T3 of the third sub-pixel SP3 may be shielded by the anode 701 (7012) of the second sub-pixel SP2, and the second channel region 201b of the second transistor T2 of the second transistor SP2 may be shielded by the anode 701 (7013) of the third sub-pixel SP3 itself.

For one and same pixel unit PX, the orthographic projection of the first channel region 201a of the first transistor T1 of the pixel driving circuit of the fourth sub-pixel SP4 on the base substrate 100 falls within the orthographic projection of the anode 701 (7011) of the first sub-pixel SP1 on the base substrate 100. The orthographic projection of the second channel region 201b of the second transistor T2 of the pixel driving circuit of the fourth sub-pixel SP4 on the base substrate 100 falls within the orthographic projection of the anode 701 (7014) of the fourth sub-pixel SP4 on the base substrate 100. The orthographic projection of the third channel region 201c of the third transistor T3 of the pixel driving circuit of the fourth sub-pixel SP4 on the base substrate 100 falls within the orthographic projection of the anode 701 (7011) of the first sub-pixel SP1 on the base substrate 100.

In this way, the first channel region 201a of the first transistor T1 of the fourth sub-pixel SP4 and the third channel region 201c of the third transistor T3 of the fourth sub-pixel SP4 may be shielded by the anode 701 (7011) of the first sub-pixel SP1, and the second channel region 201b of the second transistor T2 of the fourth sub-pixel SP4 may be shielded by the anode 701 (7014) of the fourth sub-pixel SP4 itself.

It should be understood that the display substrate may further include a plurality of insulation film layers located between any adjacent two of the base substrate 100, the first conductive film layer 10, the semiconductor film layer 20, the second conductive film layer 30, the third conductive film layer 40 and a fourth conductive film layer 50. These insulation layers will be described below with reference to cross-sectional views. A via hole or groove may be formed in the insulation layer to expose at least part of one of the first conductive film layer 10, the semiconductor film layer 20, the second conductive film layer 30 and the third conductive film layer 40, so as to achieve an electrical connection between components located in different film layers.

Referring to FIG. 5 to FIG. 16 in combination, the display substrate may include a buffer layer 12 arranged on a side of the first conductive film layer 10 away from the base substrate 100, a gate insulation film layer 22 arranged on a side of the semiconductor film layer 20 away from the base substrate 100, a first insulation film layer (such as interlayer dielectric layer) 32 arranged on a side of the second conductive film layer 30 away from the base substrate 100, a second insulation film layer 42 arranged on a side of the third conductive film layer 40 away from the base substrate 100, and a pixel definition layer 702 arranged on a side of the first electrode layer ANL away from the base substrate 100.

It should be noted that each of the above-mentioned insulation film layers may have a single-layer structure or a stack structure formed by a plurality of insulation film layers. For example, the second insulation film layer 42 may include two passivation layers, or include one passivation layer and one planarization layer.

For example, the pixel definition layer 702 may include the first opening SPA1, the second opening SPA2, the third opening SPA3, and the fourth opening SPA4. The display substrate may further include: a light emitting material layer EL arranged on a side of the pixel definition layer 702 away from the base substrate 100 and located in the first opening SPA1, the second opening SPA2, the third opening SPA3 and the fourth opening SPA4; and a second electrode layer arranged on a side of the light emitting material layer EL away from the base substrate 100. For example, the second electrode layer may include a cathode 801 of the light emitting element. For example, the second electrode layer may contain a transparent conductive material, so as to allow light reflected by the anode of the light emitting element to pass through.

Figure 20:
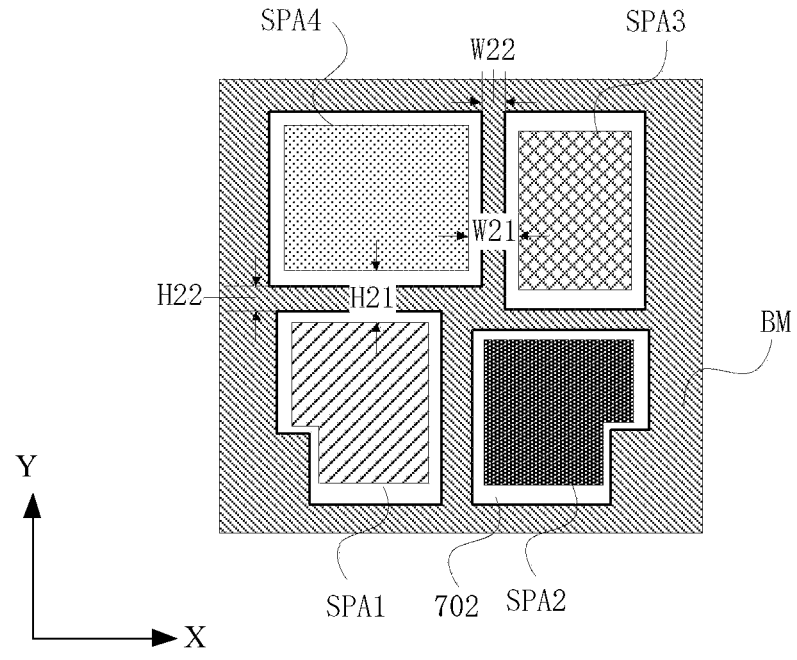
FIG. 20 is a schematic plan view of a pixel definition layer and a black matrix according to some embodiments of the present disclosure.

FIG. 20 is a schematic plan view of a pixel definition layer and a black matrix according to some embodiments of the present disclosure. Referring to FIG. 20, in some specific embodiments, the display substrate further includes a black matrix BM on a side of the pixel definition layer 702 away from the base substrate 100. In a region between at least two adjacent openings, a width W21 of the pixel definition layer 702 in the first direction X is greater than a width W22 of the black matrix BM in the first direction X, and/or a height H21 of pixel definition layer 702 in the second direction Y is greater than a height H22 of the black matrix BM in the second direction Y.

In the embodiments of the present disclosure, in the region between two adjacent openings, the pixel definition layer 702 has a fifth boundary and a sixth boundary opposite to each other in the first direction X, and the pixel definition layer 702 has a seventh boundary and an eighth boundary opposite to each other in the second direction Y. The height of the pixel definition layer 702 in the second direction X may refer to a distance between the seventh boundary and the eighth boundary. In this way, the black matrix BM may achieve a normal shielding function while an opening rate of sub-pixels may be maximized, thereby improving the display effect.

Referring to FIG. 5 to FIG. 16 in combination, the display substrate may further include a first via hole VH1, a second via hole VH2, a third via hole VH3, a fourth via hole VH4, a fifth via hole VH5, a sixth via hole VH6, a seventh via hole VH7, an eighth via hole VH8, a ninth via hole VH9, a tenth via hole VH10, an eleventh via hole VH11, a twelfth via hole VH12, and a thirteenth via hole VH13.

It should be noted that herein, the expression "via hole" should be understood as a structure for electrically connecting components in at least two different conductive film layers. For example, a via hole in an insulation film layer exposes at least part of a component in a conductive film layer below the insulation film layer. When a conductive film layer is formed above the insulation film layer, a conductive structure (e.g., a conductive plug) may be formed in the via hole in the insulation film layer, and the via hole (including the conductive plug) in the insulation film layer may electrically connect a component in the conductive film layer above the insulation film layer with the component in the conductive film layer below the insulation film layer. In addition, the expression "via hole" may include various forms, including but not limited to a through hole, a groove, an opening, and so on.

For example, the first via hole VH1 exposes at least part of the third source region 203c of the third transistor T3. The first voltage line VDDL has a first protruding portion. An orthographic projection of the first protruding portion of the first voltage line VDDL on the base substrate 100, an orthographic projection of the first via hole VH1 on the base substrate 100 and an orthographic projection of the third source region 203c on the base substrate 100 overlap at least partially with each other. In this way, the first voltage line VDDL is electrically connected to the first electrode (e.g., the source electrode) of the third transistor T3 through the first via hole VH1. In this way, the first voltage signal VDD may be provided to the first electrode (e.g., the source electrode) of the third transistor T3 of at least one sub-pixel.

For example, in at least one pixel unit group, the third active layer 20c of the pixel driving circuit of the first sub-pixel SP1 of the first pixel unit PX1 is electrically connected to the first voltage line VDDL through the first via hole VH1, and the third active layer 20c of the pixel driving circuit of the second sub-pixel SP2 of the second pixel unit PX2 is electrically connected to the first voltage line VDDL through the first via hole VH1.

The second via hole VH2 exposes at least part of the first conductive portion 101. The first voltage line VDDL has a second protruding portion. An orthographic projection of the second protruding portion of the first voltage line VDDL on the base substrate 100, an orthographic projection of the second via hole VH2 on the base substrate 100 and an orthographic projection of the first conductive portion 101 on the base substrate 100 overlap at least partially with each other. In this way, the first voltage line VDDL is electrically connected to one end of the first conductive portion 101 through the second via hole VH2.

A plurality of third via holes VH3 expose at least parts of the first conductive portion 101, respectively. One ends of a plurality of first conductive connecting portions 401 are electrically connected to the first conductive portion 101 through the plurality of third via holes VH3, respectively. A plurality of fourth via holes VH4 expose at least parts of the third source regions 203c of the third transistors T3 of a plurality of sub-pixels, respectively. The other ends of the plurality of first conductive connecting portion 401 are electrically connected to the first electrodes (e.g., the source electrodes) of the third transistors T3 of a plurality of sub-pixels through the plurality of fourth via holes VH4 respectively. In this way, the first voltage signal VDD may be provided to the first electrodes (e.g., the source electrodes) of the third transistors T3 of at least some other sub-pixels.

In the embodiments of the present disclosure, in a pixel unit group, the first conductive connecting portions 401 are required to be arranged in regions where the pixel driving circuits of the fourth sub-pixel SP4, the third sub-pixel SP3 and the second sub-pixel SP2 of the first pixel unit PX1 are located, and a space between the first gate sub-line GL11 and the second gate sub-line GL12 is limited in the regions where the pixel driving circuits of the fourth sub-pixel SP4, the third sub-pixel SP3 and the second sub-pixel SP2 of the first pixel unit PX1 are located. Similarly, the first conductive connecting portions 401 are required to be arranged in regions where the pixel driving circuits of the first sub-pixel SP1, the fourth sub-pixel SP4 and the third sub-pixel SP3 of the second pixel unit PX2 are located, and a space between the first gate sub-line GL11 and the second gate sub-line GL12 is limited in the regions where the pixel driving circuits of the first sub-pixel SP1, the fourth sub-pixel SP4 and the third sub-pixel SP3 of the second pixel unit PX2 are located. In the embodiments of the present disclosure, in a pixel unit group, it is not required to provide the first conductive connecting portion 401 in a region where the pixel driving circuit of the first sub-pixel SP1 of the first pixel unit PX1 is located, and it is not required to provide the first conductive connecting portion 401 in a region where the pixel driving circuit of the second sub-pixel SP2 of the second pixel unit PX2 is located. In this way, the space between the first gate sub-line GL11 and the second gate sub-line GL12 is relatively large in regions where the pixel driving circuit of the first sub-pixel SP1 of the first pixel unit PX1 and the pixel driving circuit of the second sub-pixel SP2 of the second pixel unit PX2 are located, which is conducive for respective arrangements of the connecting wire GL13 and the connecting wire GL14.

A plurality of fifth via holes VH5 expose at least parts of the first source regions 203a of the first transistors T1 of a plurality of sub-pixels, respectively. An orthographic projection of the data signal line DL on the base substrate 100, an orthographic projection of the fifth via hole VH5 on the base substrate 100 and an orthographic projection of the first source region 203a on the base substrate 100 overlap at least partially with each other. In this way, the data signal lines DL of the various sub-pixels are electrically connected to the first electrodes (e.g., the source electrodes) of the respective first transistors T1 through the fifth via holes VH5, respectively. Then, the data signal may be provided to the first electrodes (e.g., the source electrodes) of the first transistors T1 of the sub-pixels.

In the first sub-pixel SP1 of the first pixel unit PX1, the orthographic projection of the second via hole VH2 on the base substrate 100 and the orthographic projection of the fifth via hole VH5 on the base substrate 100 are spaced apart by a first separation distance WD1 in the first direction X. In each of the second sub-pixel SP2, the third sub-pixel SP3 and the fourth sub-pixel SP4 of the first pixel unit PX1, an orthographic projection of the third via hole VH3 on the base substrate 100 and the orthographic projection of the fifth via hole VH5 on the base substrate 100 are spaced apart by a second separation distance WD2 in the first direction X. The first separation distance WD1 is greater than the second separation distance WD2.

In the second sub-pixel SP2 of the second pixel unit PX2, the orthographic projection of the second via hole VH2 on the base substrate 100 and the orthographic projection of the fifth via hole VH5 on the base substrate 100 are spaced apart by a third separation distance WD3 in the first direction X. In each of the first sub-pixel SP1, the third sub-pixel SP3 and the fourth sub-pixel SP4 of the second pixel unit PX2, the orthographic projection of the third via hole VH3 on the base substrate 100 and the orthographic projection of the fifth via hole VH5 on the base substrate 100 are spaced apart by a fourth separation distance WD4 in the first direction X. The third separation distance WD3 is greater than the fourth separation distance WD4.

The sixth via hole VH6 exposes at least part of the third gate electrode G3 of the third transistor T3 and at least part of the first drain region 205a of the first transistor T1. An orthographic projection of a part of the fourth conductive connecting portion 404 on the base substrate 100, an orthographic projection of a part of the sixth via hole VH6 on the base substrate 100 and an orthographic projection of a part of the third gate electrode G3 on the base substrate 100 overlap at least partially with each other. An orthographic projection of the other part of the fourth conductive connecting portion 404 on the base substrate 100, an orthographic projection of the other part of the sixth via hole VH6 on the base substrate 100 and an orthographic projection of a part of the first drain region 205a of the first transistor T1 on the base substrate 100 overlap at least partially with each other. In this way, the third gate electrode G3 of the third transistor T3 may be electrically connected to the second electrode (e.g., the drain electrode) of the first transistor T1 through the sixth via hole VH6.

The second conductive connecting portion 402 extends from the sensing signal line SL toward two opposite sides in the first direction X. That is, the second conductive connecting portion 402 and the sensing signal line SL form a continuously extending integral structure. The second conductive portion 102 extends in the first direction X. The third conductive connecting portion 403 and the second conductive connecting portion 402 are spaced apart in the first direction X. The third conductive connecting portion 402 is electrically connected to the second conductive portion 102 through the seventh via hole VH7, and the second conductive portion 102 is electrically connected to the second conductive connecting portion 402 through the eighth via hole VH8. The seventh via hole VH7 further exposes at least part of the second source region 203b of the second transistor T2. In this way, the sensing signal line SL may be electrically connected to the first electrodes (e.g., the source electrodes) of the second transistors T2 of the various sub-pixels of a pixel unit. In this way, the sensing signal may be provided to the first electrodes (e.g., the source electrodes) of the second transistors T2 of the various sub-pixels of the pixel unit.

The ninth via hole VH9 exposes at least part of the second drain region 205b of the second transistor T2. The tenth via hole VH10 exposes at least part of the third drain region 205c of the third transistor T3. An orthographic projection of the third capacitor portion 405 on the base substrate 100 overlaps at least partially with each of an orthographic projection of the ninth via hole VH9 on the base substrate 100 and an orthographic projection of the tenth via hole VH10 on the base substrate 100. In this way, the third capacitor portion 405, the second electrode (e.g., the drain electrode) of the second transistor T2 and the second electrode (e.g., the drain electrode) of the third transistor T3 form a connection at the node SN.

A plurality of eleventh via holes VH11 expose parts of one and same first auxiliary wire AL1, respectively. The first voltage line VDDL is electrically connected to the first auxiliary wire AL1 beneath through the plurality of eleventh via holes VH11. With such parallel wiring manner, an IR drop (i.e., a voltage drop caused by resistance) on the signal line for transmitting the first voltage signal may be reduced.

A plurality of twelfth via holes VH12 expose parts of one and same second auxiliary wire AL2, respectively. The sensing signal line SL is electrically connected to the second auxiliary wire AL2 beneath through the plurality of twelfth via holes VH12. With such parallel wiring manner, an IR drop (i.e., a voltage drop caused by resistance) on the signal line for transmitting the sensing signal may be reduced.

A plurality of thirteenth via holes VH13 expose parts of one and same third auxiliary wire AL3, respectively. The auxiliary cathode wire AVL is electrically connected to the third auxiliary wire AL3 through the plurality of thirteenth via holes VH13. With such parallel wiring manner, an IR drop (i.e., a voltage drop caused by resistance) on the signal line for transmitting the second voltage signal may be reduced.

The orthographic projection of the first conductive portion 101 on the base substrate 100 and an orthographic projection of the first gate sub-line GL11 on the base substrate 100 are spaced apart in the second direction Y. The orthographic projection of the first conductive portion 101 on the base substrate 100 and an orthographic projection of the second gate sub-line GL12 on the base substrate 100 are spaced apart in the second direction Y.

In the embodiments of the present disclosure, the first conductive portion 101 extends in the first direction X and is used to transmit the first voltage signal to the third transistors T3 of several sub-pixels other than those directly connected to the first voltage line VDDL, that is, the first conductive portion 101 is used to transmit the first voltage signal VDD. The first gate sub-line GL11 and the second gate sub-line GL12 also extend in the first direction X. Each of the first gate sub-line GL11 and the second gate sub-line GL12 does not overlap with the first conductive portion 101, so as to prevent the first voltage signal VDD transmitted on the first conductive portion 101 from affecting the first scan signal transmitted on the first gate sub-line GL11 and the second gate sub-line GL12, thus the performance of the first transistor T1 may be kept stable. In addition, the second gate sub-line GL12 is located in the second conductive film layer 30, and components provided by the second gate sub-line 12 in the second direction Y are mainly components located in the third conductive film layer 40, that is, no component is arranged in the second conductive film layer 30 around the second gate sub-line GL12. Therefore, at a position around the second gate sub-line GL12, a distance between conductive lines located in different conductive film layers may be designed to be relatively small, so that a space of the pixel driving circuit may be fully utilized.

In the embodiments of the present disclosure, an orthographic projection of the second gate line GL2 on the base substrate 100 overlaps partially with the orthographic projection of the first voltage line VDDL on the base substrate 100, the orthographic projection of the data signal line DL on the base substrate 100, the orthographic projection of the sensing signal line SL on the base substrate 100 and the orthographic projection of the auxiliary cathode line AVL on the base substrate 100, respectively, at a first position PP1, a second position PP2, a third position PP3 and a fourth position PP4.

Figure 21:
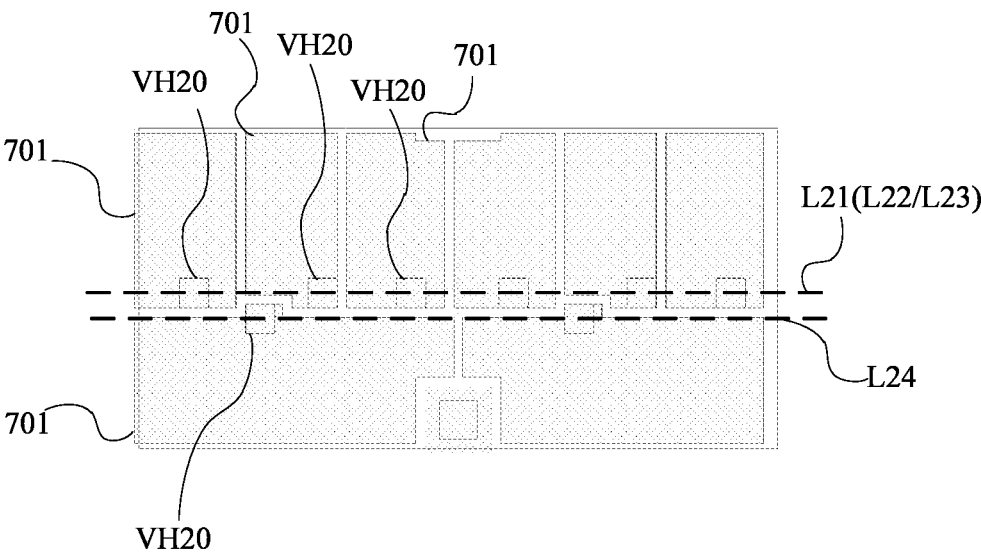
FIG. 21 and FIG. 22 are schematic plan views of an anode connection hole according to some embodiments of the present disclosure.
Figure 22:
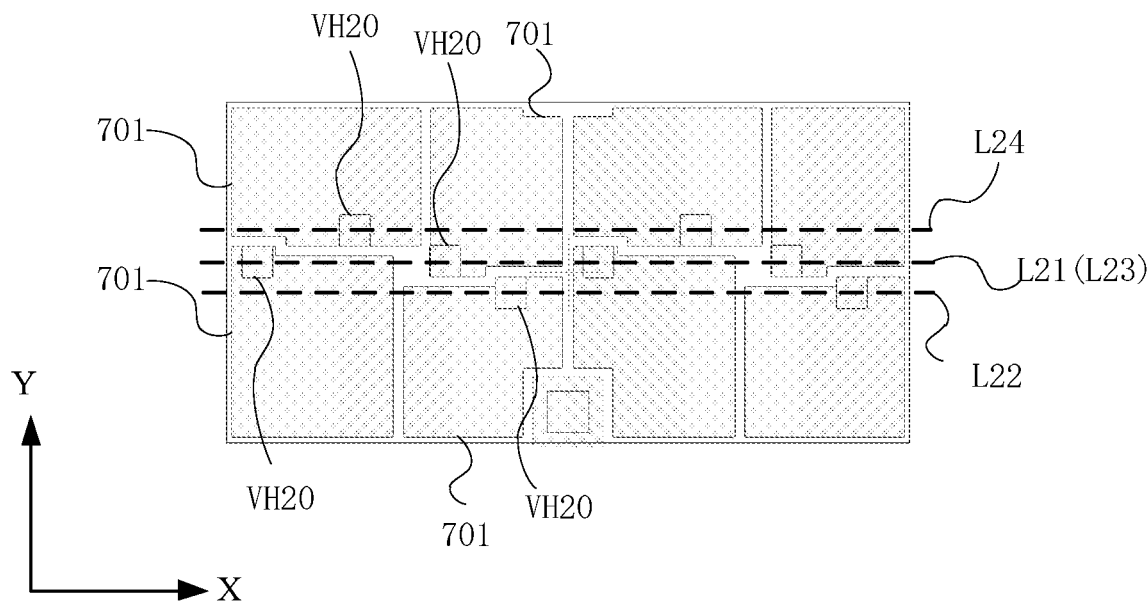

FIG. 21 and FIG. 22 are schematic plan views of an anode connection hole according to some embodiments of the present disclosure. Referring to FIG. 21 and FIG. 22 in combination, in some specific embodiments, the anode 701 of at least one sub-pixel is electrically connected to the pixel driving circuit of the sub-pixel through a corresponding anode connection hole VH20. For at least one pixel unit group, a first connecting line L21 of centers of the anode connection holes VH20 of the first sub-pixels SP1 is parallel to the first direction X, and/or a second connecting line L22 of centers of the anode connection holes VH20 of the second sub-pixels SP2 is parallel to the first direction X, and/or a third connecting line L23 of centers of the anode connection holes VH20 of the third sub-pixels SP3 is parallel to the first direction X. For at least one pixel unit group PX, a fourth connecting line L24 of centers of the anode connection holes VH20 of the fourth sub-pixels SP4 is parallel to the first direction X. Each of the first connecting line L21, the second connecting line L22 and the third connecting line L23 is spaced apart from the fourth connecting line L24 in the second direction Y.

In some specific embodiments, any two of the first connecting line L21, the second connecting line L22 and the third connecting line L23 substantially coincide with each other.

For example, referring to FIG. 21, for at least one pixel unit PX, the first sub-pixel SP1, the second sub-pixel SP2 and the third sub-pixel SP3 are located in the first row and the fourth sub-pixel SP4 is located in the second row, any two of the first connecting line L21, the second connecting line L22 and the third connecting line L23 may substantially coincide with each other, so that the anode connection hole VH20 of the first sub-pixel SP1, the anode connection hole VH20 of the second sub-pixel SP2 and the anode connection hole VH20 of the third sub-pixel SP3 are located on substantially the same horizontal line.

In some specific embodiments, the first connecting line L21 and the third connecting line L23 substantially coincide with each other, and the fourth connecting line L24 and the second connecting line L22 are located on two sides of the first connecting line L21 in the second direction Y.

For example, referring to FIG. 22, for at least one pixel unit PX, the first sub-pixel SP1 is located at the lower left corner, the second sub-pixel SP2 is located at the lower right corner, the third sub-pixel SP3 is located at the upper right corner, and the fourth sub-pixel SP4 is located at the upper left corner, the first connecting line L21 and the third connecting line L23 may substantially coincide with each other, and the fourth connecting line L24 and the second connecting line L22 may be located on two sides of the first connecting line L21 in the second direction Y. For example, the fourth connecting line L24 may be located on an upper side of the first connecting line L21, and the second connecting line L22 may be located on a lower side of the first connecting line L21.

The embodiments of the present disclosure further provide a display device, and the display device may include the display substrate as described above. The display device may include but not be limited to: an electronic paper, a mobile phone, a tablet a computer, a television, a display, a notebook computer, a digital photo frame, a navigator, and any other products or components having a display function. It should be understood that the display device has the same beneficial effects as the display substrate provided in the foregoing embodiments.

Although some embodiments according to the general concept of the present disclosure have been illustrated and described, it should be understood by those ordinary skilled in the art that modifications may be made to those embodiments without departing from the principle and spirit of the general inventive concept of the present disclosure. The scope of the present disclosure is defined by the claims and their equivalents.

What is claimed is:

1. A display substrate, comprising:

a base substrate;

a plurality of pixel units on the base substrate, wherein the plurality of pixel units are arranged in an array in a first direction and a second direction to form a plurality of rows of pixel units and a plurality of columns of pixel units, the pixel unit comprises a plurality of sub-pixels, the sub-pixel comprises a light emitting element and a pixel driving circuit configured to drive the light emitting element, and the plurality of sub-pixels comprise a first sub-pixel, a second sub-pixel, a third sub-pixel and a fourth sub-pixel; and a pixel definition layer on the base substrate, wherein the pixel definition layer comprises a plurality of first openings, a plurality of second openings, a plurality of third openings, and a plurality of fourth openings, wherein the fourth sub-pixel is a white sub-pixel, and any two of the first sub-pixel, the second sub-pixel, the third sub-pixel and the fourth sub-pixel display different colors;

wherein in at least one pixel unit, at least one of the first sub-pixel, the second sub-pixel and the third sub-pixel is located in a different row from the fourth sub-pixel; and wherein the first sub-pixel comprises the first opening, the second sub-pixel comprises the second opening, the third sub-pixel comprises the third opening, the fourth sub-pixel comprises the fourth opening, and in at least one pixel unit, an area of each of an orthographic projection of the first opening of the first sub-pixel on the base substrate, an orthographic projection of the second opening of the second sub-pixel on the base substrate and an orthographic projection of the third opening of the third sub-pixel on the base substrate is less than an area of an orthographic projection of the fourth opening of the fourth sub-pixel on the base substrate.

2. The display substrate according to claim 1, wherein for at least two pixel units in a same row, a first line connecting centers of the first openings of the first sub-pixels of the at least two pixel units is parallel to the first direction, and/or a second line connecting centers of the second openings of the second sub-pixels of the at least two pixel units is parallel to the first direction; and/or a third line connecting centers of the third openings of the third sub-pixels of the at least two pixel units is parallel to the first direction;

wherein for at least two pixel units in a same row, a fourth line connecting centers of the fourth openings of the fourth sub-pixels of the at least two pixel units is parallel to the first direction; and wherein at least one of the first line, the second line and the third line is spaced apart from the fourth line in the second direction.

3. The display substrate according to claim 2, wherein each of the first line, the second line and the third line is spaced apart from the fourth line in the second direction.

4. The display substrate according to claim 3, wherein the first line is spaced apart from the fourth line by a first distance in the second direction, the second line is spaced apart from the fourth line by a second distance in the second direction, and the third line is spaced apart from the fourth line by a third distance in the second direction; and wherein a ratio of any two of the first distance, the second distance and the third distance ranges from 0.8 to 1.2.

5. The display substrate according to claim 1, wherein for at least one row of pixel units, the first sub-pixels, the second sub-pixels and the third sub-pixels are located in a same row to form a first row of sub-pixels; wherein a plurality of fourth sub-pixels are located in a same row to form a second row of sub-pixels; and wherein the first row of sub-pixels and the second row of sub-pixels are adjacent in the second direction.

6. The display substrate according to claim 1, wherein the orthographic projection of the first opening on the base substrate has a first width in the first direction and a first height in the second direction, and a ratio of a larger one of the first height and the first width to a smaller one of the first height and the first width is greater than 1.5; and/or wherein the orthographic projection of the second opening on the base substrate has a second width in the first direction and a second height in the second direction, and a ratio of a larger one of the second height and the second width to a smaller one of the second height and the second width is greater than 1.5; and/or wherein the orthographic projection of the third opening on the base substrate has a third width in the first direction and a third height in the second direction, and a ratio of a larger one of the third height and the third width to a smaller one of the third height and the third width is greater than 1.5; and/or wherein the orthographic projection of the fourth opening on the base substrate has a fourth width in the first direction and a fourth height in the second direction, and a ratio of a larger one of the fourth height and the fourth width to a smaller one of the fourth height and the fourth width is greater than 1.5.

7. The display substrate according to claim 6, wherein the fourth width of the fourth opening is greater than the fourth height of the fourth opening; and wherein the first width of the first opening is less than the first height of the first opening, the second width of the second opening is less than the second height of the second opening, and the third width of the third opening is less than the third height of the third opening.

8. The display substrate according to claim 1, wherein for one and same pixel unit, each of the orthographic projection of the first opening on the base substrate, the orthographic projection of the second opening on the base substrate and the orthographic projection of the third opening on the base substrate overlaps at least partially with the orthographic projection of the fourth opening on the base substrate in the second direction.

9. The display substrate according to claim 3, wherein the first line and the fourth line are spaced by a first distance in the second direction, the second line and the fourth line are spaced by a second distance in the second direction, and the third line and the fourth line are spaced by a third distance in the second direction; and wherein a ratio of one of the second distance and the third distance to the first distance ranges from 0.8 to 1.2, and a ratio of the other of the second distance and the third distance to the first distance is greater than 2.

10. The display substrate according to claim 1, wherein for at least one row of pixel units, the fourth sub-pixel and one of the first sub-pixel, the second sub-pixel and the third sub-pixel are located in a same row to form a first row of sub-pixels; the other two of the first sub-pixel, the second sub-pixel and the third sub-pixel are located in a same row to form a second row of sub-pixels; and the first row of sub-pixels and the second row of sub-pixels are adjacent in the second direction.

11. The display substrate according to claim 1, wherein the orthographic projection of the first opening on the base substrate has a first width in the first direction and a first height in the second direction, and a ratio of a larger one of the first height and the first width to a smaller one of the first height and the first width is greater than 1 and less than 1.5; and/or wherein the orthographic projection of the second opening on the base substrate has a second width in the first direction and a second height in the second direction, and a ratio of a larger one of the second height and the second width to a smaller one of the second height and the second width is greater than 1 and less than 1.5; and/or wherein the orthographic projection of the third opening on the base substrate has a third width in the first direction and a third height in the second direction, and a ratio of a larger one of the third height and the third width to a smaller one of the third height and the third width is greater than 1 and less than 1.5; and/or wherein the orthographic projection of the fourth opening on the base substrate has a fourth width in the first direction and a fourth height in the second direction, and a ratio of a larger one of the fourth height and the fourth width to a smaller one of the fourth height and the fourth width is greater than 1 and less than 1.5.

12. The display substrate according to claim 1, wherein for at least one row of pixel units, the fourth sub-pixel and one of the first sub-pixel, the second sub-pixel and the third sub-pixel are located in a same column to form a first column of sub-pixels; the other two of the first sub-pixel, the second sub-pixel and the third sub-pixel are located in a same column to form a second column of sub-pixels; and the first column of sub-pixels and the second column of sub-pixels are arranged alternately in the first direction.

13. The display substrate according to claim 1, comprising:

a first conductive film layer on the base substrate;

a semiconductor film layer on a side of the first conductive film layer away from the base substrate;

a second conductive film layer on a side of the semiconductor film layer away from the base substrate;

a third conductive film layer on a side of the second conductive film layer away from the base substrate; and a first electrode layer on a side of the third conductive film layer away from the base substrate, wherein the display substrate comprises a plurality of anodes in the first electrode layer; and wherein a row of pixel units comprise a plurality of pixel unit groups, each pixel unit group comprises a first pixel unit and a second pixel unit adjacent in the first direction, and for at least one pixel unit group, the pixel driving circuits of the plurality of sub-pixels are arranged side by side in the first direction, and the anodes of the light emitting elements of the plurality of sub-pixels are arranged in two rows in the second direction.

14. The display substrate according to claim 13, wherein for one and same sub-pixel, a relationship between an orthographic projection of the pixel driving circuit of the sub-pixel on the base substrate and an orthographic projection of the anode of the light emitting element of the sub-pixel on the base substrate comprises:

the orthographic projection of the pixel driving circuit of the sub-pixel on the base substrate exceeds the orthographic projection of the anode of the light emitting element of the sub-pixel on the base substrate in the second direction; and/or the orthographic projection of the anode of the light emitting element of the sub-pixel on the base substrate exceeds the orthographic projection of the pixel driving circuit of the sub-pixel on the base substrate in the first direction;

wherein the pixel driving circuit comprises a first transistor, a second transistor and a third transistor, the first transistor comprises a first channel region in the semiconductor film layer, the second transistor comprises a second channel region in the semiconductor film layer, and the third transistor comprises a third channel region in the semiconductor film layer; and wherein each of an orthographic projection of the first channel region on the base substrate, an orthographic projection of the second channel region on the base substrate and an orthographic projection of the third channel region on the base substrate falls within an orthographic projection of the plurality of anodes on the base substrate.

15. The display substrate according to claim 14, wherein for one and same pixel unit, each of an orthographic projection of the first channel region of the first transistor of the pixel driving circuit of the first sub-pixel on the base substrate, an orthographic projection of the first channel region of the first transistor of the pixel driving circuit of the second sub-pixel on the base substrate, an orthographic projection of the first channel region of the first transistor of the pixel driving circuit of the third sub-pixel on the base substrate, and an orthographic projection of the first channel region of the first transistor of the pixel driving circuit of the fourth sub-pixel on the base substrate falls within an orthographic projection of the anode of the fourth sub-pixel on the base substrate; and wherein for one and same pixel unit, each of an orthographic projection of the third channel region of the third transistor of the pixel driving circuit of the first sub-pixel on the base substrate, an orthographic projection of the third channel region of the third transistor of the pixel driving circuit of the second sub-pixel on the base substrate, an orthographic projection of the third channel region of the third transistor of the pixel driving circuit of the third sub-pixel on the base substrate, and an orthographic projection of the third channel region of the third transistor of the pixel driving circuit of the fourth sub-pixel on the base substrate falls within an orthographic projection of the anode of the fourth sub-pixel on the base substrate.

16. The display substrate according to claim 14, wherein for one and same pixel unit, an orthographic projection of the first channel region of the first transistor of the pixel driving circuit of the first sub-pixel on the base substrate falls within an orthographic projection of the anode of the fourth sub-pixel on the base substrate; an orthographic projection of the second channel region of the second transistor of the pixel driving circuit of the first sub-pixel on the base substrate falls within an orthographic projection of the anode of the first sub-pixel on the base substrate; and an orthographic projection of the third channel region of the third transistor of the pixel driving circuit of the first sub-pixel on the base substrate falls within the orthographic projection of the anode of the fourth sub-pixel on the base substrate; and/or wherein for one and same pixel unit, an orthographic projection of the first channel region of the first transistor of the pixel driving circuit of the second sub-pixel on the base substrate falls within the orthographic projection of the anode of the fourth sub-pixel on the base substrate; an orthographic projection of the second channel region of the second transistor of the pixel driving circuit of the second sub-pixel on the base substrate falls within an orthographic projection of the anode of the second sub-pixel on the base substrate; and an orthographic projection of the third channel region of the third transistor of the pixel driving circuit of the second sub-pixel on the base substrate falls within the orthographic projection of the anode of the fourth sub-pixel on the base substrate; and/or wherein for one and same pixel unit, an orthographic projection of the first channel region of the first transistor of the pixel driving circuit of the third sub-pixel on the base substrate falls within the orthographic projection of the anode of the fourth sub-pixel on the base substrate; an orthographic projection of the second channel region of the second transistor of the pixel driving circuit of the third sub-pixel on the base substrate falls within an orthographic projection of the anode of the third sub-pixel on the base substrate; and an orthographic projection of the third channel region of the third transistor of the pixel driving circuit of the third sub-pixel on the base substrate falls within the orthographic projection of the anode of the fourth sub-pixel on the base substrate; and/or wherein for one and same pixel unit, an orthographic projection of the first channel region of the first transistor of the pixel driving circuit of the fourth sub-pixel on the base substrate falls within the orthographic projection of the anode of the fourth sub-pixel on the base substrate; an orthographic projection of the second channel region of the second transistor of the pixel driving circuit of the fourth sub-pixel on the base substrate falls within the orthographic projection of the anode of the second sub-pixel on the base substrate; and an orthographic projection of the third channel region of the third transistor of the pixel driving circuit of the fourth sub-pixel on the base substrate falls within the orthographic projection of the anode of the fourth sub-pixel on the base substrate.

17. The display substrate according to claim 14, wherein for one and same pixel unit, an orthographic projection of the first channel region of the first transistor of the pixel driving circuit of the first sub-pixel on the base substrate falls within an orthographic projection of the anode of the first sub-pixel on the base substrate; an orthographic projection of the second channel region of the second transistor of the pixel driving circuit of the first sub-pixel on the base substrate falls within an orthographic projection of the anode of the fourth sub-pixel on the base substrate; and an orthographic projection of the third channel region of the third transistor of the pixel driving circuit of the first sub-pixel on the base substrate falls within the orthographic projection of the anode of the first sub-pixel on the base substrate; and/or wherein for one and same pixel unit, an orthographic projection of the first channel region of the first transistor of the pixel driving circuit of the second sub-pixel on the base substrate falls within an orthographic projection of the anode of the second sub-pixel on the base substrate; an orthographic projection of the second channel region of the second transistor of the pixel driving circuit of the second sub-pixel on the base substrate falls within an orthographic projection of the anode of the third sub-pixel on the base substrate; and an orthographic projection of the third channel region of the third transistor of the pixel driving circuit of the second sub-pixel on the base substrate falls within the orthographic projection of the anode of the second sub-pixel on the base substrate; and/or wherein for one and same pixel unit, an orthographic projection of the first channel region of the first transistor of the pixel driving circuit of the third sub-pixel on the base substrate falls within the orthographic projection of the anode of the second sub-pixel on the base substrate; an orthographic projection of the second channel region of the second transistor of the pixel driving circuit of the third sub-pixel on the base substrate falls within the orthographic projection of the anode of the third sub-pixel on the base substrate; and an orthographic projection of the third channel region of the third transistor of the pixel driving circuit of the third sub-pixel on the base substrate falls within the orthographic projection of the anode of the second sub-pixel on the base substrate; and/or wherein for one and same pixel unit, an orthographic projection of the first channel region of the first transistor of the pixel driving circuit of the fourth sub-pixel on the base substrate falls within the orthographic projection of the anode of the first sub-pixel on the base substrate; an orthographic projection of the second channel region of the second transistor of the pixel driving circuit of the fourth sub-pixel on the base substrate falls within the orthographic projection of the anode of the fourth sub-pixel on the base substrate; and an orthographic projection of the third channel region of the third transistor of the pixel driving circuit of the fourth sub-pixel on the base substrate falls within the orthographic projection of the anode of the first sub-pixel on the base substrate.

18. The display substrate according to claim 1, wherein the display substrate further comprises a black matrix on a side of the pixel definition layer away from the base substrate; and wherein in a region between at least two adjacent openings, a width of the pixel definition layer in the first direction is greater than a width of the black matrix in the first direction, and/or a height of the pixel definition layer in the second direction is greater than a height of the black matrix in the second direction.

19. The display substrate according to claim 1, wherein an anode of at least one sub-pixel is electrically connected to the pixel driving circuit of the sub-pixel through a respective anode connection hole;

wherein for at least one pixel unit group, a first connecting line of centers of the anode connection holes of the first sub-pixels is parallel to the first direction, and/or a second connecting line of centers of the anode connection holes of the second sub-pixels is parallel to the first direction, and/or a third connecting line of centers of the anode connection holes of the third sub-pixels is parallel to the first direction;

wherein for at least one pixel unit group, a fourth connecting line of centers of the anode connection holes of the fourth sub-pixels is parallel to the first direction;

wherein each of the first connecting line, the second connecting line and the third connecting line is spaced apart from the fourth connecting line in the second direction; and wherein any two of the first connecting line, the second connecting line and the third connecting line substantially coincide with each other, or the first connecting line and the third connecting line substantially coincide with each other, and the fourth connecting line and the second connecting line are located on two sides of the first connecting line in the second direction.

20. A display device, comprising the display substrate of claim 1.

\* \* \* \* \*